(12) United States Patent
Levermore

(10) Patent No.: US 12,610,708 B2
(45) Date of Patent: Apr. 21, 2026

(54) LIGHT EMITTING DEVICE ARCHITECTURES

(71) Applicant: EXCYTON LIMITED, Durham (GB)

(72) Inventor: Peter Andrew Levermore, Burringham (GB)

(73) Assignee: Excyton Limited, Durham (GB)

( * ) Notice: Subject to any disclaimer, the term of this patent is extended or adjusted under 35 U.S.C. 154(b) by 480 days.

(21) Appl. No.: 18/013,670

(22) PCT Filed: Jun. 30, 2021

(86) PCT No.: PCT/GB2021/051663
§ 371 (c)(1),
(2) Date: Dec. 29, 2022

(87) PCT Pub. No.: WO2022/003352
PCT Pub. Date: Jan. 6, 2022

(65) Prior Publication Data
US 2023/0371334 A1 Nov. 16, 2023

(30) Foreign Application Priority Data
Jul. 1, 2020 (GB) ...................................... 2010088

(51) Int. Cl.
*H10K 59/35* (2023.01)
*H10K 30/40* (2023.01)
(Continued)

(52) U.S. Cl.
CPC ............. *H10K 59/35* (2023.02); *H10K 30/40* (2023.02); *H10K 50/115* (2023.02);
(Continued)

(58) Field of Classification Search
CPC ...... H10K 59/35; H10K 30/40; H10K 50/115; H10K 59/1201; H10K 59/32; H10K 77/10; H10K 50/19
See application file for complete search history.

(56) References Cited

U.S. PATENT DOCUMENTS 5,707,745 A 1/1998 Forrest et al.
6,303,238 B1 10/2001 Thompson et al.
(Continued)

FOREIGN PATENT DOCUMENTS

CN 101752509 A 6/2010
EP 0423283 B1 4/1991
(Continued)

OTHER PUBLICATIONS

Wang Hung-Chia et al. "Perovskite Quantum Dots and Their Application in Light-Emitting Diodes", Small, vol. 14, 1702433, Jan. 1, 2018 (Jan. 1, 2018), XP055839925, DOI: 10.1002/smll. 201702433.
(Continued)

*Primary Examiner* — Jacob Y Choi
*Assistant Examiner* — Ashley Nicole Blackwell
(74) *Attorney, Agent, or Firm* — Meunier Carlin & Curfman LLC

(57) ABSTRACT

A device is provided. The device comprises a first stacked light emitting device. The first stacked light emitting device comprises a first electrode, a second electrode, a first emissive unit comprising a first emissive layer, a second emissive unit comprising a second emissive layer and a first charge generation layer. The first emissive unit, the second emissive unit and the first charge generation layer are all disposed between the first electrode and the second electrode. The first emissive unit is disposed over the first electrode. The first charge generation layer is disposed over the first emis-
(Continued)

sive unit. The second emissive unit is disposed over the first charge generation layer. The second electrode is disposed over the second emissive unit. The first emissive unit and the second emissive are independently addressable and may emit light independently of each other. The first emissive unit emits light having a first hue classified as red, green or blue and a first chromaticity having first CIE 1931 (x, y) colour space chromaticity coordinates of (x1, y1). The second emissive unit emits light having a second hue classified as red, green or blue and a second chromaticity having second CIE 1931 (x, y) colour space chromaticity coordinates of (x2, y2). The second hue is the same as the first hue. The second chromaticity is substantially different to the first chromaticity. The first emissive layer and the second emissive layer comprise organic light emitting material, quantum dot light emitting material and/or perovskite light emitting material.

14 Claims, 20 Drawing Sheets

(51) Int. Cl.
| | |
|---|---|
| *H10K 50/115* | (2023.01) |
| *H10K 59/12* | (2023.01) |
| *H10K 59/32* | (2023.01) |
| *H10K 77/10* | (2023.01) |

(52) U.S. Cl.
CPC ......... *H10K 59/1201* (2023.02); *H10K 59/32* (2023.02); *H10K 77/10* (2023.02)

(56) References Cited

U.S. PATENT DOCUMENTS

| | | | |
|---|---|---|---|
| 6,358,631 | B1 | 3/2002 | Forrest et al. |
| 7,279,704 | B2 | 10/2007 | Walters et al. |
| 9,559,151 | B2 | 1/2017 | Hack et al. |
| 2010/0133522 | A1 | 6/2010 | Pieh et al. |
| 2014/0077177 | A1 | 3/2014 | Hack et al. |
| 2014/0084269 | A1 | 3/2014 | Weaver et al. |
| 2015/0155519 | A1* | 6/2015 | Lee ..................... H10K 59/35 |
| | | | 257/40 |
| 2015/0214498 | A1 | 7/2015 | Ichikawa et al. |
| 2015/0279909 | A1 | 10/2015 | Tsuji et al. |
| 2018/0374409 | A1 | 12/2018 | Lee et al. |
| 2019/0043407 | A1 | 2/2019 | Yang |
| 2020/0243616 | A1* | 7/2020 | Boardman ............. H10K 50/11 |
| 2020/0273916 | A1 | 8/2020 | Jiao et al. |
| 2020/0373360 | A1* | 11/2020 | Hack .................... H10K 50/131 |
| 2021/0210707 | A1 | 7/2021 | Levermore |

FOREIGN PATENT DOCUMENTS

| | | |
|---|---|---|
| EP | 3188272 A1 | 7/2017 |
| EP | 3188273 A1 | 7/2017 |
| JP | 2009-146860 A | 7/2009 |
| JP | 2015-138746 A | 7/2015 |
| KR | 10-2014-0035824 A | 3/2014 |
| KR | 10-2020-0077201 A | 6/2020 |
| WO | 2014073300 A1 | 5/2014 |
| WO | 2019224546 A1 | 11/2019 |
| WO | 2020030042 A1 | 2/2020 |

OTHER PUBLICATIONS

S. Adjokatse et al., Broadly tunable metal halide perovskites for solid-state light-emission applications, Materials Today, vol. 20, Issue 8, pp. 413-424 (2017).

Forrest et al., The stacked OLED (SOLED): a new type of organic device for achieving high-resolution full-color displays, Synthetic Metals, vol. 91, Issues 1-3, pp. 9-13 (1997).

Fröbel et al., Three-terminal RGB full-colour OLED pixels for ultrahigh density displays, Nature Scientific Reports, vol. 8, Article 9684 (2018).

Fukagawa et al., High-efficiency ultrapure green organic light-emitting diodes, Materials Chemistry Frontiers, vol. 2, pp. 704-709 (2018).

Hirose et al., High-efficiency Perovskite QLED Achieving BT.2020 Green Chromaticity, SID Symposium Digest of Technical Papers 2017, vol. 48, pp. 284-287 (2017).

Hosoumi et al., Ultra-wide Color Gamut OLED Display using a Deep-Green Phosphorescent Device with High Efficiency, Long Life, Thermal Stability, and Absolute BT.2020 Green Chromaticity, SID Symposium Digest of Technical Papers 2017, vol. 48, pp. 13-16 (2017).

Jang et al., High Efficiency Red Phosphorescent Organic Light Emitting Diodes with Emission Structure of (TCTA/TCTA0.5TPBi0.5/TPBi):(pq)2Ir(acac), Molecular Crystals and Liquid Crystals, vol. 513, pp. 268-276 (2019).

Jung et al., 3 Stacked Top Emitting White OLED for High Resolution OLED TV, SID Symposium Digest of Technical Papers 2016, vol. 47, pp. 707-710 (2016).

Kathirgamanathan et al., Electroluminescent Organic and Quantum Dot LEDs: The State of the Art, Journal of Display Technology, vol. 11, No. 5, pp. 480-493 (2015).

Kathirgamanathan et al., Quantum Dot Electroluminescence: Towards Achieving the REC 2020 Colour Co-ordinates, SID Symposium Digest of Technical Papers 2015, vol. 47, pp. 652-656 (2016).

Kumar et al., Efficient Blue Electroluminescence Using Quantum-Confined Two-Dimensional Perovskites, ACS Nano, vol. 10, pp. 9720-9729 (2016).

Soneira et al., iPhone X OLED Display Technology Shoot-Out, DisplayMate Technologies Corporation (https://www.displaymate.com/iPhoneX_ShootOut_1a.htm) accessed on Oct. 3, 2023.

Steckel et al., Color-Saturated Green-Emitting QD-LEDs, Angewandte Chemie, vol. 45, pp. 5796-5799 (2006).

Takita et al., Highly efficient deep-blue fluorescent dopant for achieving low-power OLED display satisfying BT.2020 chromaticity, Journal of the SID 2018 (2018).

Tong et al., High efficiency green OLEDs based on homoleptic iridium complexes with steric phenylpyridazine ligands, Dalton Transactions, vol. 47, pp. 12243-12252 (2018).

Uoyama et al., Highly efficient organic light-emitting diodes from delayed fluorescence, Nature, vol. 492, pp. 234-238 (2012).

Wang et al., Perovskite light-emitting diodes based on solution-processed, self-organised multiple quantum wells, Nature Photonics, vol. 10, pp. 699-704 (2016).

Wang et al., Blue Quantum Dot Light-Emitting Diodes with High Electroluminescent Efficiency, ACS Applied Materials & Interfaces, vol. 9, pp. 38755-38760 (2017).

Zanoni et al., Sky-blue OLED through PVK:[Ir(Fppy)2(Mepic)] active layer, Synthetic Metals, vol. 222, Part B, pp. 393-396 (2016).

Search Report Under Section 17(5) issued on Dec. 21, 2020, in GB2010088.9.

International Preliminary Report on Patentability issued on Jan. 12, 2023, in PCT/GB2021/051663.

Search Report Under Section 17(5) issued on Dec. 21, 2020, in GB2010090.5.

International Preliminary Report on Patentability issued on Jan. 12, 2023, in PCT/GB2021/051664.

Anonymous: "CIE 1931 color space—Wikipedia", Apr. 24, 2006 (Apr. 24, 2006), XP055840956.

Office Action issued on Aug. 27, 2024, in Japanese Application No. 2022-581588.

Quanhui Tian, "Printing Chromatics", Shanghai Jiaotong University Press, First Edition, p. 128, Table 3: CIE 1931 chromaticity diagram spectral locus chromaticity coordinates, ISBN: 978-7-313-04996-4, Jan. 2008. English translation of bibliographic data and portion related to reference from related Office Action included.

* cited by examiner

100

| BARRIER LAYER 160 |
|---|
| CATHODE 155 |
| ELECTRON INJECTION LAYER 150 |
| ELECTRON TRANSPORT LAYER 145 |
| HOLE BLOCKING LAYER 140 |
| EMISSIVE LAYER 135 |
| ELECTRON BLOCKING LAYER 130 |
| HOLE TRANSPORT LAYER 125 |
| HOLE INJECTION LAYER 120 |
| ANODE 115 |
| SUBSTRATE 110 |

FIG. 3
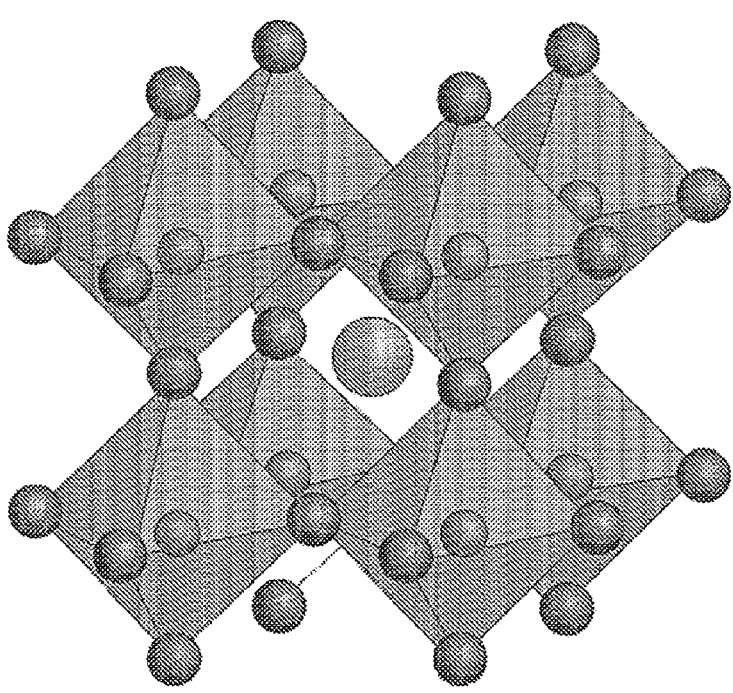
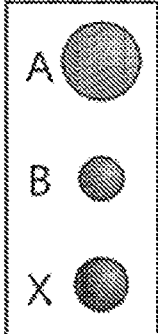

FIG. 4
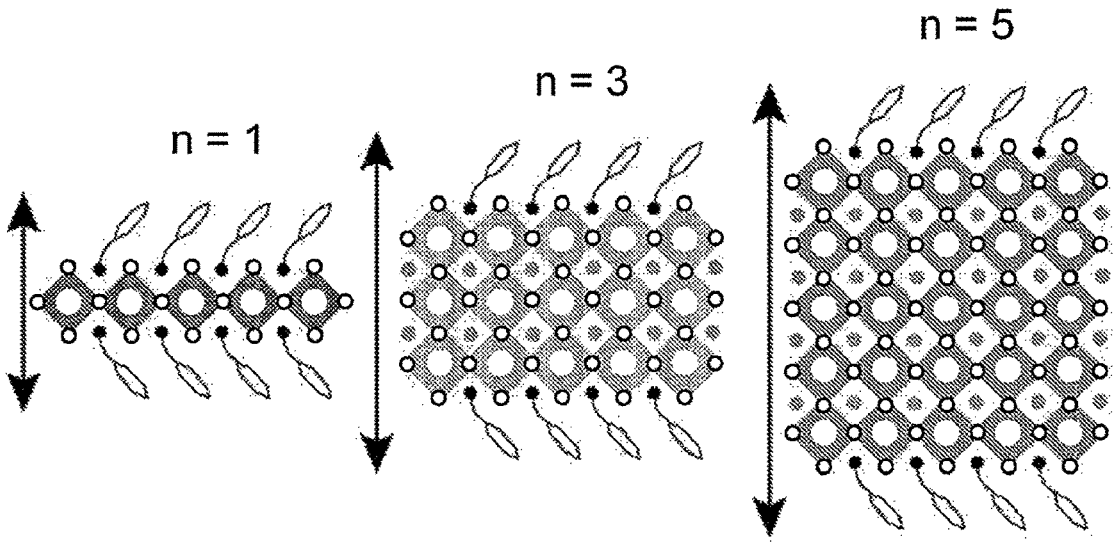
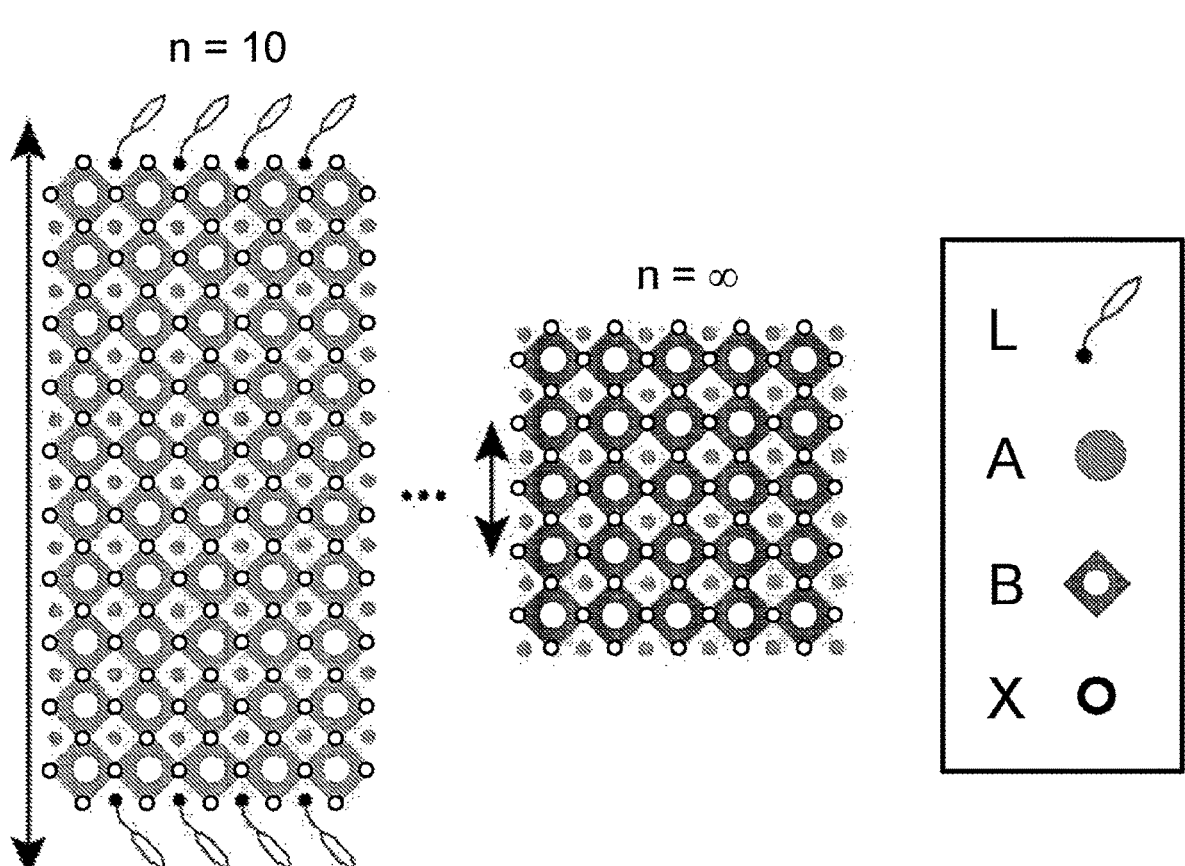

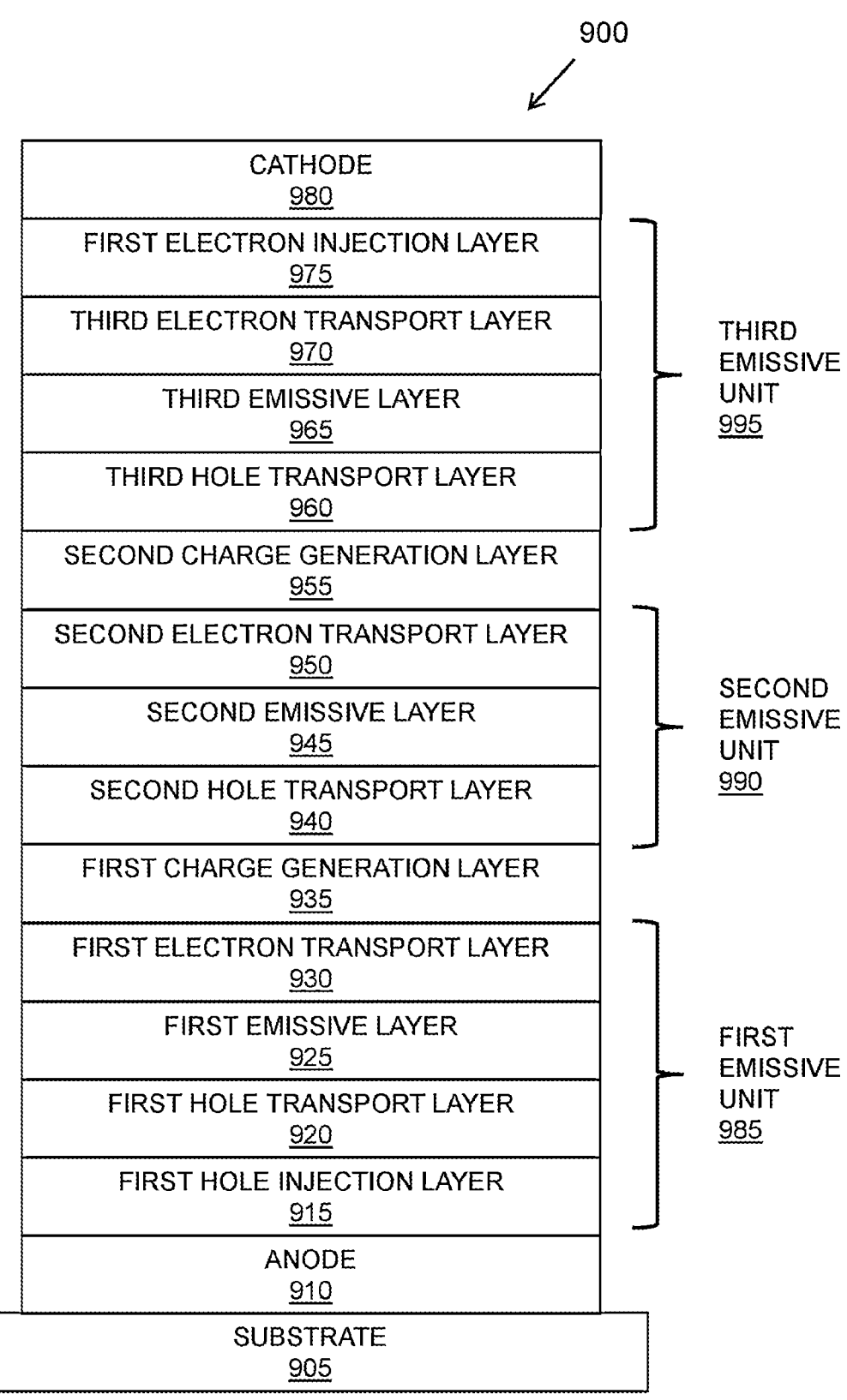

900

| CATHODE 980 | |
| FIRST ELECTRON INJECTION LAYER 975 | THIRD EMISSIVE UNIT 995 |
| THIRD ELECTRON TRANSPORT LAYER 970 | |
| THIRD EMISSIVE LAYER 965 | |
| THIRD HOLE TRANSPORT LAYER 960 | |
| SECOND CHARGE GENERATION LAYER 955 | |
| SECOND ELECTRON TRANSPORT LAYER 950 | SECOND EMISSIVE UNIT 990 |
| SECOND EMISSIVE LAYER 945 | |
| SECOND HOLE TRANSPORT LAYER 940 | |
| FIRST CHARGE GENERATION LAYER 935 | |
| FIRST ELECTRON TRANSPORT LAYER 930 | FIRST EMISSIVE UNIT 985 |
| FIRST EMISSIVE LAYER 925 | |
| FIRST HOLE TRANSPORT LAYER 920 | |
| FIRST HOLE INJECTION LAYER 915 | |
| ANODE 910 | |
| SUBSTRATE 905 | |

FIG. 11
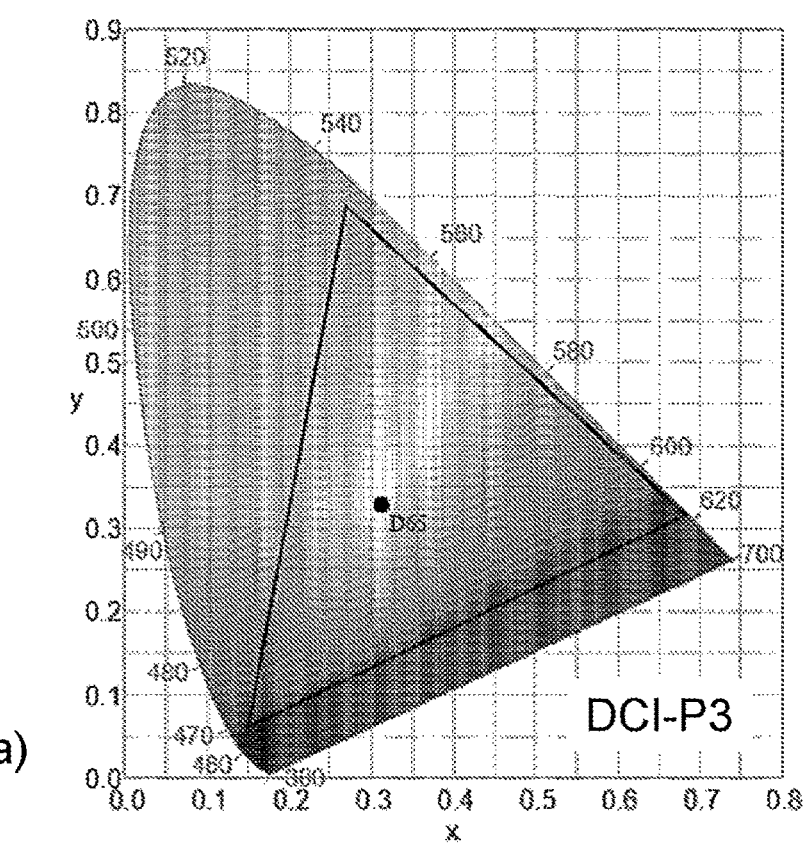
(a)
DCI-P3
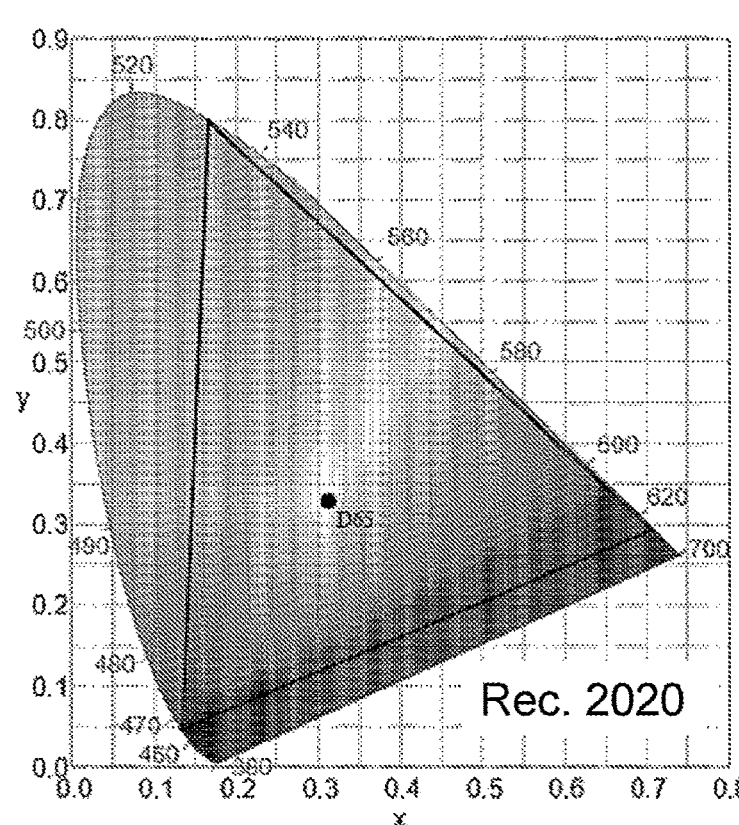
(b)
Rec. 2020

FIG. 12
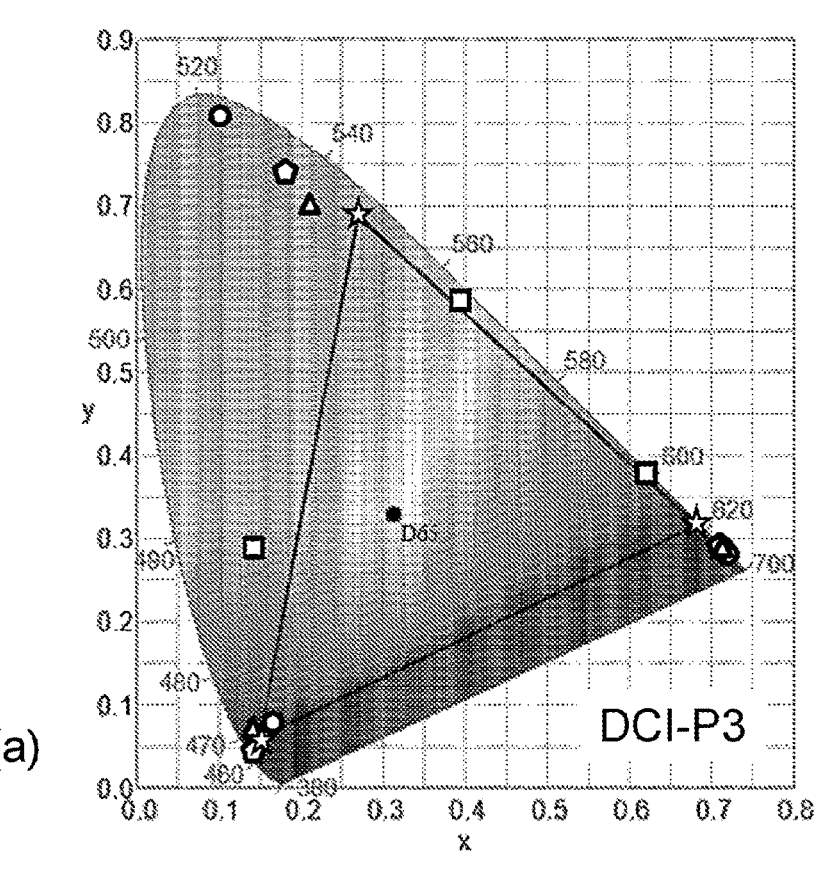
(a)
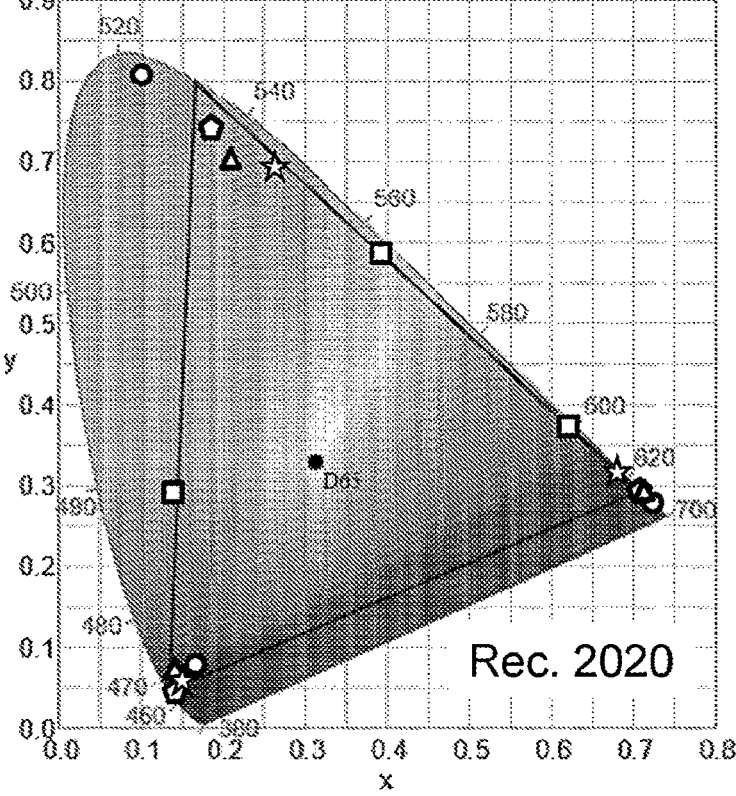
(b)

FIG. 15
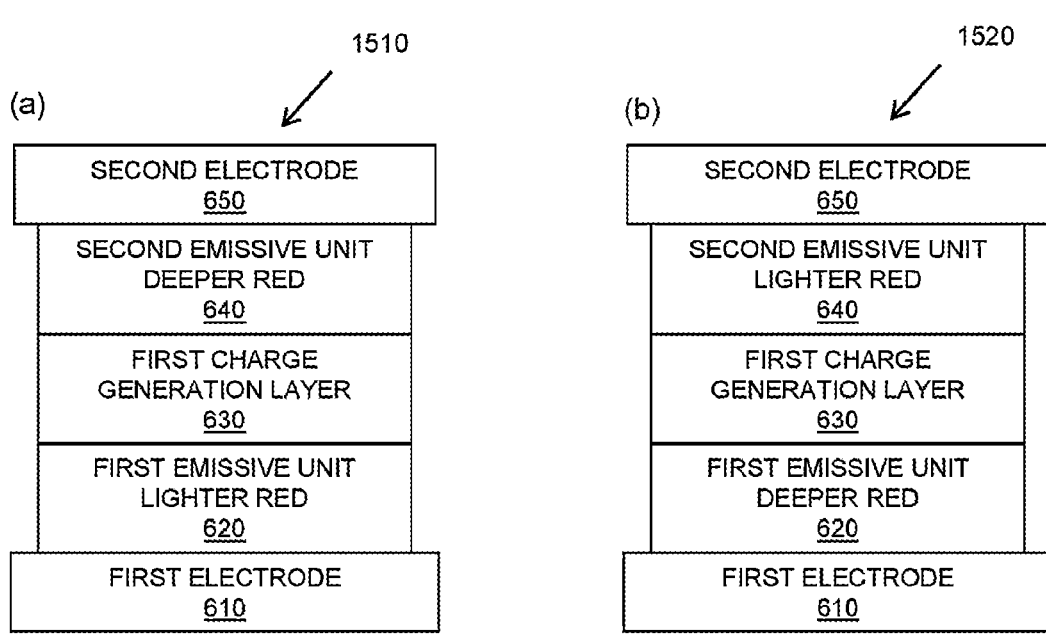
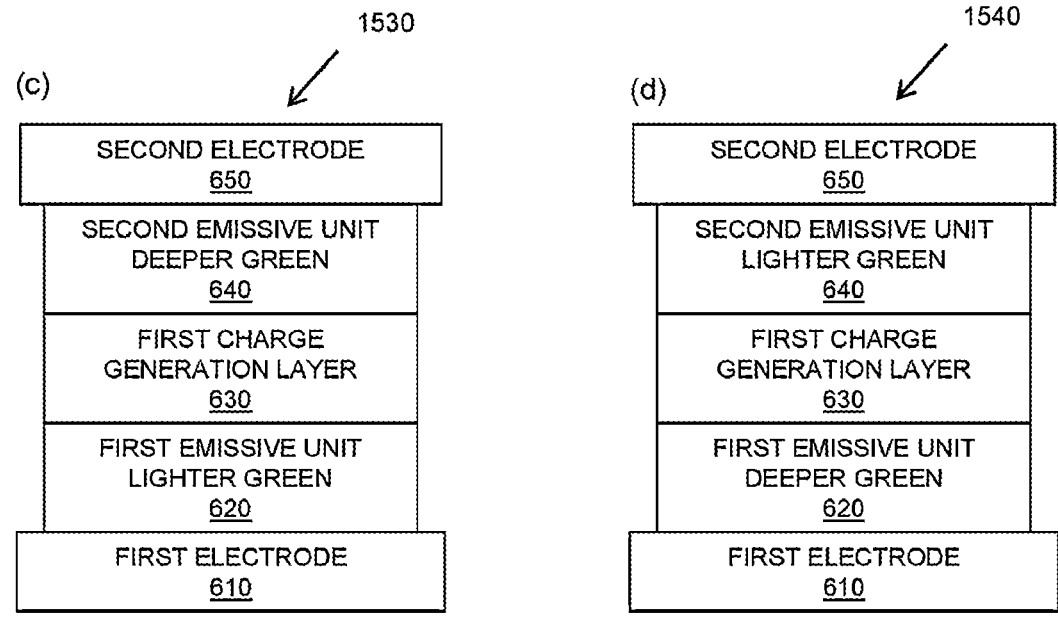

1550

(e)

| SECOND ELECTRODE 650 |
| SECOND EMISSIVE UNIT DEEPER BLUE 640 |
| FIRST CHARGE GENERATION LAYER 630 |
| FIRST EMISSIVE UNIT LIGHTER BLUE 620 |
| FIRST ELECTRODE 610 |

1560

(f)

| SECOND ELECTRODE 650 |
| SECOND EMISSIVE UNIT LIGHTER BLUE 640 |
| FIRST CHARGE GENERATION LAYER 630 |
| FIRST EMISSIVE UNIT DEEPER BLUE 620 |
| FIRST ELECTRODE 610 |

FIG. 16

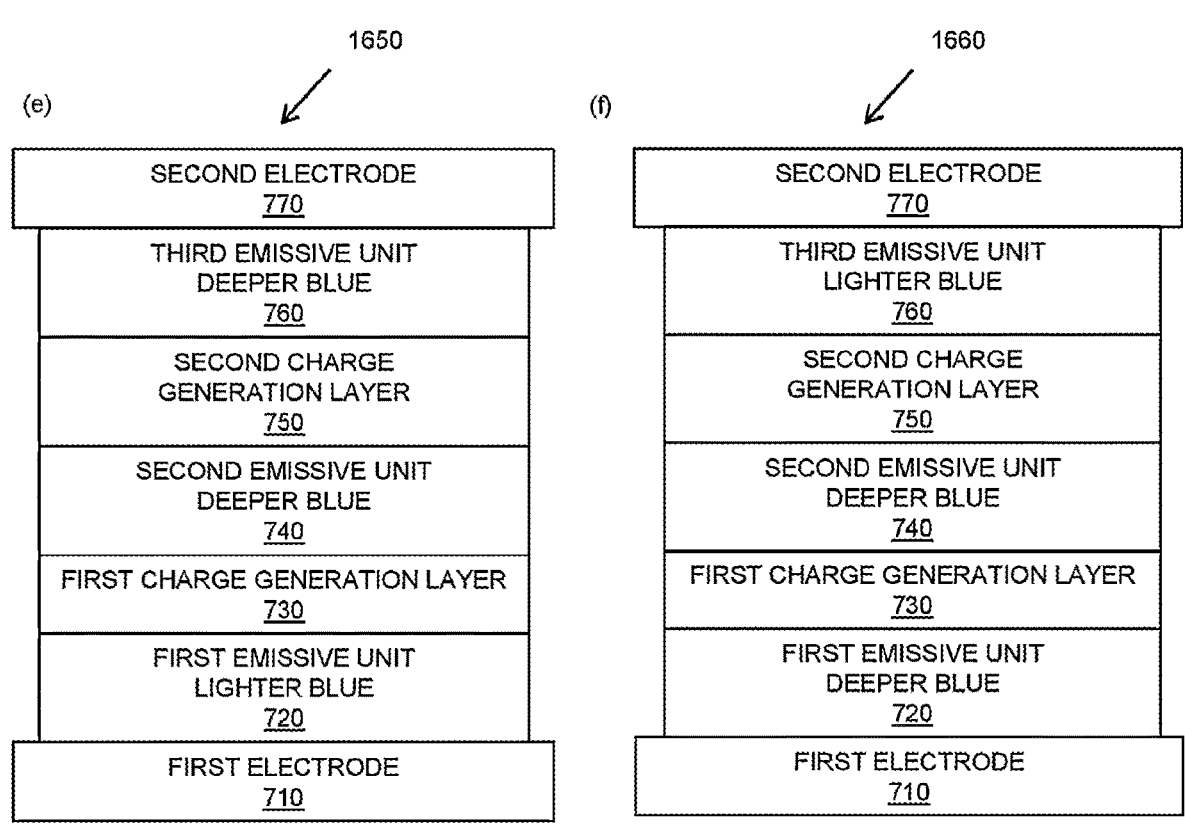

(e)     1650

SECOND ELECTRODE
770

THIRD EMISSIVE UNIT
DEEPER BLUE
760

SECOND CHARGE
GENERATION LAYER
750

SECOND EMISSIVE UNIT
DEEPER BLUE
740

FIRST CHARGE GENERATION LAYER
730

FIRST EMISSIVE UNIT
LIGHTER BLUE
720

FIRST ELECTRODE
710

(f)     1660

SECOND ELECTRODE
770

THIRD EMISSIVE UNIT
LIGHTER BLUE
760

SECOND CHARGE
GENERATION LAYER
750

SECOND EMISSIVE UNIT
DEEPER BLUE
740

FIRST CHARGE GENERATION LAYER
730

FIRST EMISSIVE UNIT
DEEPER BLUE
720

FIRST ELECTRODE
710

LIGHT EMITTING DEVICE ARCHITECTURES

TECHNICAL FIELD

The present invention relates to novel light emitting device architectures for application in displays, light panels and other optoelectronic devices, and in particular to stacked light emitting devices that comprise two or more independently addressable emissive units that emit light having the same hue but substantially different chromaticity.

BACKGROUND

Display technology is advancing rapidly, with recent innovations enabling thinner and lighter displays with higher resolution, improved frame rate and enhanced contrast ratio. However, one area where significant improvement is still required is colour gamut. Displays of today are currently incapable of producing many of the colours the average person experiences in day-to-day life.

To unify and guide the industry towards improved colour gamut, two industry standards have been defined, DCI-P3 and Rec. 2020, with DCI-P3 often seen as a steppingstone towards Rec. 2020. DCI-P3 was defined by the Digital Cinema Initiatives (DCI) organization and published by the Society of Motion Picture and Television Engineers (SMPTE). Rec. 2020 (more formally known as ITU-R Recommendation BT. 2020) was developed by the International Telecommunication Union to set targets, including improved colour gamut, for various aspects of ultra-high-definition televisions.

As depicted in Table 1, commercial organic light emitting diode (OLED) displays incorporating organic light emitting material can successfully render the DCI-P3 colour gamut. For example, smartphones with OLED displays such as the iPhone 11 Pro Max (Apple), Galaxy S20 (Samsung) and OnePlus 7T (OnePlus) can all render the DCI-P3 gamut. Commercial liquid crystal displays (LCDs) can also successfully render the DCI-P3 colour gamut. For example, LCDs in the Surface Studio 2 (Microsoft) and Mac Book Pro (Apple) can all render the DCI-P3 gamut. Furthermore, as depicted in Table 1, quantum dot light emitting diode (QLED) devices incorporating red, green and blue quantum dot light emitting material, and perovskite light emitting diode (PeLED) devices incorporating red, green and blue perovskite light emitting material, both have the potential to be incorporated in red, green and blue sub-pixels of displays to render the DCI-P3 colour gamut.

Rec. 2020 is a more challenging standard than DCI-P3. Until now, no display has been commercialized that can render the Rec. 2020 colour gamut. This can be explained with reference to the CIE 1931 (x, y) chromaticity diagram which was created by the Commission Internationale de l'Éclairage (CIE) in 1931 to define all colour sensations that an average person can experience. Mathematical relationships describe the location of each colour within the chromaticity diagram. The CIE 1931 (x, y) chromaticity diagram may be used to quantify the colour gamut of displays. The white point (D65) is at the centre, while colours become increasingly saturated towards the extremities of the diagram. FIG. 10 shows the CIE 1931 (x, y) chromaticity diagram with labels added to different locations on the diagram to enable a general understanding of distribution of colour within the colour space. FIG. 11 shows (a) DCI-P3 and (b) Rec. 2020 colour spaces superimposed on the CIE 1931 (x, y) chromaticity diagram. The tips of the triangles are primary colours for DCI-P3 and Rec. 2020, respectively, while colours enclosed within the triangles are all the colours that can be reproduced by combining these primary colours. For a display to meet DCI-P3 colour gamut specifications, the red, green and blue sub-pixels of the display must emit light at least as deep in colour as the DCI-P3 primary colours. For a display to meet Rec. 2020 colour gamut specifications, the red, green and blue sub-pixels of the display must emit light at least as deep in colour as the Rec. 2020 primary colours. Primary colours for Rec. 2020 are significantly deeper than for DCI-P3, and therefore achievement of the Rec. 2020 standard for colour gamut is a greater technical challenge than achievement of the DCI-P3 standard.

One potential pathway to demonstrate a display that can render the Rec. 2020 colour gamut is to incorporate a combination of OLED, QLED and/or PeLED devices into the sub-pixels of a display. For example, as depicted in Table 1, a red QLED or PeLED may be combined with a green PeLED and a blue OLED to potentially demonstrate a display that can render the Rec. 2020 colour gamut.

One further challenge is that state-of-the-art displays such as OLED displays suffer a trade-off whereby efficiency and/or lifetime are typically reduced as the colour gamut of the display is extended. This trade-off arises because as red, green and blue light emitted from the sub-pixels of the display become deeper in colour, there is less overlap of the respective red, green and blue emission spectra with the photopic luminous efficiency function which describes the average spectral sensitivity of human visual perception of brightness under everyday lighting. The red, green and blue sub-pixels that are deeper in colour therefore appear less bright.

To illustrate this challenge, the normalized CIE 1931 photopic luminous efficiency function is depicted in FIG. 14 across a wavelength range of 380 nm to 780 nm. It can be seen that light is perceived to be brightest at 555 nm, with perception of brightness falling off gradually towards zero at 380 nm and 780 nm. Also plotted on FIG. 14 are exemplary normalized emission spectra for light-red, deep-red, light-green, deep-green, light-blue and deep-blue OLEDs, with respective emission spectra peaks labelled at 606 nm, 642 nm, 537 nm, 521 nm, 470 nm and 451 nm. It is clear that the emission spectra for deep-red, deep-green and deep-blue OLEDs have less overlap with the photopic luminous efficiency function than the respective light-red, light-green and light-blue OLEDs of the same hue.

FIG. 11 demonstrates that for a display such as an OLED display to render a more extensive colour gamut, the red sub-pixel must emit light closer in peak wavelength to the end of the spectral locus at 780 nm, the green sub-pixel must emit light with a peak wavelength in the range of approximately 515 nm to 535 nm, and the blue sub-pixel must emit light closer in peak wavelength to the end of the spectral locus at 380 nm. However, as depicted in FIG. 14, human visual perception of brightness decreases for red towards 780 nm, decreases for blue towards 380 nm, and is substantially less in the range of 515 nm to 535 nm than at the peak of the photopic luminous efficiency function at 555 nm. This is the reason for the trade-off between colour gamut and efficiency and/or lifetime in the displays of today.

The present invention relates to novel light emitting device architectures to address this challenge, and in particular to devices comprising stacked light emitting devices that comprise two or more independently addressable emissive units that emit light having the same hue but substantially different chromaticity for application in devices, such as displays, light panels and other optoelectronic devices.

The two or more emissive units with the same hue but substantially different chromaticity may be independently addressed and may emit light independently of each other. The two or more emissive units may comprise a first emissive unit that emits a deeper red, green or blue light, and a second emissive unit that emits a lighter red, green or blue light or vice-versa. For example, the first emissive unit may emit deeper red light and the second emissive unit may emit lighter red light or vice-versa, or the first emissive unit may emit deeper green light and the second emissive unit may emit lighter green light or vice-versa, or the first emissive unit may emit deeper blue light and the second emissive unit may emit lighter blue light or vice-versa.

Such stacked light emitting devices may be incorporated into the red, green and/or blue sub-pixels of a display. When the sub-pixel of such a display is required to emit a relatively saturated red, green or blue light that is more saturated than light that may be emitted from the lighter red, green and blue emissive units, but less saturated than light that may be emitted from the deeper red, green and blue emissive units, the respective emissive units that emit deeper red, green or blue light may be individually addressed and may emit light to generate the display image while the respective emissive units that emit lighter red, green or blue light may remain inactive. However, when the sub-pixel of a display is only required to emit a relatively unsaturated red, green or blue light that is less saturated than light that may be emitted from the lighter red, green and blue emissive units, the respective emissive units that emit lighter red, green or blue light may be individually addressed and may emit light to generate the display image while the respective emissive units that emit deeper red, green or blue light may remain inactive. Light may be emitted from the relatively more efficient lighter red, green or blue emissive units to render the majority of display images, with light emitted from the relatively less efficient deeper red, green or blue emissive units only required to render a small proportion of images. The efficiency and/or lifetime of the display may therefore be enhanced.

The proposed novel device architecture is ideally suited to OLED, QLED and PeLED devices and displays. Inherent properties of organic light emitting materials, quantum dot light emitting materials and perovskite light emitting materials render them well-suited to the herein disclosed stacked light emitting device architecture. These properties include optical band gaps that are readily tunable across the visible, ultra-violet and infra-red spectra, high colour saturation that enables displays with wide colour gamut, excellent charge transport properties and low non-radiative rates As an overview, several OLED materials and configurations are described in Uoyama et al. and in European patent EP 0423283 B1 and U.S. Pat. Nos. 6,303,238 B1 and 7,279,704 B2. Several QLED materials and configurations are described in Kathirgamanathan et al. (1). Several PeLED materials and configurations are described in Adjokatse et al. All of these references are included herein by reference in their entirety.

As used herein, the term "organic" includes polymeric materials as well as small molecule organic materials that may be used to fabricate optoelectronic devices, such as OLEDs. As used herein, the term small molecule refers to any organic material that is not a polymer, and small molecules may actually be quite large. Small molecules may include repeat units in some circumstances. For example, using a long chain alkyl group as a substituent does not remove a molecule from the small molecule class. Small molecules may also be incorporated into polymers, for example as a pendant group on a polymer backbone or as part of the backbone. A dendrimer may be a small molecule and it is believed that all dendrimers currently used in the field of OLEDs are small molecules.

As used herein the term "organic light emitting material" includes fluorescent and phosphorescent organic light emitting materials, as well as organic materials that emit light through mechanisms such as triplet-triplet annihilation (TTA) or thermally activated delayed fluorescence (TADF). One example of organic light emitting material that emits red light is bis(2-(3,5-dimethylphenyl)quinoline-C2,N') (acetylacetonato) iridium(III) Ir(dmpq)$_2$(acac). One example of organic light emitting material that emits green light is tris(2-phenylpyridine)iridium (Ir(ppy)$_3$). One example of organic light emitting material that emits blue light is bis[2-(4,6-difluorophenyl)pyridinato-C2,N](picolinato)iridium(III)(FIrpic).

In general, OLED devices may be photoluminescent or electroluminescent. The term "OLED" may be used to describe single emissive unit electroluminescent devices that comprise electroluminescent organic light emitting material. The term "OLED" may also be used to describe one or more emissive units of stacked electroluminescent devices that comprise electroluminescent organic light emitting material. This nomenclature may differ slightly from that used by other sources.

As used herein, the term "quantum dot" includes quantum dot material, quantum rod material and other luminescent nanocrystal material, with the exception of "perovskite" material, which is defined separately herein. Quantum dots may generally be considered as semiconductor nanoparticles that exhibit properties that are intermediate between bulk semiconductors and discrete molecules. Quantum dots may comprise III-V semiconductor material, such as gallium nitride (GaN), gallium phosphide (GaP), gallium arsenide (GaAs), indium phosphide (InP) and indium arsenide (InAs), or II-VI semiconductor material, such as zinc oxide (ZnO), zinc sulfide (ZnS), cadmium sulfide (CdS), cadmium selenide (CdSe) and cadmium telluride (CdTe), or combinations thereof. In general, as a result of quantum confinement effects, optoelectronic properties of quantum dots may change as a function of size or shape of the quantum dot.

Several types of quantum dot may be stimulated to emit light in response to optical or electrical excitation. That is to say that quantum dot light emitting material may be photoluminescent or electroluminescent. This nomenclature may differ slightly from that used by other sources.

As used herein, the term "quantum dot" does not include "perovskite" material. Several types of perovskite material, such as perovskite nanocrystals, 2D perovskite materials and Quasi-2D perovskite materials, are semiconducting materials that exhibit properties intermediate between bulk semiconductors and discrete molecules, where in a similar manner to quantum dots, quantum confinement may affect optoelectronic properties. However, as used herein, such materials are referred to as "perovskite" materials and not "quantum dot" materials. A first reason for this nomenclature is that perovskite materials and quantum dot materials, as defined herein, generally comprise different crystal structures. A second reason for this nomenclature is that perovskite materials and quantum dot materials, as defined herein, generally comprise different material types within their structures. A third reason for this nomenclature is that emission from perovskite material is generally independent of the structural size of the perovskite material, whereas emission from quantum dot material is generally dependent on the structural size (e.g. core and shell) of the quantum dot material. This nomenclature may differ slightly from that used by other sources.

In general, quantum dot light emitting materials comprise a core. Optionally, the core may be surrounded by one or more shells. Optionally, the core and one or more shells may be surrounded by a passivation structure. Optionally, the passivation structure may comprise ligands bonded to the one or more shells. The size of the of the core and shell(s) may influence the optoelectronic properties of quantum dot light emitting material. Generally, as the size of the core and shell(s) is reduced, quantum confinement effects become stronger, and electroluminescent emission may be stimulated at shorter wavelength. For display applications, the diameter of the core and shell(s) structure is typically in the range of 1-10 nm. Quantum dots that emit blue light are typically the smallest, with core-shell(s) diameter in the approximate range of 1-2.5 nm. Quantum dots that emit green light are typically slightly larger, with core-shell(s) diameter in the approximate range of 2.5-4 nm. Quantum dots that emit red light are typically larger, with core-shell(s) diameter in the approximate range of 5-7 nm. It should be understood that these ranges are provided by way of example and to aid understanding and are not intended to be limiting.

Examples of quantum dot light emitting materials include materials comprising a core of CdSe. CdSe has a bulk bandgap of 1.73 eV, corresponding to emission at 716 nm. However, the emission spectrum of CdSe may be adjusted across the visible spectrum by tailoring the size of the CdSe quantum dot. Quantum dot light emitting materials comprising a CdSe core may further comprise one or more shells, comprising CdS, ZnS or combinations thereof. Quantum dot light emitting materials comprising CdSe may further comprise a passivation structure, which may include ligands bonded to the shell(s). Quantum dot light emitting materials comprising CdSe/CdS or CdSe/ZnS core-shell structures may be tuned to emit red, green or blue light for application in displays and/or light panels.

Examples of quantum dot light emitting materials further include materials comprising a core of InP. InP has a bulk bandgap of 1.35 eV, corresponding to emission at 918 nm. However, the emission spectrum of InP may be adjusted across the visible spectrum by tailoring the size of the InP quantum dot. Quantum dot light emitting materials comprising an InP core may further comprise one or more shells of CdS, ZnS or combinations thereof. Quantum dot light emitting materials comprising InP may further comprise a passivation structure, which may include ligands bonded to the shell(s). Quantum dot light emitting materials comprising InP/CdS or InP/ZnS core-shell structures may be tuned to emit red, green or blue light for application in displays and/or light panels.

In general, QLED devices may be photoluminescent or electroluminescent. The term "QLED" may be used to describe single emissive unit electroluminescent devices that comprise electroluminescent quantum dot light emitting material. The term "QLED" may also be used to describe one or more emissive units of stacked electroluminescent devices that comprise electroluminescent quantum dot light emitting material. This nomenclature may differ slightly from that used by other sources.

As used herein, the term "perovskite" includes any perovskite material that may be used in an optoelectronic device. Any material that may adopt a three-dimensional (3D) structure of $ABX_3$, where A and B are cations and X is an anion, may be considered a perovskite material. FIG. 3 depicts an example of a perovskite material with a 3D structure of $ABX_3$. The A cations may be larger than the B cations. The B cations may be in 6-fold coordination with surrounding X anions. The A anions may be in 12-fold coordination with surrounding X anions.

Perovskite materials are becoming increasingly attractive for application in optoelectronic devices. Many of the perovskite materials used to make such devices are earth-abundant and relatively inexpensive, so perovskite optoelectronic devices have the potential for cost advantages. There are many classes of perovskite material. One class of perovskite material that has shown particular promise for optoelectronic devices is the metal halide perovskite material class. For metal halide perovskite material, the A component may be a monovalent organic cation, such as methylammonium ($CH_3NH_3^+$) or formamidinium ($CH(NH_2)_2^+$), an inorganic atomic cation, such as caesium ($Cs^+$), or a combination thereof, the B component may be a divalent metal cation, such as lead ($Pb^+$), tin ($Sn^+$), copper ($Cu^+$), europium ($Eu^+$) or a combination thereof, and the X component may be a halide anion, such as $I^-$, $Br^-$, $Cl^-$, or a combination thereof. Where the A component is an organic cation, the perovskite material may be defined as an organic metal halide perovskite material. $CH_3NH_3PbBr_3$ and $CH(NH_2)_2PbI_3$ are non-limiting examples of metal halide perovskite materials with a 3D structure. Where the A component is an inorganic cation, the perovskite material may be defined as an inorganic metal halide perovskite material. $CsPbI_3$, $CsPbCl_3$ and $CsPbBr_3$ are non-limiting examples of inorganic metal halide perovskite materials.

As used herein, the term "perovskite" further includes any material that may adopt a layered structure of $L_2(ABX_3)_{n-1}BX_4$ (which may also be written as $L_2A_{n-1}B_nX_{3n+1}$), where L, A and B are cations, X is an anion, and n is the number of $BX_4$ monolayers disposed between two layers of cation L. FIG. 4 depicts examples of perovskite materials with a layered structure of $L_2(ABX_3)_{n-1}BX_4$ having different values for n. For metal halide perovskite material, the A component may be a monovalent organic cation, such as methylammonium ($CH_3NH_3^+$) or formamidinium ($CH(NH_2)_2^+$), an atomic cation, such as caesium ($Cs^+$), or a combination thereof, the L component may be an organic cation such as 2-phenylethylammonium ($C_6H_5C_2H_4NH_3^+$) or 1-napthylmethylammonium ($C_{10}H_2CH_2NH_3^+$), the B component may be a divalent metal cation, such as lead ($Pb^+$), tin ($Sn^+$), copper ($Cu^+$), europium ($Eu^+$) or a combination thereof, and the X component may be a halide anion, such as $I^-$, $Br^-$, $Cl^-$, or a combination thereof. $(C_6H_5C_2H_4NH_3)_2(CH(NH_2)_2PbBr_3)_{n-1}$ $PbBr_4$ and $(C_{10}H_2CH_2NH_3)_2(CH_3NH_3PbI_2Br)_{n-1}$ $PbI_3Br$ are non-limiting examples of metal halide perovskite material with a layered structure.

Where the number of layers n is large, for example n greater than approximately 10, perovskite material with a layered structure of $L_2(ABX_3)_{n-1}BX_4$ adopts a structure that is approximately equivalent to perovskite material with a 3D structure of $ABX_3$. As used herein, and as would generally be understood by one skilled in the art, perovskite material having a large number of layers may be referred to as a 3D perovskite material, even though it is recognized that such perovskite material has reduced dimensionality from n=∞. Where the number of layers n=1, perovskite material with a layered structure of $L_2(ABX_3)_{nn-1}BX_4$ adopts a two-dimensional (2D) structure of $L_2BX_4$. Perovskite material having a single layer may be referred to as a 2D perovskite material. Where n is small, for example n in the range of approximately 2-10, perovskite material with a layered structure of $L_2(ABX_3)_{n-1}BX_4$ adopts a quasi-two-dimensional (Quasi-2D) structure. Perovskite material having a small number of layers may be referred to as a Quasi-2D perovskite material. Owing to quantum confinement effects, the energy band gap is lowest for layered perovskite material structures where n is highest.

Perovskite material may have any number of layers. Perovskites may comprise 2D perovskite material, Quasi-2D perovskite material, 3D perovskite material or a combination thereof. For example, perovskites may comprise an ensemble of layered perovskite materials having different numbers of layers. For example, perovskites may comprise an ensemble of Quasi-2D perovskite materials having different numbers of layers.

As used herein, the term "perovskite" further includes films of perovskite material. Films of perovskite material may be crystalline, polycrystalline or a combination thereof, with any number of layers and any range of grain or crystal size.

As used herein, the term "perovskite" further includes nanocrystals of perovskite material that have structure equivalent to or resembling the 3D perovskite structure of $ABX_3$ or the more general layered perovskite structure of $L_2(ABX_3)_{n-1} BX_4$. Nanocrystals of perovskite material may include perovskite nanoparticles, perovskite nanowires, perovskite nanoplatelets, or a combination thereof. Nanocrystals of perovskite material may be of any shape or size, with any number of layers and any range of grain or crystal sizes. FIG. 5 depicts an example of nanocrystal of perovskite material with a layered structure that resembles $L_2(ABX_3)_{n-1} BX_4$, where n=5 and L cations are arranged at the surface of the perovskite nanocrystal. The term "resembles" is used because for a nanocrystal of perovskite material, the distribution of L cations may differ from that of perovskite material with a formal layered structure of $L_2(ABX_3)_{n-1} BX_4$. For example, in a nanocrystal of perovskite material, there may be a greater proportion of L cations arranged along the sides of the nanocrystal.

Several types of perovskite material may be stimulated to emit light in response to optical or electrical excitation. That is to say that perovskite light emitting material may be photoluminescent or electroluminescent. This nomenclature may differ slightly from that used by other sources.

One example of a perovskite light emitting material that emits red light is methylammonium lead iodide $(CH_3NH_3PbI_3)$. One example of a perovskite light emitting material that emits green light is formamidinium lead bromide $(CH(NH_2)_2PbBr_3)$. One example of a perovskite light emitting material that emits blue light is methylammonium lead chloride $(CH_3NH_3PbCl_3)$.

In general, PeLED devices may be photoluminescent or electroluminescent. The term "PeLED" may be used to describe single emissive unit electroluminescent devices that comprise electroluminescent perovskite light emitting material. The term "PeLED" may also be used to describe one or more emissive units of stacked electroluminescent devices that comprise electroluminescent perovskite light emitting material. This nomenclature may differ slightly from that used by other sources.

As used herein, "top" means furthest away from the substrate, while "bottom" means closest to the substrate. Where a first layer is described as "disposed over" a second layer, the first layer is disposed further away from the substrate. There may be other layers between the first and second layer, unless it is specified that the first layer is "in contact with" the second layer.

As used herein, "solution processible" means capable of being dissolved, dispersed or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) and electron affinities (EA) are measured as negative energies relative to a vacuum level, a higher HOMO energy level corresponds to an IP that is less negative. Similarly, a higher LUMO energy level corresponds to an EA that is less negative. On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. The definitions of HOMO and LUMO energy levels therefore follow a different convention than work functions.

As used herein, and as would be generally understood by one skilled in the art, a light emitting device, such as a PeLED, OLED or QLED may be referred to as a "stacked" light emitting device if two or more emissive units are disposed over one another and are separated by one or more charge generation layers within the layer structure of the light emitting device. Such charge generation layers may be single layers or may comprise multiple layers. In some sources, a stacked light emitting device may be referred to as a tandem light emitting device. It should be understood that the terms "stacked" and "tandem" may be used interchangeably, and as used herein, a tandem light emitting device is also considered to be a stacked light emitting device. This nomenclature may differ slightly from that used by other sources.

As used herein, the terms "OLED", "QLED" and "PeLED" may be used to describe single emissive unit electroluminescent devices that respectively comprise electroluminescent organic, quantum and perovskite light emitting materials. The terms "OLED", "QLED" and "PeLED" may also be used to describe one or more emissive units of stacked electroluminescent devices that respectively comprise electroluminescent organic, quantum dot and perovskite light emitting materials.

SUMMARY

A device is provided. In one embodiment, the device comprises a first stacked light emitting device comprising: a first electrode; a second electrode; a first emissive unit comprising a first emissive layer; a second emissive unit comprising a second emissive layer; and a first charge generation layer; wherein the first emissive unit, the second emissive unit and the first charge generation layer are all disposed between the first electrode and the second electrode; the first emissive unit is disposed over the first electrode; the first charge generation layer is disposed over the first emissive unit; the second emissive unit is disposed over the first charge generation layer; the second electrode is disposed over the second emissive unit; the first emissive unit and the second emissive unit are independently addressable and may emit light independently of each other; the first emissive unit emits light having a first hue classified as red, green or blue and a first chromaticity having first CIE 1931 (x, y) colour space chromaticity coordinates of (x1, y1); the second emissive unit emits light having a second hue classified as red, green or blue and a second chromaticity having second CIE 1931 (x, y) colour space chromaticity coordinates of (x2, y2); the second hue is the same as the first hue; the second chromaticity is substantially different to the first chromaticity; and the first emissive layer and the second emissive layer comprise organic light emitting material, quantum dot light emitting material and/or perovskite light emitting material.

In one embodiment, the second chromaticity coordinates (x2, y2) are not contained within a one-step MacAdam ellipse that is centralized on the first chromaticity coordinates (x1, y1). In one embodiment, the second chromaticity coordinates (x2, y2) are not contained within a three-step MacAdam ellipse that is centralized on the first chromaticity coordinates (x1, y1).

In one embodiment, the first emissive unit emits light having a peak wavelength in the visible spectrum that is defined as the first peak wavelength; the second emissive unit emits light having a peak wavelength in the visible spectrum that is defined as the second peak wavelength; wherein the second peak wavelength is at least 4 nm greater than or at least 4 nm less than the first peak wavelength.

In one embodiment, the first CIE 1931 (x, y) colour space chromaticity coordinates (x1, y1) may be converted to first CIE 1976 (u', v') colour space chromaticity coordinates (u1, v1); and the second CIE 1931 (x, y) colour space chromaticity coordinates (x2, y2) may be converted to second CIE 1976 (u', v') colour space chromaticity coordinates (u2, v2); wherein the first chromaticity coordinates (u1, v1) of light from the first emissive layer and the second chromaticity coordinates (u2, v2) of light from the second emissive layer are sufficiently different such that the difference in chromaticity as defined by Δuv is 0.010 or more.

In one embodiment, the first emissive unit and the second emissive unit both emit red light with peak wavelength in the visible spectrum in the range of 580 nm to 780 nm. In one embodiment, the first emissive unit emits red light with a peak wavelength in the visible spectrum in the range of 610 nm to 780 nm; and the second emissive unit emits red light with a peak wavelength in the visible spectrum in the range of 580 nm to 610 nm. In one embodiment, the first emissive unit emits red light with a peak wavelength in the visible spectrum in the range of 580 nm to 610 nm; and the second emissive unit emits red light with a peak wavelength in the visible spectrum in the range of 610 nm to 780 nm. In one embodiment, the first emissive unit emits red light with a CIE 1931 x coordinate of 0.660 or more; and the second emissive unit emits red light with a CIE 1931 x coordinate of less than 0.660. In one embodiment, the first emissive unit emits red light with a CIE 1931 x coordinate of less than 0.660; and the second emissive unit emits red light with a CIE 1931 x coordinate of 0.660 or more.

In one embodiment, the first emissive unit and the second emissive unit both emit green light with peak wavelength in the visible spectrum in the range of 500 nm to 580 nm. In one embodiment, the first emissive unit emits green light with a peak wavelength in the visible spectrum in the range of 500 nm to 535 nm; and the second emissive unit emits green light with a peak wavelength in the visible spectrum in the range of 535 nm to 580 nm. In one embodiment, the first emissive unit emits green light with a peak wavelength in the visible spectrum in the range of 535 nm to 580 nm; and the second emissive unit emits green light with a peak wavelength in the visible spectrum in the range of 500 nm to 535 nm. In one embodiment, the first emissive unit emits green light with a CIE 1931 y coordinate of 0.670 or more; and the second emissive unit emits green light with a CIE 1931 y coordinate of less than 0.670. In one embodiment, the first emissive unit emits green light with a CIE 1931 y coordinate of less than 0.670; and the second emissive unit emits green light with a CIE 1931 y coordinate of 0.670 or more.

In one embodiment, the first emissive unit and the second emissive unit both emit blue light with peak wavelength in the visible spectrum in the range of 380 nm to 500 nm. In one embodiment, the first emissive unit emits blue light with a peak wavelength in the visible spectrum in the range of 380 nm to 465 nm; and the second emissive unit emits blue light with a peak wavelength in the visible spectrum in the range of 465 nm to 500 nm. In one embodiment, the first emissive unit emits blue light with a peak wavelength in the visible spectrum in the range of 465 nm to 500 nm; and the second emissive unit emits blue light with a peak wavelength in the visible spectrum in the range of 380 nm to 465 nm. In one embodiment, the first emissive unit emits blue light with a CIE 1931 y coordinate of 0.080 or less; and the second emissive unit emits blue light with a CIE 1931 y coordinate of more than 0.080. In one embodiment, the first emissive unit emits blue light with a CIE 1931 y coordinate of more than 0.080; and the second emissive unit emits blue light with a CIE 1931 y coordinate of 0.080 or less.

In one embodiment, the first emissive layer and the second emissive layer comprise organic light emitting material. In one embodiment, the first emissive layer and the second emissive layer comprise quantum dot light emitting material. In one embodiment, the first emissive layer and the second emissive layer comprise perovskite light emitting material. In one embodiment, the first emissive layer comprises a first class of light emitting material that is either organic light emitting material, quantum dot light emitting material or perovskite light emitting material; the second emissive layer comprises a second class of light emitting material that is either organic light emitting material, quantum dot light emitting material or perovskite light emitting material; and the second class of light emitting material is not the same as the first class of light emitting material.

In one embodiment, the device is part of a light panel. In one embodiment, the device is part of a display.

A display is provided. In one embodiment the display comprises: a first sub-pixel configured to emit red light having a peak wavelength in the visible spectrum in the range of 580 nm to 780 nm; a second sub-pixel configured to emit green light having a peak wavelength in the visible spectrum in the range of 500 nm to 580 nm; and a third sub-pixel configured to emit blue light having a peak wavelength in the visible spectrum in the range of 380 nm to 500 nm; wherein at least one of the first sub-pixel, the second sub-pixel and the third sub-pixel comprises a device comprising a stacked light emitting device comprising: a first electrode; a second electrode; a first emissive unit comprising a first emissive layer; a second emissive unit comprising a second emissive layer; and a first charge generation layer; wherein the first emissive unit, the second emissive unit and the first charge generation layer are all disposed between the first electrode and the second electrode; the first emissive unit is disposed over the first electrode; the first charge generation layer is disposed over the first emissive unit; the second emissive unit is disposed over the first charge generation layer; the second electrode is disposed over the second emissive unit; the first emissive unit and the second emissive unit are independently addressed and may emit light independently of each other; the first emissive unit emits light having a first hue classified as red, green or blue and a first chromaticity having first CIE 1931 (x, y) colour space chromaticity coordinates of (x1, y1); the second emissive unit emits light having a second hue classified as red, green or blue and a second chromaticity having second CIE 1931 (x, y) colour space chromaticity coordinates of (x2, y2); the second hue is the same as the first hue; the second chromaticity is substantially different to the first chromaticity; and the first emissive layer and the second emissive layer comprise organic light emitting material, quantum dot light emitting material and/or perovskite light emitting material.

In one embodiment, for the at least one of the first sub-pixel, the second sub-pixel and the third sub-pixel, the second chromaticity coordinates (x2, y2) are not contained within a one-step MacAdam ellipse that is centralized on the first chromaticity coordinates (x1, y1). In one embodiment, for the at least one of the first sub-pixel, the second sub-pixel and the third sub-pixel, the second chromaticity coordinates (x2, y2) are not contained within a three-step MacAdam ellipse that is centralized on the first chromaticity coordinates (x1, y1).

In one embodiment, for the at least one of the first sub-pixel, the second sub-pixel and the third sub-pixel, the first emissive unit emits light having a peak wavelength in the visible spectrum that is defined as the first peak wavelength; the second emissive unit emits light having a peak wavelength in the visible spectrum that is defined as the second peak wavelength; wherein the second peak wavelength is at least 4 nm greater than or at least 4 nm less than the first peak wavelength.

In one embodiment, for the at least one of the first sub-pixel, the second sub-pixel and the third sub-pixel, the first CIE 1931 (x, y) colour space chromaticity coordinates (x1, y1) may be converted to first CIE 1976 (u', v') colour space chromaticity coordinates (u1, v1); and the second CIE 1931 (x, y) colour space chromaticity coordinates (x2, y2) may be converted to second CIE 1976 (u', v') colour space chromaticity coordinates (u2, v2); wherein the first chromaticity coordinates (u1, v1) of light emitted from the first emissive layer and the second chromaticity coordinates (u2, v2) of light emitted from the second emissive layer are sufficiently different such that the difference in chromaticity as defined by Δuv is 0.010 or more.

A display is provided. In one embodiment the display comprises: a first sub-pixel configured to emit red light having a peak wavelength in the visible spectrum in the range of 580 nm to 780 nm; a second sub-pixel configured to emit green light having a peak wavelength in the visible spectrum in the range of 500 nm to 580 nm; and a third sub-pixel configured to emit blue light having a peak wavelength in the visible spectrum in the range of 380 nm to 500 nm; wherein all of the first sub-pixel, the second sub-pixel and the third sub-pixel comprise a device comprising a stacked light emitting device comprising: a first electrode; a second electrode; a first emissive unit comprising a first emissive layer; a second emissive unit comprising a second emissive layer; and a first charge generation layer; wherein the first emissive unit, the second emissive unit and the first charge generation layer are all disposed between the first electrode and the second electrode; the first emissive unit is disposed over the first electrode; the first charge generation layer is disposed over the first emissive unit; the second emissive unit is disposed over the first charge generation layer; the second electrode is disposed over the second emissive unit; the first emissive unit and the second emissive unit are independently addressed and may emit light independently of each other; the first emissive unit emits light having a first hue classified as red, green or blue and a first chromaticity having first CIE 1931 (x, y) colour space chromaticity coordinates of (x1, y1); the second emissive unit emits light having a second hue classified as red, green or blue and a second chromaticity having second CIE 1931 (x, y) colour space chromaticity coordinates of (x2, y2); the second hue is the same as the first hue; the second chromaticity is substantially different to the first chromaticity; and the first emissive layer and the second emissive layer comprise organic light emitting material, quantum dot light emitting material and/or perovskite light emitting material.

In one embodiment, for all of the first sub-pixel, the second sub-pixel and the third sub-pixel, the second chromaticity coordinates (x2, y2) are not contained within a one-step MacAdam ellipse that is centralized on the first chromaticity coordinates (x1, y1). In one embodiment, for all of the first sub-pixel, the second sub-pixel and the third sub-pixel, the second chromaticity coordinates (x2, y2) are not contained within a three-step MacAdam ellipse that is centralized on the first chromaticity coordinates (x1, y1).

In one embodiment, for all of the first sub-pixel, the second sub-pixel and the third sub-pixel, the first emissive unit emits light having a peak wavelength in the visible spectrum that is defined as the first peak wavelength; the second emissive unit emits light having a peak wavelength in the visible spectrum that is defined as the second peak wavelength; wherein the second peak wavelength is at least 4 nm greater than or at least 4 nm less than the first peak wavelength.

In one embodiment, for all of the first sub-pixel, the second sub-pixel and the third sub-pixel, the first CIE 1931 (x, y) colour space chromaticity coordinates (x1, y1) may be converted to first CIE 1976 (u', v') colour space chromaticity coordinates (u1, v1); and the second CIE 1931 (x, y) colour space chromaticity coordinates (x2, y2) may be converted to second CIE 1976 (u', v') colour space chromaticity coordinates (u2, v2); wherein the first chromaticity coordinates (u1, v1) of light emitted from the first emissive layer and the second chromaticity coordinates (u2, v2) of light emitted from the second emissive layer are sufficiently different such that the difference in chromaticity as defined by Δuv is 0.010 or more.

In one embodiment, the first sub-pixel comprises a first stacked light emitting device comprising a first emissive unit and a second emissive unit, wherein the first emissive unit emits red light with a peak wavelength in the visible spectrum in the range of 610 nm to 780 nm; and the second emissive unit emits red light with a peak wavelength in the visible spectrum in the range of 580 nm to 610 nm or vice-versa; the second sub-pixel comprises a second stacked light emitting device comprising a first emissive unit and a second emissive unit, wherein the first emissive unit emits green light with a peak wavelength in the visible spectrum in the range of 500 nm to 535 nm; and the second emissive unit emits green light with a peak wavelength in the visible spectrum in the range of 535 nm to 580 nm or vice-versa; and the third sub-pixel comprises a third stacked light emitting device comprising a first emissive unit and a second emissive unit, wherein the first emissive unit emits blue light with a peak wavelength in the visible spectrum in the range of 380 nm to 465 nm; and the second emissive unit emits blue light with a peak wavelength in the visible spectrum in the range of 465 nm to 500 nm or vice-versa.

In one embodiment, the first sub-pixel comprises a first stacked light emitting device comprising a first emissive unit and a second emissive unit, wherein the first emissive unit emits red light with a CIE 1931 x coordinate of 0.660 or more; and the second emissive unit emits red light with a CIE 1931 x coordinate of less than 0.660 or vice-versa; the second sub-pixel comprises a second stacked light emitting device comprising a first emissive unit and a second emissive unit, wherein the first emissive unit emissive unit emits green light with a CIE 1931 y coordinate of 0.670 or more; and the second emissive unit emits green light with a CIE 1931 y coordinate of less than 0.670 or vice-versa; and the third sub-pixel comprises a third stacked light emitting device comprising a first emissive unit and a second emissive unit, wherein the first emissive unit emits blue light with a CIE 1931 y coordinate of 0.080 or less; and the second emissive unit emits blue light with a CIE 1931 y coordinate of more than 0.080 or vice-versa.

In one embodiment, the first sub-pixel comprises a first stacked light emitting device comprising a first emissive unit and a second emissive unit, wherein the first emissive unit emits deeper red light, and the second emissive unit emits lighter red light, or vice-versa; the second sub-pixel comprises a second stacked light emitting device comprising a first emissive unit and a second emissive unit, wherein the first emissive unit emits deeper green light, and the second emissive unit emits lighter green light, or vice-versa; and the third sub-pixel comprises a third stacked light emitting device comprising a first emissive unit and a second emissive unit, wherein the first emissive unit emits deeper blue light, and the second emissive unit emits lighter blue light, or vice-versa.

In one embodiment, the emissive units that emit deeper red, green and blue light may together render the DCI-P3 colour gamut; and the emissive units that emit lighter red, green and blue light may together only render a colour gamut that is substantially narrower than the DCI-P3 colour gamut. In one embodiment, the emissive units that emit deeper red, green and blue light may together render the Rec. 2020 colour gamut; and the emissive units that emit lighter red, green and blue light may together only render a colour gamut that is substantially narrower than the Rec. 2020 colour gamut.

In one embodiment, for all of the first sub-pixel, the second sub-pixel and the third sub-pixel, the charge generation layer is addressed by one electrical contact, enabling the first emissive unit and the second emissive unit to be independently addressed. In one embodiment, for all of the third sub-pixel, the second sub-pixel and the third sub-pixel, the charge generation layer is addressed by two electrical contacts, enabling the first emissive unit and the second emissive unit to be independently addressed.

In one embodiment, the display is part of a consumer product.

DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings.

However, the present disclosure is not limited to specific methods and instrumentalities disclosed herein. Moreover, those in the art will understand that the drawings are not to scale.

Figure 1:
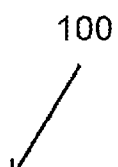

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing. Embodiments of the present disclosure will now be described, by way of example only, with reference to the following:

FIG. 1 depicts a light emitting device.

Figure 2:
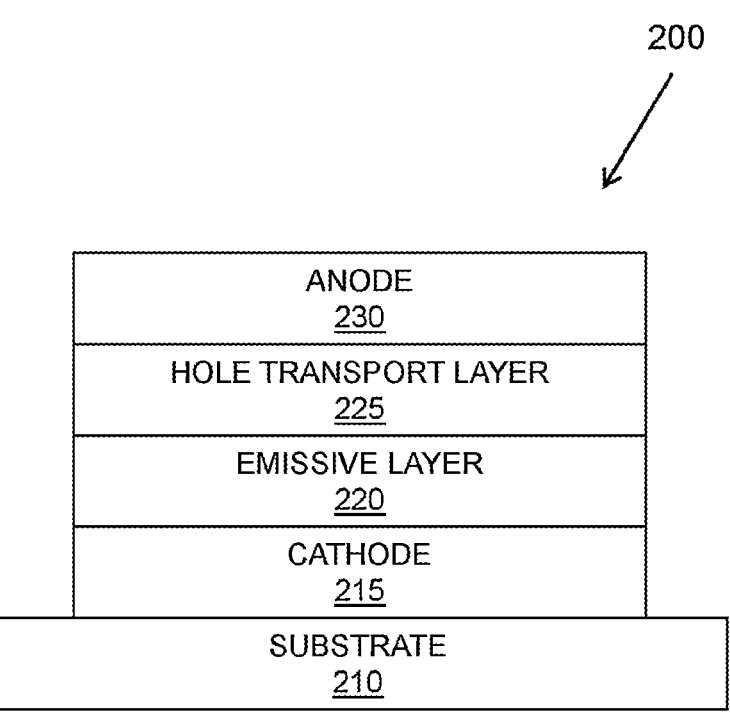

FIG. 2 depicts an inverted light emitting device.

FIG. 3 depicts 3D perovskite light emitting material with structure $ABX_3$.

FIG. 4 depicts layered perovskite light emitting material with structure $L_2(ABX_3)_{n-1} BX_4$, where n=1, 3, 5, 10 and ∞.

Figure 5:
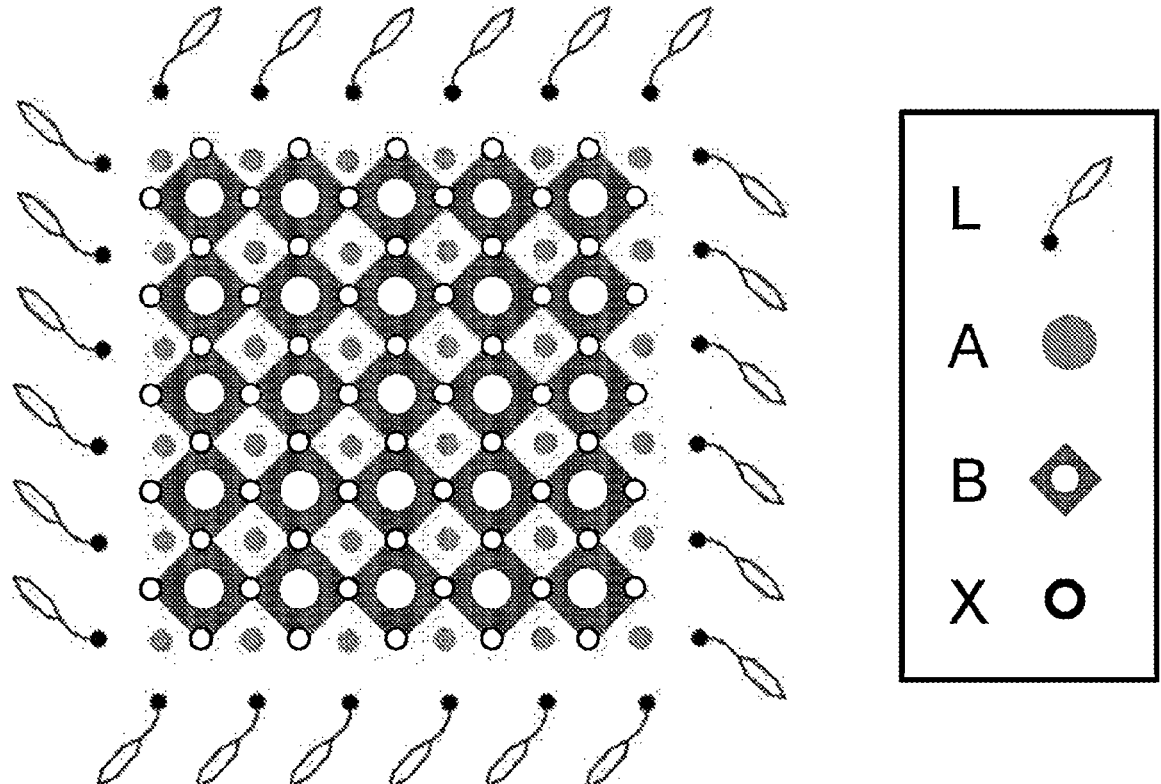

FIG. 5 depicts an example of a nanocrystal of perovskite material with a layered structure that resembles $L_2(ABX_3)_{n-1} BX_4$, where n=5.

Figure 6:
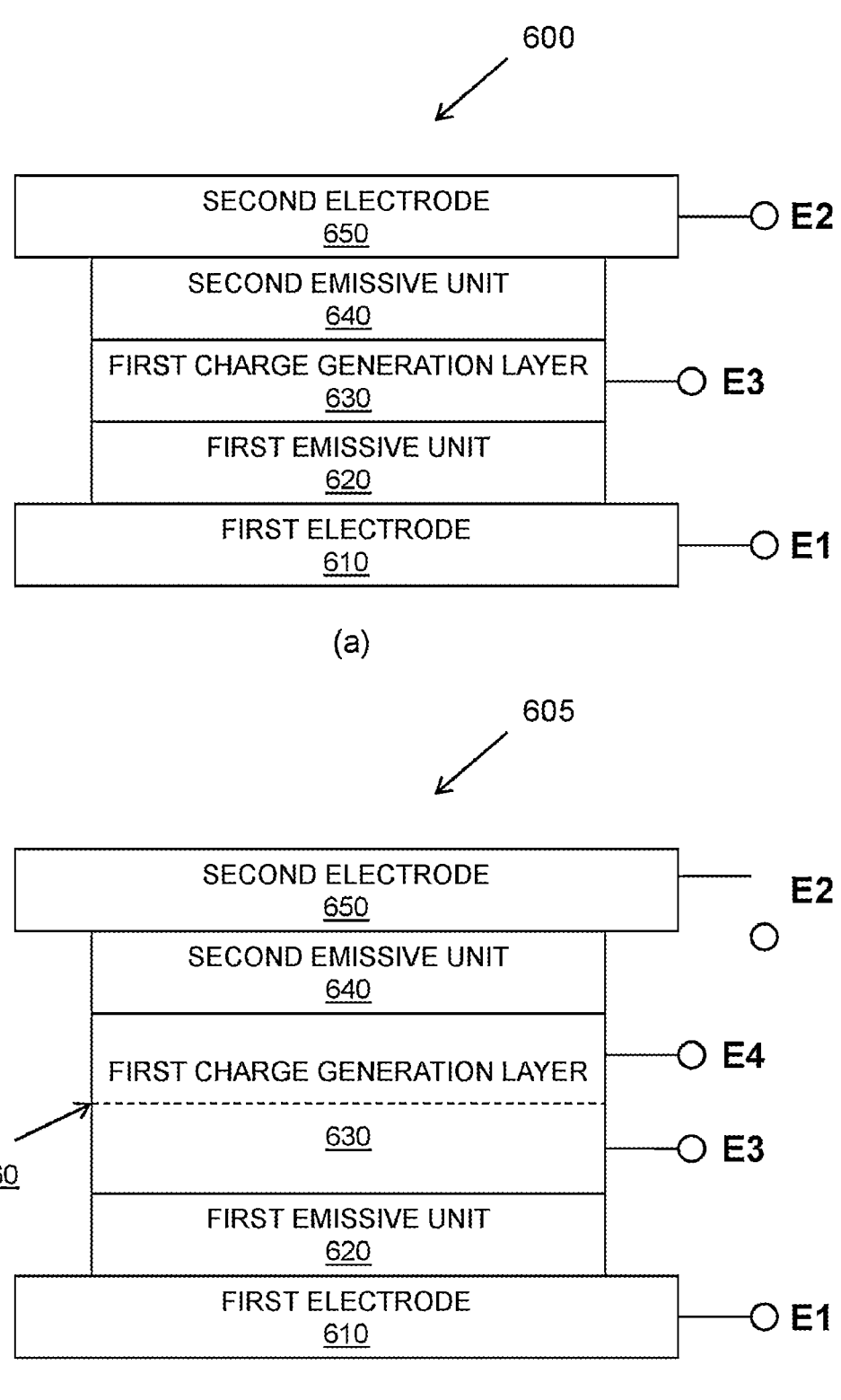

FIG. 6 depicts stacked light emitting devices having two emissive units.

Figure 7:
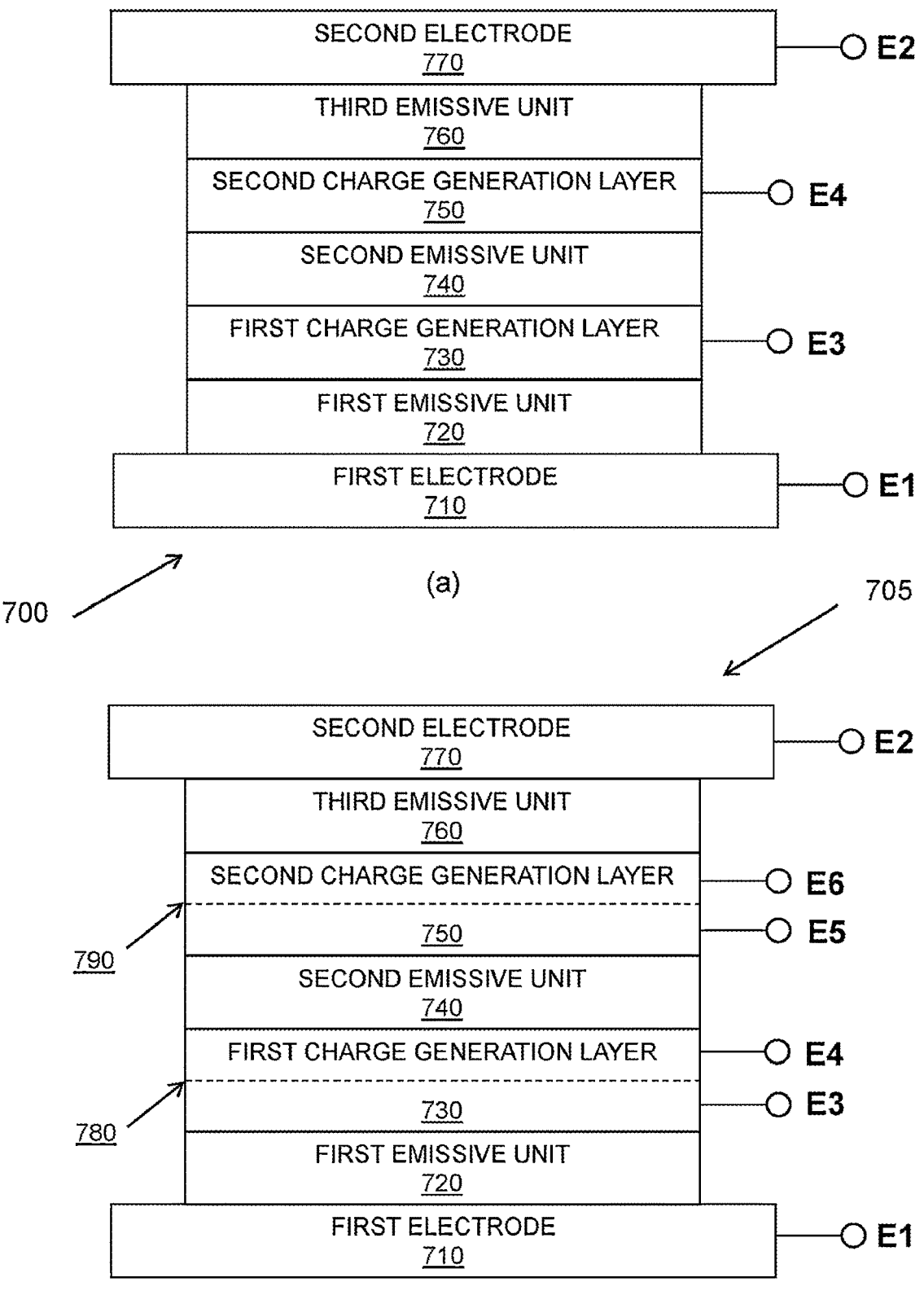

FIG. 7 depicts stacked light emitting devices having three emissive units.

Figure 8:
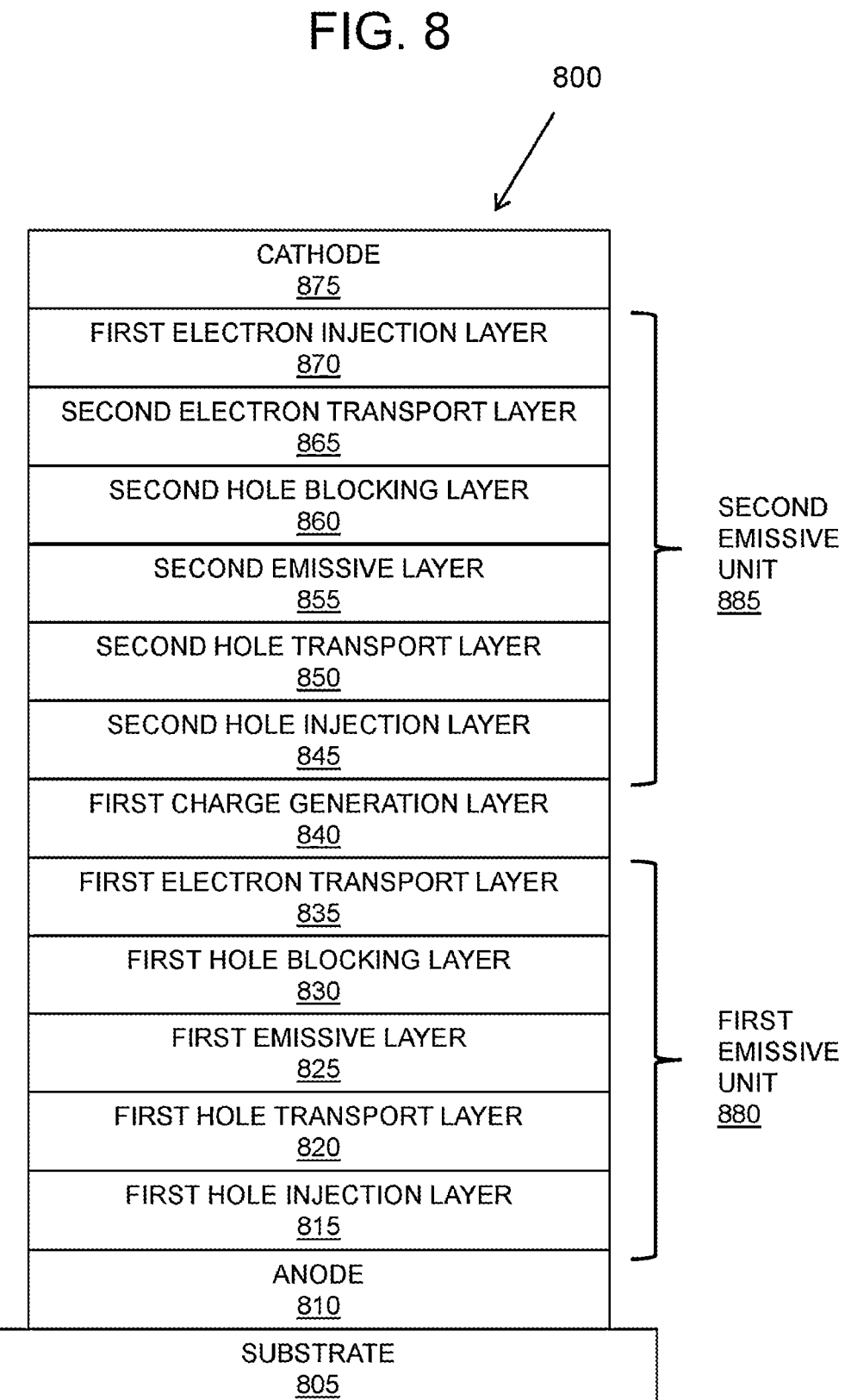

FIG. 8 depicts layers of a stacked light emitting device having two emissive units.

FIG. 9 depicts layers of a stacked light emitting device having three emissive units.

Figure 10:
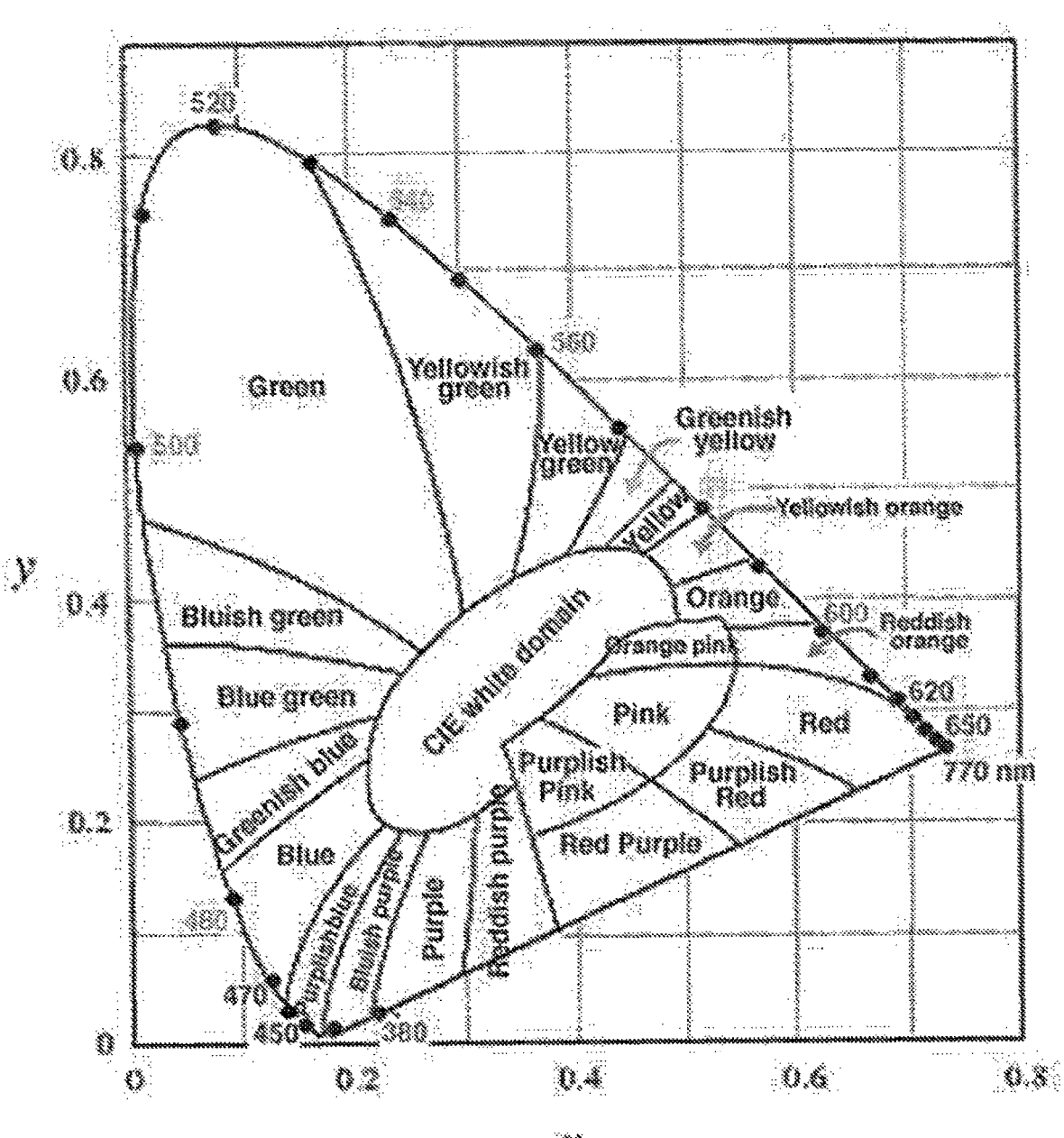

FIG. 10 depicts a rendition of the CIE 1931 (x, y) colour space chromaticity diagram.

FIG. 11 depicts a rendition of the CIE 1931 (x, y) colour space chromaticity diagram that also shows colour gamut for (a) DCI-P3 and (b) Rec. 2020 colour spaces.

FIG. 12 depicts a rendition of the CIE 1931 (x, y) colour space chromaticity diagram that also shows colour gamut for (a) DCI-P3 and (b) Rec. 2020 colour spaces with colour coordinates for exemplary red, green and blue devices.

Figure 13:
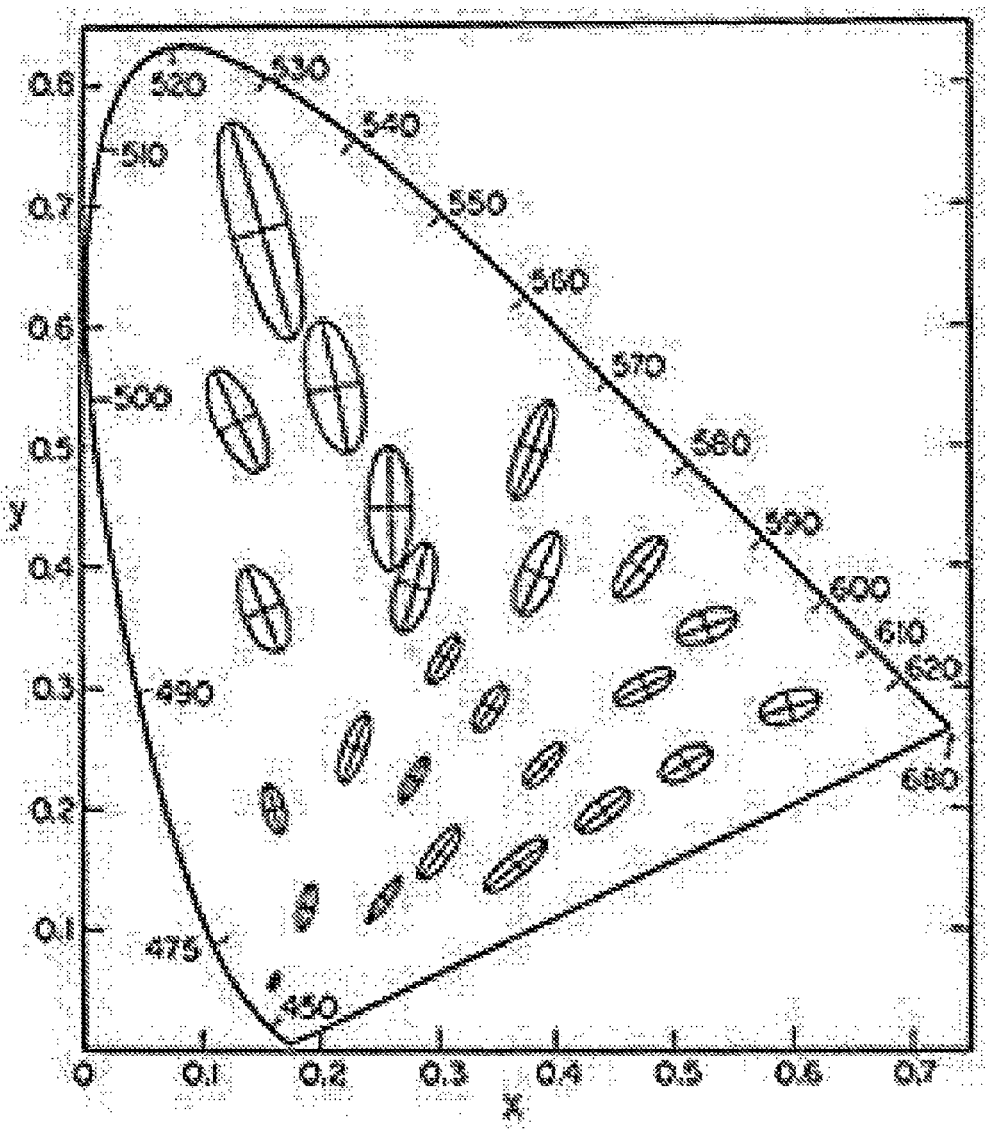

FIG. 13 depicts a rendition of the CIE 1931 (x, y) colour space chromaticity diagram that also shows 10-step MacAdam ellipses.

Figure 14:
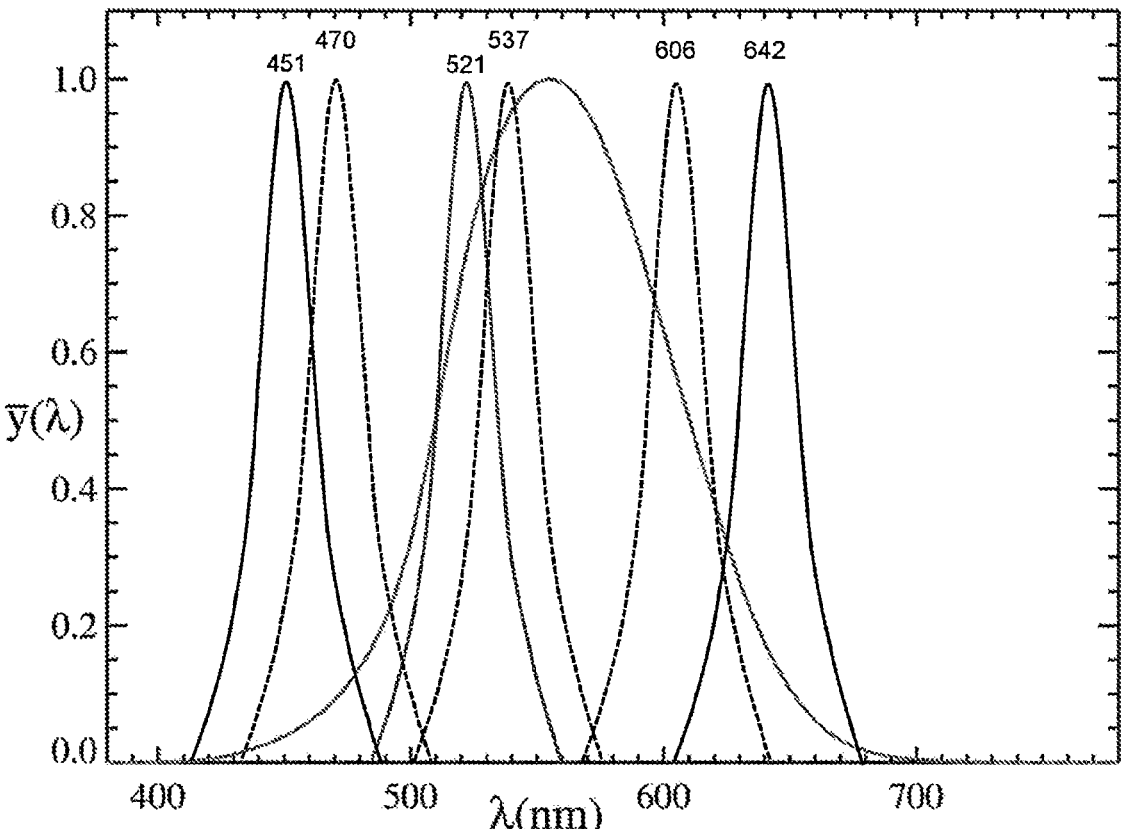

FIG. 14 depicts exemplary electroluminescence emission spectra for red, green and blue devices plotted against the photopic luminous efficiency function.

Figure 15:
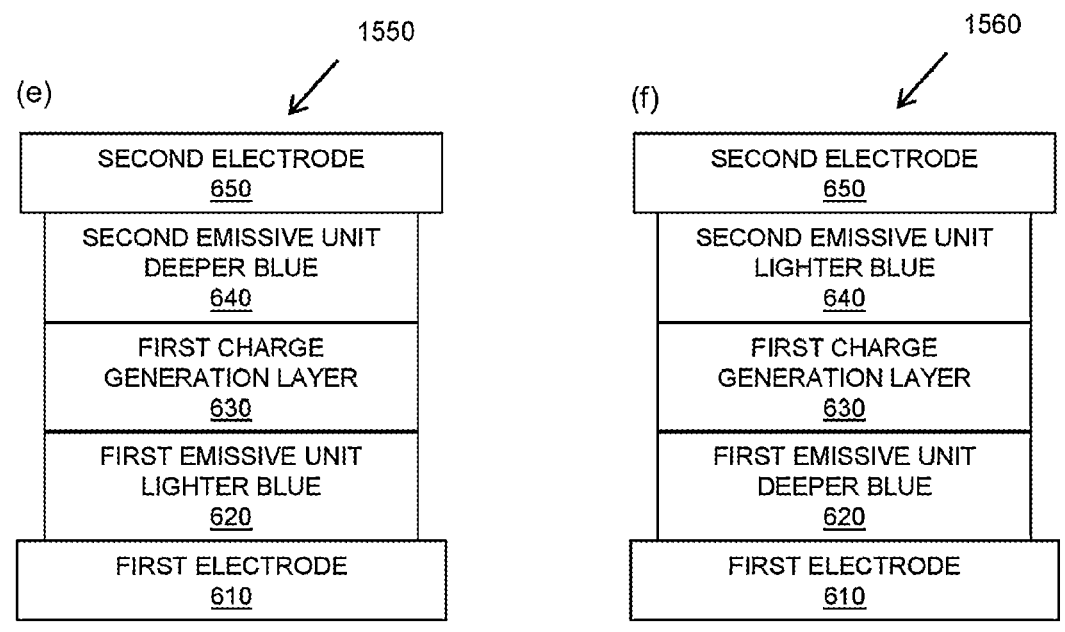

FIG. 15 depicts various configurations of emissive units for a stacked light emitting device having two emissive units.

Figure 16:
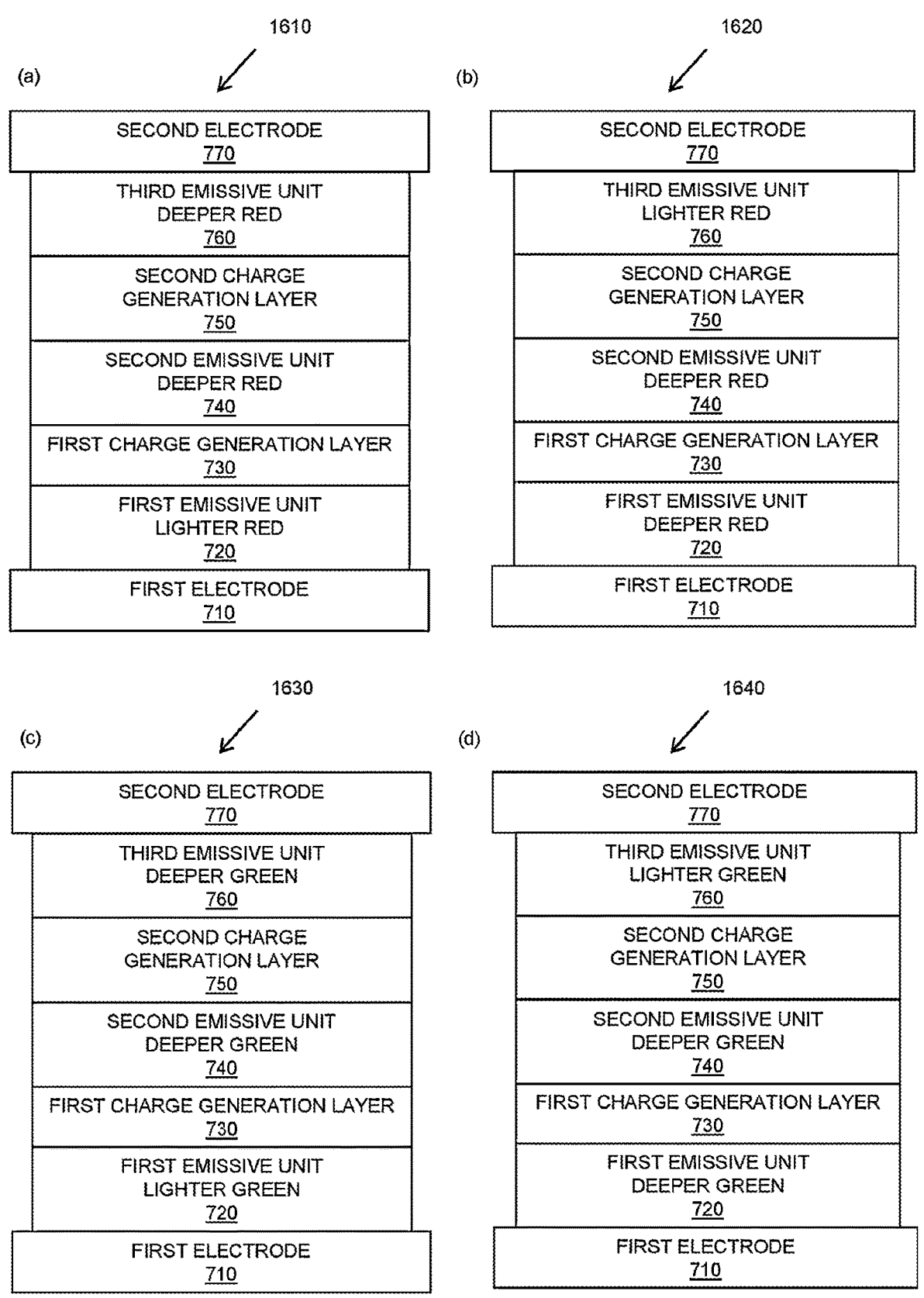

FIG. 16 depicts various configurations of emissive units for a stacked light emitting device having three emissive units.

Figure 17:
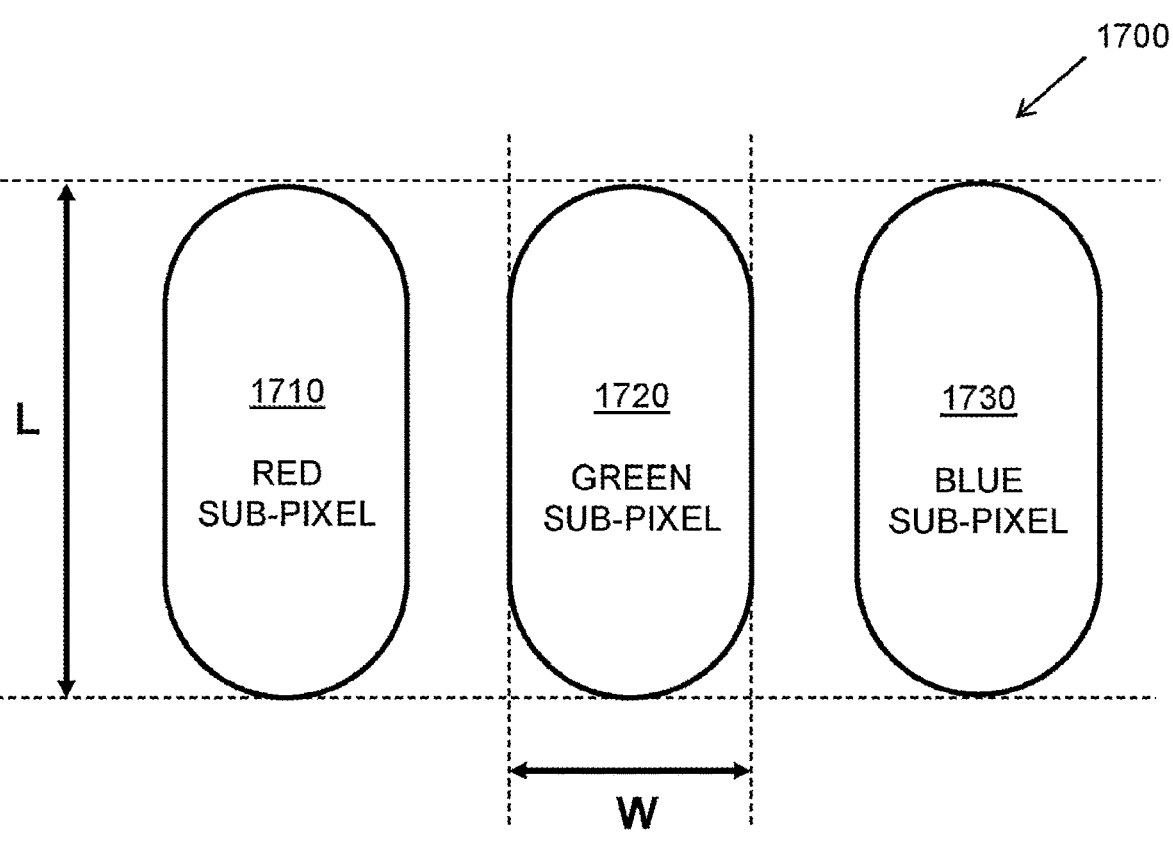

FIG. 17 depicts exemplary designs of red, green and blue sub-pixels.

Figure 18:
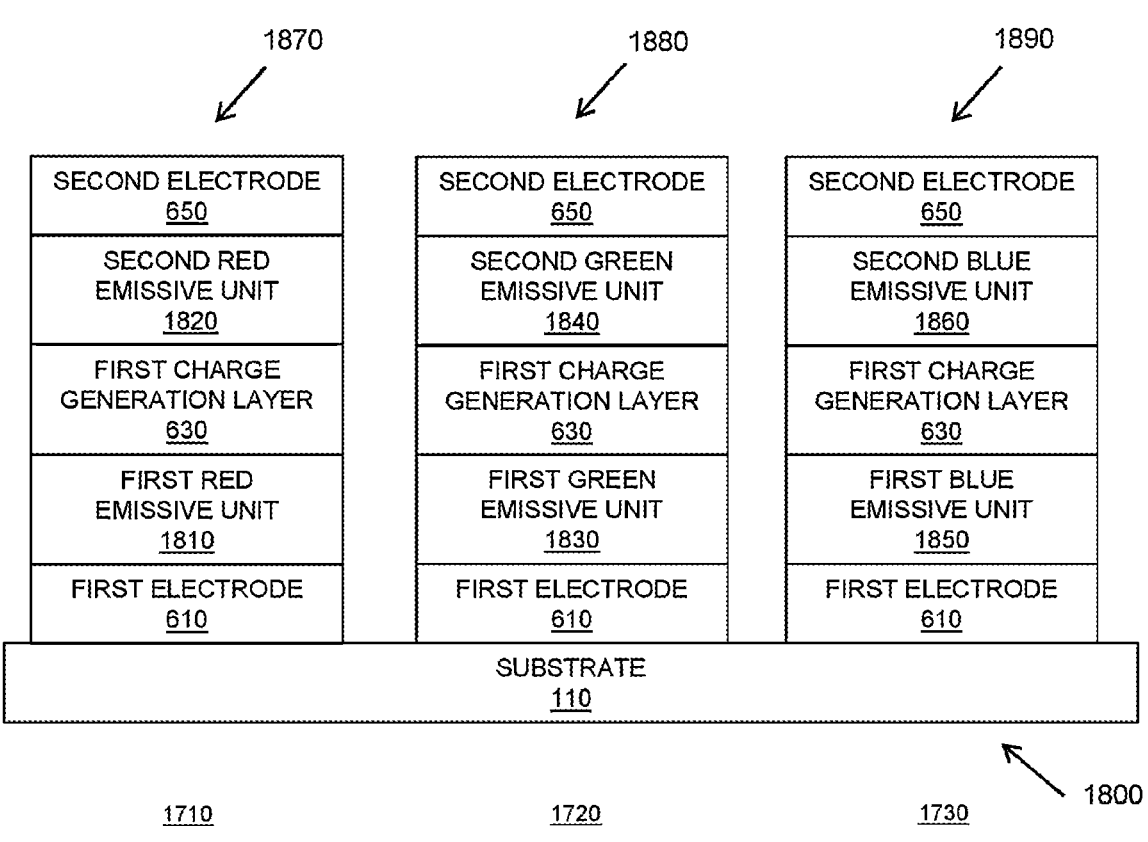

FIG. 18 depicts various configurations of emissive units for a display comprising red, green and blue sub-pixels.

DESCRIPTION OF EMBODIMENTS

The present invention relates to OLEDs, QLEDs and PeLEDs. Device architectures and operating principles for OLEDs, QLEDs and PeLEDs are substantially similar. Each of these light emitting devices comprises at least one emissive layer disposed between and electrically connected to an anode and a cathode. For an OLED, the emissive layer comprises organic light emitting material. For a QLED, the emissive layer comprises quantum dot light emitting material. For a PeLED, the emissive layer comprises perovskite light emitting material. For each of these light emitting devices, when a current is applied, the anode injects holes and the cathode injects electrons into the emissive layer(s). The injected holes and electrons each migrate towards the oppositely charged electrode. When an electron and a hole localize, an exciton, which is a localized electron-hole pair having an excited energy state, may be formed. Light is emitted if the exciton relaxes via a photo-emissive mechanism. Non-radiative mechanisms, such as thermal radiation and/or Auger recombination may also occur but are generally considered undesirable. Substantial similarity between device architectures and working principles required for OLEDs, QLEDs and PeLEDs, facilitates the combination of organic light emitting material, quantum dot light emitting material and perovskite light emitting material in a single device, such as a stacked light emitting device.

FIG. 1 shows a light emitting device 100 with a single emissive unit. The light emitting device 100 may be an OLED, QLED or PeLED. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a cathode 155 and a barrier layer 160. Device 100 may be fabricated by depositing the layers described in order. As the device 100 has anode 115 disposed under cathode 155, device 100 may be referred to as a "standard" device architecture. For an OLED, the emissive layer comprises organic light emitting material. For a QLED, the emissive layer comprises quantum dot light emitting material. For a PeLED, the emissive layer comprises perovskite light emitting material.

FIG. 2 shows an inverted light emitting device 200 with a single emissive unit. The light emitting device 200 may be an OLED, QLED or PeLED. The device includes a substrate 210, a cathode 215, an emissive layer 220, a hole transport layer 225, and an anode 230. Device 200 may be fabricated by depositing the layers described in order. As the device 200 has cathode 215 disposed under anode 230, device 200 may be referred to as an "inverted" device architecture. For an OLED, the emissive layer comprises organic light emitting material. For a QLED, the emissive layer comprises quantum dot light emitting material. For a PeLED, the emissive layer comprises perovskite light emitting material. Materials similar to those described with respect to device 100 may be used in the corresponding layers of device 200. FIG. 2 provides one example of how some layers may be omitted from the structure of an OLED, QLED or PeLED.

The simple layered structures illustrated in FIGS. 1 and 2 are provided by way of non-limiting examples, and it is understood that embodiments of the invention may be used in connection with a wide variety of other structures. The specific materials and structures described are exemplary in nature, and other materials and structures may be used. Functional OLEDs, QLEDs and PeLEDs may be achieved by combining the various layers described in different ways, or layers may be omitted entirely, based on factors such as performance, design and cost. Other layers, not specifically described, may also be included. Materials other than those specifically described may be used. Although many of the examples provided herein describe various layers as comprising a single material, it is understood that combinations of materials may be used. Also, the layers may have various sublayers. The names given to the various layers herein are not intended to be strictly limiting. For example, in a device, the hole transport layer may transport and inject holes into the emissive layer and may be described as a hole transport layer or a hole injection layer.

OLEDs, PeLEDs and QLEDs are generally intended to emit light through at least one of the electrodes, and one or more transparent electrodes may be useful in such optoelectronic devices. For example, a transparent electrode material, such as indium tin oxide (ITO), may be used for the bottom electrode, while a transparent electrode material, such as a thin metallic layer of a blend of magnesium and silver (Mg:Ag), may be used for the top electrode. For a device intended to emit light only through the bottom electrode, the top electrode does not need to be transparent, and may be comprised of an opaque and/or reflective layer, such as a metal layer having a high reflectivity. Similarly, for a device intended only to emit light through the top electrode, the bottom electrode may be opaque and/or reflective, such as a metal layer having a high reflectivity. Where an electrode does not need to be transparent, using a thicker layer may provide better conductivity and may reduce voltage drop and/or Joule heating in the device, and using a reflective electrode may increase the amount of light emitted through the other electrode by reflecting light back towards the transparent electrode. A fully transparent device may also be fabricated, where both electrodes are transparent.

Devices fabricated in accordance with embodiments of the present invention may optionally comprise a substrate 110. The substrate 110 may comprise any suitable material that provides the desired structural and optical properties. The substrate 110 may be rigid or flexible. The substrate 110 may be flat or curved. The substrate 110 may be transparent, translucent or opaque. Preferred substrate materials are glass, plastic and metal foil. Other substrates, such as fabric and paper may be used. The material and thickness of the substrate 110 may be chosen to obtain desired structural and optical properties.

Devices fabricated in accordance with embodiments of the present invention may optionally comprise an anode 115. The anode 115 may comprise any suitable material or combination of materials known to the art, such that the anode 115 is capable of conducting holes and injecting them into the layers of the device. Preferred anode 115 materials include conductive metal oxides, such as indium tin oxide (ITO), indium zinc oxide (IZO) and aluminum zinc oxide (AlZnO), metals such as silver (Ag), aluminum (Al), aluminum-neodymium (Al:Nd), gold (Au) and alloys thereof, or a combination thereof. Other preferred anode 115 materials include graphene, carbon nanotubes, nanowires or nanoparticles, silver nanowires or nanoparticles, organic materials, such as poly(3,4-ethylenedioxythiophene):polystyrene sulfonate (PEDOT:PSS) and derivatives thereof, or a combination thereof. Compound anodes comprising one or more anode materials in a single layer may be preferred for some devices. Multilayer anodes comprising one or more anode materials in one or more layers may be preferred for some devices. One example of a multilayer anode is ITO/Ag/ITO. In a standard device architecture for OLEDs, QLEDs and PeLEDs, the anode 115 may be sufficiently transparent to create a bottom-emitting device, where light is emitted through the substrate. One example of a transparent anode commonly used in a standard device architecture is a layer of ITO. Another example of a transparent anode commonly used in a standard device architecture is ITO/Ag/ITO, where the Ag thickness is less than approximately 25 nm. By including a layer of silver of thickness less than approximately 25 nm, the anode may be transparent as well as partially reflective. When such a transparent and partially reflective anode is used in combination with a reflective cathode, such as LiF/Al, this may have the advantage of creating a microcavity within the device. A microcavity may provide one or more of the following advantages: an increased total amount of light emitted from device, and therefore higher efficiency and brightness; an increased proportion of light emitted in the forward direction, and therefore increased apparent brightness at normal incidence; and spectral narrowing of the emission spectrum, resulting in light emission with increased colour saturation. The anode 115 may be opaque and/or reflective. In a standard device architecture for OLEDs, QLEDs and PeLEDs, a reflective anode 115 may be preferred for some top-emitting devices to increase the amount of light emitted from the top of the device. One example of a reflective anode commonly used in a standard device architecture is a multilayer anode of ITO/Ag/ITO, where the Ag thickness is greater than approximately 80 nm. When such a reflective anode is used in combination with a transparent and partially reflective cathode, such as Mg:Ag, this may have the advantage of creating a microcavity within the device. The material and thickness of the anode 115 may be chosen to obtain desired conductive and optical properties. Where the anode 115 is transparent, there may be a range of thicknesses for a particular material that is thick enough to provide the desired conductivity, yet thin enough to provide the desired degree of transparency. Other materials and structures may be used.

Devices fabricated in accordance with embodiments of the present invention may optionally comprise a hole transport layer 125. The hole transport layer 125 may include any material capable of transporting holes. The hole transport layer 125 may be deposited by a solution process or by a vacuum deposition process. The hole transport layer 125 may be doped or undoped. Doping may be used to enhance conductivity.

Examples of undoped hole transport layers are N,N'-Di (1-naphthyl)-N,N'-diphenyl-(1,1'-biphenyl)-4,4'-diamine (NPD), poly[(9,9-dioctylfluorenyl-2,7-diyl)-co-(4,4'-(N-(4-sec-butylphenyl) diphenylamine (TFB), poly[N,N'-bis(4-butylphenyl)-N,N'-bis(phenyl)-benzidine] (poly-TPD), poly (9-vinylcarbazole) (PVK), 4,4'-Bis(N-carbazolyl)-1,1'-biphenyl (CBP), Spiro-OMeTAD and molybdenum oxide ($MoO_3$). One example of a doped hole transport layer is 4,4',4"-tris[phenyl(m-tolyl)amino]triphenylamine (m-MTDATA) doped with $F_4$-TCNQ at a molar ratio of 50:1. One example of a solution-processed hole transport layer is PEDOT:PSS. Other hole transport layers and structures may be used.

Devices fabricated in accordance with embodiments of the present invention may optionally comprise an emissive layer 135. The emissive layer 135 may include any material capable of emitting light when a current is passed between anode 115 and cathode 155.

Several examples of fluorescent organic light emitting materials are described in European patent EP 0423283 B1. Several examples of phosphorescent organic light emitting materials are described in U.S. Pat. No. 6,303,238 B1 and 7,279,704 B2. Several examples of organic light emitting materials that emit through a TADF mechanism are described in Uoyama et al.

Several examples of quantum dot light emitting materials are described in Kathirgamanathan et al. (1). All of these citations are included herein by reference in their entirety.

Examples of perovskite light-emitting materials include 3D perovskite materials, such as methylammonium lead iodide ($CH_3NH_3PbI_3$), methylammonium lead bromide ($CH_3NH_3PbBr_3$), methylammonium lead chloride ($CH_3NH_3PbCl_3$), formamidinium lead iodide ($CH(NH_2)_2PbI_3$), formamidinium lead bromide ($CH(NH_2)_2PbBr_3$), formamidinium lead chloride ($CH(NH_2)_2PbCl_3$), caesium lead iodide ($CsPbI_3$), caesium lead bromide ($CsPbBr_3$) and caesium lead chloride ($CsPbCl_3$). Examples of perovskite light-emitting materials further include 3D perovskite materials with mixed halides, such as $CH_3NH_3PbI_{3-x}Cl_x$, $CH_3NH_3PbI_{3-x}Br_x$, $CH_3NH_3PbCl_{3-x}Br_x$, $CH(NH_2)_2PbI_{3-x}Br_x$, $CH(NH_2)_2PbI_{3-x}Cl_x$, $CH(NH_2)_2PbCl_{3-x}Br_x$, $CsPbI_{3-x}Cl_x$, $CsPbI_{3-x}Br_x$ and $CsPbCl_{3-x}Br_x$, where x is in the range of 0-3. Examples of perovskite light-emitting materials further include 2D perovskite materials such as $(C_{10}H_7CH_2NH_3)_2PbI_4$, $(C_{10}H_7CH_2NH_3)_2PbBr_4$, $(C_{10}H_7CH_2NH_3)_2PbCl_4$, $(C_6H_5C_2H_4NH_3)_2PbI_4$, $(C_6H_5C_2H_4NH_3)_2PbBr_4$ and $(C_6H_5C_2H_4NH_3)_2PbCl_4$, 2D perovskite materials with mixed halides, such as $(C_{10}H_7CH_2NH_3)_2PbI_{4-x}Cl_x$, $(C_{10}H_7CH_2NH_3)_2PbI_{4-x}Br_x$, $(C_{10}H_7CH_2NH_3)_2PbCl_{4-x}Br_x$, $(C_6H_5C_2H_4NH_3)_2PbI_{4-x}Cl_x$, $(C_6H_5C_2H_4NH_3)_2PbI_{4-x}Br_x$ and $(C_6H_5C_2H_4NH_3)_2PbCl_{4-x}Br_x$, where x is in the range of 0-4. Examples of perovskite light-emitting materials further include Quasi-2D perovskite materials, such as $(C_6H_5C_2H_4NH_3)_2(CH(NH_2)_2PbBr_3)_{n-1}$ $PbI_4$, $(C_6H_5C_2H_4NH_3)_2(CH(NH_2)_2PbBr_3)_{n-1}$ $PbBr_4$, $(C_6H_5C_2H_4NH_3)_2(CH(NH_2)_2PbBr_3)_{n-1}$ $PbCl_4$, $(C_{10}H_7CH_2NH_3)_2(CH_3NH_3PbI_2Br)_{n-1}$ $PbI_4$, $(C_{10}H_7CH_2NH_3)_2(CH_3NH_3PbI_2Br)_{n-1}$ $PbBr_4$ and $(C_{10}H_7CH_2NH_3)_2(CH_3NH_3PbI_2Br)_{n-1}$ $PbCl_4$, where n is the number of layers, and, optionally, n may be in the range of about 2-10. Examples of perovskite light-emitting materials further include Quasi-2D perovskite materials with mixed halides, such as $(C_6H_5C_2H_4NH_3)_2(CH(NH_2)_2PbBr_3)_{n-1}$ $PbI_{4-x}Cl_x$, $(C_6H_5C_2H_4NH_3)_2(CH(NH_2)_2PbBr_3)_{n-1}$ $PbI_{4-x}Br_x$, $(C_6H_5C_2H_4NH_3)_2(CH(NH_2)_2PbBr_3)_{n-1}$ $PbCl_{4-x}Br_x$, $(C_{10}H_7CH_2NH_3)_2(CH_3NH_3PbI_2Br)_{n-1}$ $PbI_{4-x}Cl_x$, $(C_{10}H_7CH_2NH_3)_2(CH_3NH_3PbI_2Br)_{n-1}$ $PbI_{4-x}Br_x$ and $(C_{10}H_7CH_2NH_3)_2(CH_3NH_3PbI_2Br)_{n-1}$ $PbCl_{4-x}Br_x$, where n is the number of layers, and, optionally, n may be in the range of about 2-10, and x is in the range of 0-4. Examples of perovskite light-emitting materials further include any of the aforementioned examples, where the divalent metal cation lead ($Pb^+$) may be replaced with tin ($Sn^+$), copper ($Cu^+$) or europium ($Eu^+$). Examples of perovskite light-emitting materials further include perovskite light-emitting nanocrystals with structures that closely resemble Quasi-2D perovskite materials.

Perovskite light emitting material may comprise organic metal halide perovskite material, such as methylammonium lead iodide ($CH_3NH_3PbI_3$), methylammonium lead bromide ($CH_3NH_3PbBr_3$), methylammonium lead chloride ($CH_3NH_3PbCl_3$), where the materials comprises an organic cation. Perovskite light emitting material may comprise inorganic metal halide perovskite material, such as caesium lead iodide ($CsPbI_3$), caesium lead bromide ($CsPbBr_3$) and caesium lead chloride ($CsPbCl_3$), where the material comprises an inorganic cation. Furthermore, perovskite light emitting material may comprise perovskite light emitting material where there is a combination of organic and inorganic cations. The choice of an organic or inorganic cation may be determined by several factors, including desired emission colour, efficiency of electroluminescence, stability of electroluminescence and ease of processing. Inorganic metal halide perovskite material may be particularly well-suited to perovskite light-emitting materials with a nanocrystal structure, such as those depicted in FIG. 5, wherein an inorganic cation may enable a compact and stable perovskite light-emitting nanocrystal structure.

Perovskite light emitting material may be included in the emissive layer 135 in a number of ways. For example, the emissive layer may comprise 2D perovskite light-emitting material, Quasi-2D perovskite light-emitting material or 3D perovskite light-emitting material, or a combination thereof. Optionally, the emissive layer may comprise perovskite light emitting nanocrystals. Optionally, the emissive layer 135 may comprise an ensemble of Quasi-2D perovskite light emitting materials, where the Quasi-2D perovskite light emitting materials in the ensemble may comprise a different number of layers. An ensemble of Quasi-2D perovskite light emitting materials may be preferred because there may be energy transfer from Quasi-2D perovskite light emitting materials with a smaller number of layers and a larger energy band gap to Quasi-2D perovskite light emitting materials with a larger number of layers and a lower energy band gap. This energy funnel may efficiently confine excitons in a PeLED device and may improve device performance. Optionally, the emissive layer 135 may comprise perovskite light emitting nanocrystal materials. Perovskite light emitting nanocrystal materials may be preferred because nanocrystal boundaries may be used to confine excitons in a PeLED device, and surface cations may be used to passivate the nanocrystal boundaries. This exciton confinement and surface passivation may improve device performance. Other emissive layer materials and structures may be used.

Devices fabricated in accordance with embodiments of the present invention may optionally comprise an electron transport layer 145. The electron transport layer 145 may include any material capable of transporting electrons. The electron transport layer 145 may be deposited by a solution process or by a vacuum deposition process. The electron transport layer 145 may be doped or undoped. Doping may be used to enhance conductivity.

Examples of undoped electron transport layers are tris(8-hydroxyquinolinato)aluminum ($Alq_3$), 2,2',2"-(1,3,5-Benzinetriyl)-tris(1-phenyl-1-H-benzimidazole) (TPBi), 2,9-Dimethyl-4,7-diphenyl-1,10-phenanthroline (BCP), zinc oxide (ZnO) and titanium dioxide ($TiO_3$). One example of a doped electron transport layer is 4,7-diphenyl-1,10-phenanthroline (BPhen) doped with lithium (Li) at a molar ratio of 1:1. One example of a solution-processed electron transport layer is [6,6]-Phenyl C61 butyric acid methyl ester (PCBM). Other electron transport layers and structures may be used.

Devices fabricated in accordance with embodiments of the present invention may optionally comprise a cathode 155. The cathode 155 may comprise any suitable material or combination of materials known to the art, such that the cathode 155 is capable of conducting electronics and injecting them into the layers of the device. Preferred cathode 155 materials include metal oxides, such as indium tin oxide (ITO), indium zinc oxide (IZO) and fluorine tin oxide (FTO), metals, such as calcium (Ca), barium (Ba), magnesium (Mg) and ytterbium (Yb) or a combination thereof. Other preferred cathode 155 materials include metals such as silver (Ag), aluminum (Al), aluminum-neodymium (Al:Nd), gold (Au) and alloys thereof, or a combination thereof. Compound cathodes comprising one or more cathode materials in a single layer may be preferred from some devices. One example of a compound cathode is Mg:Ag. Multilayer cathodes comprising one or more cathode materials in one or more layers may be preferred for some devices. One example of a multilayer cathode is Ba/Al. In a standard device architecture for OLEDs, QLEDs and PeLEDs, the cathode 155 may be sufficiently transparent to create a top-emitting device, where light is emitted from the top of the device. One example of a transparent cathode commonly used in a standard device architecture is a compound layer of Mg:Ag. By using a compound of Mg:Ag, the cathode may be transparent as well as partially reflective. When such a transparent and partially reflective cathode is used in combination with a reflective anode, such as ITO/Ag/ITO, where the Ag thickness is greater than approximately 80 nm, this may have the advantage of creating a microcavity within the device. The cathode 155 may be opaque and/or reflective. In a standard device architecture for OLEDs, QLEDs and PeLEDs, a reflective cathode 155 may be preferred for some bottom-emitting devices to increase the amount of light emitted through the substrate from the bottom of the device. One example of a reflective cathode commonly used in a standard device architecture is a multilayer cathode of LiF/Al. When such a reflective cathode is used in combination with a transparent and partially reflective anode, such as ITO/Ag/ITO, where the Ag thickness is less than approximately 25 nm, this may have the advantage of creating a microcavity within the device.

The material and thickness of the cathode 155 may be chosen to obtain desired conductive and optical properties. Where the cathode 155 is transparent, there may be a range of thicknesses for a particular material that is thick enough to provide the desired conductivity, yet thin enough to provide the desired degree of transparency. Other materials and structures may be used.

Devices fabricated in accordance with embodiments of the present invention may optionally comprise one or more blocking layers. Blocking layers may be used to reduce the number of charge carriers (electrons or holes) and/or excitons exiting the emissive layer. An electron blocking layer 130 may be disposed between the emissive layer 135 and the hole transport layer 125 to block electrons from leaving the emissive layer 135 in the direction of the hole transport layer 125. Similarly, a hole blocking layer 140 may be disposed between the emissive layer 135 and the electron transport layer 145 to block holes from leaving the emissive layer 135 in the direction of the electron transport layer 145. Blocking layers may also be used to block excitons from diffusing from the emissive layer. As used herein, and as would be understood by one skilled in the art, the term "blocking layer" means that the layer provides a barrier that significantly inhibits transport of charge carriers and/or excitons, without suggesting that the layer completely blocks the charge carriers and/or excitons. The presence of such a blocking layer in a device may result in substantially higher efficiencies as compared to a similar device lacking a blocking layer. A blocking layer may also be used to confine emission to a desired region of a device.

Devices fabricated in accordance with embodiments of the present invention may optionally comprise one or more injection layers. Generally, injection layers are comprised of one or more materials that may improve the injection of charge carriers from one layer, such as an electrode, into an adjacent layer. Injection layers may also perform a charge transport function.

In device 100, the hole injection layer 120 may be any layer that improves the injection of holes from the anode 115 into the hole transport layer 125. Examples of materials that may be used as a hole injection layer are Copper(II)phthalocyanine (CuPc) and 1,4,5,8,9,11-Hexaazatriphenylene-hexacarbonitrile (HATCN), which may be vapor deposited, and polymers, such as PEDOT:PSS, which may be deposited from solution. Another example of a material that may be used as a hole injection layer is molybdenum oxide ($MoO_3$).

A hole injection layer (HIL) 120 may comprise a charge carrying component having HOMO energy level that favourably matches, as defined by their herein-described relative IP energies, with the adjacent anode layer on one side of the HIL, and the hole transporting layer on the opposite side of the HIL. The "charge carrying component" is the material responsible for the HOMO energy level that actually transports the holes. This material may be the base material of the HIL, or it may be a dopant. Using a doped HIL allows the dopant to be selected for its electrical properties, and the host to be selected for morphological properties, such as ease of deposition, wetting, flexibility, toughness, and others. Preferred properties of the HIL material are such that holes can be efficiently injected from the anode into the HIL material. The charge carrying component of the HIL 120 preferably has an IP not more than about 0.5 eV greater than the IP of the anode material. Similar conditions apply to any layer into which holes are being injected. HIL materials are further distinguished from conventional hole transporting materials that are typically used in the hole transporting layer of an OLED, QLED or PeLED in that such HIL materials may have a hole conductivity that is substantially less than the hole conductivity of conventional hole transporting materials. The thickness of the HIL 120 of the present invention may be thick enough to planarize the anode and enable efficient hole injection, but thin enough not to hinder transportation of holes. For example, an HIL thickness of as little as 10 nm may be acceptable. However, for some devices, an HIL thickness of up to 50 nm may be preferred.

In device 100, the electron injection layer 150 may be any layer that improves the injection of electrons from the cathode 155 into the electron transport layer 145. Examples of materials that may be used as an electron injection layer are inorganic salts, such as lithium fluoride (LiF), sodium fluoride (NaF), barium fluoride (BaF), caesium fluoride (CsF), and caesium carbonate ($CsCO_3$). Other examples of materials that may be used as an electron injection layer are metal oxides, such as zinc oxide (ZnO) and titanium oxide ($TiO_2$), and metals, such as calcium (Ca), barium (Ba), magnesium (Mg) and ytterbium (Yb). Other materials or combinations of materials may be used for injection layers. Depending on the configuration of a particular device, injection layers may be disposed at locations different than those shown in device 100.

Devices fabricated in accordance with embodiments of the present invention may optionally comprise a barrier layer 160. One purpose of the barrier layer 160 is to protect device layers from damaging species in the environment, including moisture, vapour and/or gasses. Optionally, the barrier layer 160 may be deposited over, under or next to the substrate, electrode, or any other parts of the device, including an edge. Optionally, the barrier layer 160 may be a bulk material such as glass or metal, and the bulk material may be affixed over, under of next to the substrate, electrode, or any other parts of the device. Optionally, the barrier layer 160 may be deposited onto a film, and the film may be affixed over, under of next to the substrate, electrode, or any other parts of the device. Where the barrier layer 160 is deposited onto a film, preferred film materials comprise glass, plastics, such as polyethylene terephthalate (PET) and polyethylene naphthalate (PEN) and metal foils. Where the barrier layer 160 is a bulk material or deposited onto a film, preferred materials used to affix the film or bulk material to the device include thermal or UV-curable adhesives, hot-melt adhesives and pressure sensitive adhesives.

The barrier layer 160 may be a bulk material or formed by various known deposition techniques, including sputtering, vacuum thermal evaporation, electron-beam deposition and chemical vapour deposition (CVD) techniques, such as plasma-enhanced chemical vapour deposition (PECVD) and atomic layer deposition (ALD). The barrier layer 160 may include compositions having a single phase as well as compositions having multiple phases. Any suitable material or combination of materials may be used for the barrier layer 160. The barrier layer 160 may incorporate organic or inorganic compounds or both. Preferred inorganic barrier layer materials include aluminum oxides such as $Al_2O_3$, silicon oxides such as $SiO_2$, silicon nitrides such as $SiN_x$ and bulk materials such as glasses and metals. Preferred organic barrier layer materials include polymers. The barrier layer 160 may comprise a single layer or multiple layers. Multi-layer barriers comprising one or more barrier materials in one or more layers may be preferred for some devices. One preferred example of a multilayer barrier is a barrier comprising alternating layers of $SiN_x$ and a polymer, such as in the multilayer barrier $SiN_x$/polymer/$SiN_x$.

FIG. 6a shows a stacked light emitting device 600 having two emissive units. The light emitting device 600 may comprise one or more OLED, QLED or PeLED emissive units or a combination thereof. Device 600 may include a first electrode 610, a first emissive unit 620, a first charge generation layer 630, a second emissive unit 640, and a second electrode 650. The first electrode 610 may be directly connected to an external electrical source E1. The second electrode 650 may be directly connected to an external electrical source E2. The first charge generation layer 630 may be directly connected to an external electrical source E3. Device 600 may be fabricated by depositing the layers described in order.

FIG. 6b shows a stacked light emitting device 605 having two emissive units. The light emitting device 605 may comprise one or more OLED, QLED or PeLED emissive units or a combination thereof. Device 605 may include a first electrode 610, a first emissive unit 620, a first charge generation layer 630, a second emissive unit 640, and a second electrode 650. The first electrode 610 may be directly connected to an external electrical source E1. The second electrode 650 may be directly connected to an external electrical source E2. The first charge generation layer 630 may comprise an electrically insulating layer 660, depicted by the dashed line, and may be directly connected to two external electrical sources E3 and E4. Device 605 may be fabricated by depositing the layers described in order.

FIG. 8 depicts a layer structure for a stacked light emitting device 800 having two emissive units. The light emitting device 800 may comprise one or more OLED, QLED or PeLED emissive units or a combination thereof. Device 800 may include a substrate 805, an anode 810, a first hole injection layer 815, a first hole transport layer 820, a first emissive layer 825, a first hole blocking layer 830, a first electron transport layer 835, a first charge generation layer 840, a second hole injection layer 845, a second hole transport layer 850, a second emissive layer 855, a second hole blocking layer 860, a second electron transport layer 865, a first electron injection layer 870, and a cathode 875. The first emissive unit 880 may comprise the first hole injection layer 815, the first hole transport layer 820, the first emissive layer 825, the first hole blocking layer 830, and the first electron transport layer 835. The second emissive unit 885 may comprise the second hole injection layer 845, the second hole transport layer 850, the second emissive layer 855, the second hole blocking layer 860, the second electron transport layer 865, and the first electron injection layer 870. Device 800 may be fabricated by depositing the layers described in order.

FIG. 7a shows a stacked light emitting device 700 having three emissive units. The light emitting device 700 may comprise one or more OLED, QLED or PeLED emissive units or a combination thereof. Device 700 may include a first electrode 710, a first emissive unit 720, a first charge generation layer 730, a second emissive unit 740, a second charge generation layer 750, a third emissive unit 760, and a second electrode 770. The first electrode 710 may be directly connected to an external electrical source E1. The second electrode 770 may be directly connected to an external electrical source E2. The first charge generation layer 730 may be directly connected to an external electrical source E3. The second charge generation layer 750 may be connected to an external electrical source E4. Device 700 may be fabricated by depositing the layers described in order.

FIG. 7b shows a stacked light emitting device 705 having three emissive units. The light emitting device 705 may comprise one or more OLED, QLED or PeLED emissive units or a combination thereof. Device 705 may include a first electrode 710, a first emissive unit 720, a first charge generation layer 730, a second emissive unit 740, a second charge generation layer 750, a third emissive unit 760, and a second electrode 770. The first electrode 710 may be directly connected to an external electrical source E1. The second electrode 770 may be directly connected to an external electrical source E2. The first charge generation layer 730 may comprise an electrically insulating layer 780 depicted by the dashed line and may be directly connected to two external electrical sources E3 and E4. The second charge generation layer 750 may comprise an electrically insulating layer 790 depicted by the dashed line and may be directly connected to two external electrical sources E5 and E6. Device 705 may be fabricated by depositing the layers described in order.

FIG. 9 depicts a layer structure for a stacked light emitting device 900 having three emissive units. The light emitting device 900 may comprise one or more OLED, QLED or PeLED emissive units or a combination thereof. Device 900 may include a substrate 905, an anode 910, a first hole injection layer 915, a first hole transport layer 920, a first emissive layer 925, a first electron transport layer 930, a first charge generation layer 935, a second hole transport layer 940, a second emissive layer 945, a second electron transport layer 950, a second charge generation layer 955, a third hole transport layer 960, a third emissive layer 965, a third electron transport layer 970, a first electron injection layer 975, and a cathode 980. The first emissive unit 985 may comprise the first hole injection layer 915, the first hole transport layer 920, the first emissive layer 925, and the first electron transport layer 930. The second emissive unit 990 may comprise the second hole transport layer 940, the second emissive layer 945, and the second electron transport layer 950. The third emissive unit 995 may comprise the third hole transport layer 960, the third emissive layer 965, the third electron transport layer 970, and the first electron injection layer 975. Device 900 may be fabricated by depositing the layers described in order.

The simple layered structures illustrated in FIGS. 8 and 9 are provided by way of non-limiting examples, and it is understood that embodiments of the invention may be used in connection with a wide variety of other structures. The specific materials and structures described are exemplary in nature, and other materials and structures may be used. Functional light emitting devices may be achieved by combining the various layers described in different ways, or layers may be omitted entirely, based on factors such as performance, design and cost. Other layers, not specifically described, may also be included. Materials other than those specifically described may be used. Although many of the examples provided herein describe various layers as comprising a single material, it is understood that combinations of materials may be used. Also, the layers may have various sublayers. The names given to the various layers herein are not intended to be strictly limiting. For example, in a device, the electron transport layer may transport electrons into the emissive layer, and also block holes from exiting the emissive layer, and may be described as an electron transport layer or a hole blocking layer.

Stacked light emitting device architectures, as depicted in FIGS. 6, 7, 8 and 9, may provide one or more of the following advantages: (1) light from multiple emissive units may be combined within the same surface area of the device thereby increasing the brightness of the device; (2) multiple emissive units may be connected electrically in series with substantially the same current passing through each emissive unit thereby allowing the device to operate at increased brightness without substantial increase in current density thereby extending the operation lifetime of the device; and (3) the light emitted from separate emissive units may be separately controlled, thereby allowing the brightness and/or colour of the device to be tuned according to the exact needs of the application as demonstrated in the present invention.

Generally, the operational lifetime (LT) of an OLED, QLED or PeLED at luminance (L) may be expressed as $LT_2 = LT_1 \times (L_1/L_2)^{AF}$ where $LT_1$ is the measured lifetime of the device at (high) luminance $L_1$, $LT_2$ is the predicted lifetime at (low) luminance $L_2$ and AF is the acceleration factor. Approximate acceleration factors to convert measured lifetimes at higher luminance to predicted lifetimes at lower luminance have been determined to be in the approximate range of 1.5-2.0 for OLEDs, QLEDs and PeLEDs. For a stacked light emitting device comprising two emissive units, for the same total device luminance, each emissive unit may operate with luminance $L_2$ that is two times lower than the luminance $L_1$ required for an equivalent light emitting device with a single emissive unit. If an acceleration factor of 2.0 is assumed, then the expected operational lifetime for a stacked light emitting device with two emissive units is $2^2 = 4$ times longer than that of an equivalent light emitting device with a single emissive unit. Furthermore, for a stacked light emitting device comprising three emissive units, for the same total device luminance each emissive unit may operate with luminance $L_2$ that is three times lower than the luminance $L_1$ required for an equivalent light emitting device with a single emissive unit. If an acceleration factor of 2.0 is assumed, then the expected operational lifetime for a stacked light emitting device with three emissive units is $3^2 = 9$ times longer than that of an equivalent light emitting device with a single emissive unit.

Examples of stacked light emitting devices that include organic light emitting materials are described in U.S. Pat. No. 5,707,745 B1, Forrest et al., Fröbel et al. and Jung et al. All of these citations are included herein by reference in their entirety. U.S. Pat. No. 5,707,745 B1 describes a multicolour stacked organic light emitting device. Forrest et al. and Fröbel et al. describe stacked organic light emitting devices comprising red, green and blue emissive units that are independently addressable. Jung et al. describes a top emitting stacked organic light emitting device comprising three emissive units, where light from the three emissive units may be combined to generate emission of white light from the device.

Performance advantages of such stacked light emitting devices are well-understood. However, until now there has been no demonstration of a stacked OLED, QLED or PeLED device that comprises two or more independently addressable emissive units that emit light of the same hue but substantially different chromaticity. The novel device architecture presented herein is therefore different from and an improvement over the existing state-of-the-art.

In the present invention, two or more emissive units with the same hue but substantially different chromaticity may be independently addressed and may emit light independently of each other. The two or more emissive units may comprise a first emissive unit that emits a deeper red, green or blue light, and a second emissive unit that emits a lighter red, green or blue light or vice versa. For example, the first emissive unit may emit deeper red light and the second emissive unit may emit lighter red light or vice-versa, or the first emissive unit may emit deeper green light and the second emissive unit may emit lighter green light or vice-versa, or the first emissive unit may emit deeper blue light and the second emissive unit may emit lighter blue light or vice-versa.

The novel stacked light emitting device architecture presented herein may be incorporated into the red, green and/or blue sub-pixels of a display. When a sub-pixel of such a display is required to emit a relatively saturated red, green or blue light that is more saturated than light that may be emitted from the lighter red, green and blue emissive units, but less saturated than light that may be emitted from the deeper red, green and blue emissive units, the respective emissive units that emit deeper red, green or blue light may be individually addressed and may emit light to generate the display image while the respective emissive units that emit lighter red, green or blue light may remain inactive. However, when a sub-pixel of a display is only required to emit a relatively unsaturated red, green or blue light that is less saturated than light that may be emitted from the lighter red, green and blue emissive units, the respective emissive units that emit lighter red, green or blue light may be individually addressed and may emit light to generate the display image while the respective emissive units that emit deeper red, green or blue light may remain inactive. Light may be emitted from the relatively more efficient lighter red, green or blue emissive units to render the majority of display images, with light emitted from the relatively less efficient deeper red, green or blue emissive units only required to render a small proportion of images. The efficiency and/or lifetime of the display may therefore be enhanced. This performance advantage cannot be achieved by existing state-of-the-art stacked light emitting devices where independently addressable emissive units in a stacked light emitting device emit light of different hues or emit light of the same hue and substantially the same chromaticity.

Such a display comprising red, green and blue sub-pixels comprising one or more stacked light emitting devices with independently addressable emissive units having the same hue, but different chromaticity has several advantages over other display architectures. These advantages include reduced power consumption and extended operational lifetime.

US 2019/0043407 A1 discloses a pixel layout comprising red, green and blue sub-pixels and driving scheme for a display. The pixel layout comprises a blue sub-pixel that comprises a stacked blue light emitting device having two blue emissive units with different chromaticities that are independently addressable. However, the red and green sub-pixels are described in paragraph [0043] as being single junction devices, and in paragraph [0057] it is disclosed that red and green sub-pixels do not need to be adjusted. Such a pixel layout enables the emissive units of the blue sub-pixel to be selected depending on the image content to be rendered. However, the emissive units of the red and green sub-pixels may not be selected depending on the image content. This limits the power savings only to the blue sub-pixel, unlike the present invention, where power savings can be achieved in red, green and blue sub-pixels, resulting in far greater display efficiency and lifetime.

WO 2020/030042 A1 discloses an OLED display comprising at least a first blue emissive layer and one or more additional blue emissive layers disposed over the substrate of the display, with a quantum dot colour film disposed on the light-emitting side of the substrate. The blue emissive layers emit blue light of different chromaticity, with one emitting at 400-440 nm, and the other emitting at 440-490 nm. The quantum dot colour film may comprise red quantum dots for the red sub-pixel and green quantum dots for the green sub-pixel. The blue sub-pixel may or may not comprise quantum dots. However, in paragraphs [0044] and [0069] the blue emissive layers are disclosed as being connected in series by a charge generation layer, and the advantages of this are described. Unlike the present invention, the means that the emissive units may not be individually addressed and may not be selected depending on the image content. Furthermore, unlike the present invention, the disclosed OLED display comprises a quantum dot color film to convert blue light to red and green from the respective red and green sub-pixels. The disclosed OLED display architecture is therefore expected to be less efficient than the architecture disclosed in the present invention.

US 2014/0084269 A1 discloses a stacked OLED device comprising at least three emissive units, wherein at least one emissive unit is a phosphorescent emissive unit, and at least two emissive units are fluorescent emissive units. In one embodiment, the phosphorescent emissive unit emits red, green or yellow light. In one embodiment, the two fluorescent emissive units emit blue light. The blue light from the two emissive units may have the same or different chromaticity. However, in paragraph [0043] it is disclosed that "the stacked units are not independently controlled" and that "the same current (density) passed through each unit in the stack", so unlike the present invention, the emissive units may not be independently addressable, so emissive units may not be selected depending on the image content.

WO 2019/224546 A1 discloses a stacked light emitting device comprising at least one PeLED emissive unit and at least one PeLED, OLED or QLED emissive unit. This has the benefit of enabling different classes of emissive materials, such as OLED, QLED and PeLED to be combined in a stacked light emitting device. However, unlike the present invention, it does not include stacked light emitting devices comprising only OLED, only QLED or only PeLED emissive units, which would be simpler to manufacture. Furthermore, unlike the present invention, WO 2019/224546 A1 does not disclose any details how such a device architecture could be implemented in one or more sub-pixels of a display, nor does it explicitly disclose that the chromaticities of the emissive units may be different, only listing chromaticities in Table 1 for "exemplary single emissive unit OLED, QLED and PeLED devices".

EP 3188272 A1 discloses a stacked blue light emitting device comprising a first emissive unit and a second emissive unit separated by a charge generation layer. The first emissive unit comprises a first emissive layer that emits blue light, and the second emissive unit comprises a second emissive layer that emits blue light, wherein the first and second emissive layers emit light of different chromaticity. Also disclosed is an example with three emissive units comprising three emissive layers. Also disclosed is a display architecture, wherein there are colour conversion materials over the red and green sub-pixels. Unlike the present disclosure, the emissive units disclosed in EP 3188272 A1 in FIG. 7 and FIG. 8 are commonly addressable and the charge generation layer is common to all sub-pixels. There is no disclosure of independently addressable emissive units. Unlike the present disclosure, it is therefore impossible to select and independently address different emissive units and different emissive layers of different chromaticities to render an image depending on the image content. Furthermore, the disclosed OLED display comprises a quantum dot color film to convert blue light to red and green from the respective red and green sub-pixels, unlike the present invention where red and green light are emitted from red and green light emitting materials. For both of these reasons, the OLED display architecture disclosed in EP 3188272 A1 is expected to be less efficient than the architecture disclosed in the present invention.

US 2015/0155519 A1 discloses an OLED display comprising stacked OLEDs. The red sub-pixel comprises a stacked OLED with a first emissive unit comprising a first red emissive layer and a second emissive unit comprising a second red emissive layer. The green sub-pixel comprises a stacked OLED with a first emissive unit comprising a first green emissive layer and a second emissive unit comprising a second green emissive layer. The blue sub-pixel comprises a stacked OLED with a first emissive unit comprising a first blue emissive layer and a second emissive unit comprising a second blue emissive layer. In each sub-pixel, the first and second emissive units are separated by a charge generation layer. At least one of the first red, green or blue emissive layers emits light of a different chromaticity to at least one of the respective second red, green or blue emissive layers. However, unlike the present invention, the emissive units are commonly addressable as depicted in FIG. 3 and by the data in FIG. 8 for voltage and current efficiency, which as expected for commonly addressable emissive units connected in series by a charge generation layer, both being approximately double that of the single emissive unit comparative example provided in FIG. 8. There is no disclosure of independently addressable emissive units. Unlike the present disclosure, it is therefore impossible to select and independently address different emissive units and different emissive layers of different chromaticities to render an image depending on the image content.

EP 3188273 A1 discloses a stacked OLED device comprising two emissive units separated by a charge generation layer, wherein the first emissive unit emits light of a first hue and chromaticity, and the second emissive layer emits light of a second hue and chromaticity, wherein the first and second hues are the same, and the first and second chromaticities are different. The stacked OLED device may be red, green and blue. However, unlike the present invention, the emissive units are commonly addressable as depicted in FIG. 2. There is no disclosure of independently addressable emissive units.

Optionally, devices fabricated in accordance with embodiments of the present invention may comprise two emissive units. Optionally, devices fabricated in accordance with embodiments of the present invention may comprise three emissive units. Optionally, devices fabricated in accordance with embodiments of the present invention may comprise four or more emissive units.

Optionally, an emissive unit may comprise one emissive layer. Optionally, an emissive unit may comprise two emissive layers. Optionally, an emissive unit may further comprise one or more additional layers, such as a hole injection layer, a hole transport layer, an electron blocking layer, a hole blocking layer, an electron transport layer and/or an electron injection layer. Optionally, some of these additional layers may be included within an emissive unit, and some of these additional layers may be excluded.

Devices fabricated in accordance with embodiments of the present invention may optionally comprise one or more charge generation layers. Optionally, a charge generation layer may be used to separate two or more emissive units within a stacked light emitting device. Stacked light emitting devices 600 and 605, depicted in FIG. 6, comprise a first charge generation layer 630, which separates a first emissive unit 620 from a second emissive unit 640. Stacked light emitting devices 700 and 705, depicted in FIG. 7, comprise a first charge generation layer 730, which separates a first emissive unit 720 from a second emissive unit 740. Stacked light emitting devices 700 and 705, depicted in FIG. 7, further comprise a second charge generation layer 750, which separates a second emissive unit 740 from a third emissive unit 760.

A charge generation layer 630, 730 or 750 may comprise a single layer or multiple layers. Optionally, a charge generation layer 630, 730 or 750 may comprise an n-doped layer for the injection of electrons, and a p-doped layer for the injection of holes. Optionally, a charge generation layer 630, 730 or 750 may include a hole injection layer (HIL). Optionally, a p-doped layer of a charge generation layer 630, 730 or 750 may function as a hole injection layer (HIL). FIG. 9 depicts a stacked light emitting device 900 having three emissive units, where a first charge generation layer 935 includes a hole injection layer (not shown), and a second charge generation layer 955 includes a hole injection layer (not shown). Optionally, a charge generation layer 630, 730 or 750 may be positioned adjacent to and in contact with a separate hole injection layer. FIG. 8 depicts a stacked light emitting device 800 having two emissive units, where a first charge generation layer 840 is adjacent to and in contact with a second hole injection layer 845.

Optionally, a charge generation layer 630, 730 or 750 may include an electron injection layer (EIL). Optionally, an n-doped layer of a charge generation layer 630, 730 or 750 may function as an electron injection layer (EIL). FIG. 9 depicts a stacked light emitting device 900 having three emissive units, where a first charge generation layer 935 includes an electron injection layer (not shown), and a second charge generation layer 955 includes an electron injection layer (not shown). Optionally, a charge generation layer 630, 730 or 750 may be positioned adjacent to and in contact with a separate electron injection layer.

Optionally, a charge generation layer 630, 730 or 750 may include a layer for the conduction and/or injection of holes. Such a layer may be referred to as an anode 155 layer. Such an anode 155 layer may comprise any of the materials described herein for an anode. Optionally, a charge generation layer 630, 730 or 750 may include a layer for the conduction and/or injection of electrons. Such a layer may be referred to as a cathode 115 layer. Such a cathode 115 layer may comprise any of the materials described herein for a cathode.

A charge generation layer 630, 730 or 750 may be deposited by a solution process or by a vacuum deposition process. A charge generation layer 630, 730 or 750 may be composed of any applicable materials that enable injection of electrons and holes. A charge generation layer 630, 730 or 750 may be doped or undoped. Doping may be used to enhance conductivity.

One example of vapour process charge generation layer is a dual layer structure consisting of lithium doped BPhen (Li-BPhen) as the n-doped layer for electron injection, in combination with of 1,4,5,8,9,11-Hexaazatriphenylenehexacarbonitrile (HATCN) as the p-doped layer for hole injection. One example of a solution process charge generation layer is a dual layer structure consisting of polyethylenimine (PEI) surface modified zinc oxide (ZnO) as the n-doped layer for electron injection, in combination with molybdenum oxide ($MoO_3$) or tungsten trioxide ($WO_3$) as the p-doped layer for hole injection. Other materials or combinations of materials may be used for charge generation layers. Depending on the configuration of a particular device, charge generation layers may be disposed at locations different than those shown in device 800 and device 900.

Optionally, one or more charge generation layers within a stacked light emitting device may be directly connected to one or more external electrical sources. Optionally, one or more emissive units of a stacked light emitting may be independently addressable and may emit light independently of each other. Connecting one or more charge generation layers to one or more external electrical sources may be of advantage in that light emission from separate emissive units of a stacked light emitting device may be selected and separately controlled according to the needs of the application. In the present invention, connecting one or more charge generation layers to one or more external electrical sources may allow the chromaticity of light from a stacked light emitting device to be controlled without changing the hue of the light.

Optionally, a charge generation layer 630, 730 or 750 may be connected to a single external electrical source, as depicted by arrangements 600 in FIGS. 6*a* and 700 in FIG. 7*a*. Such an arrangement may be advantageous because it may reduce the number of device layers and electrical contacts required to independently address the emissive units and may therefore be simpler to manufacture.

Optionally, a charge generation layer 630, 730 or 750 may be connected to two external electrical sources, as depicted by arrangements 605 in FIGS. 6*b* and 705 in FIG. 7*b*. Such an arrangement may be advantageous because it may enable the emissive units to be more easily independently addressed.

Arrangement 605 in FIG. 6*a* depicts two external electrical contacts E3 and E4 to a first charge generation layer 630. The first charge generation layer 630 may comprise an electrically insulating layer 660 depicted by the dashed line that electrically isolates the lower and upper regions of the first charge generation layer 630. The lower region may be addressed by E3 and the upper region by E4. Arrangement 705 in FIG. 7*a* depicts two external electrical contacts E3 and E4 to a first charge generation layer 730, and two external electrical contacts E5 and E6 to a second charge generation layer 750. The first charge generation layer 730 may comprise an electrically insulating layer 780 depicted by the dashed line that electrically isolates the lower and upper regions of the first charge generation layer 730. The lower region may be addressed by E3 and the upper region by E4. The second charge generation layer 750 may comprise an electrically insulating layer 790 depicted by the dashed line that electrically isolates the lower and upper regions of the second charge generation layer 750. The lower region may be addressed by E5 and the upper region by E6.

Electrically insulating layers 660, 780 and 790 may comprise any materials that provide electrical insulation. Preferred materials include polymers, aluminum oxides such as $Al_2O_3$, silicon oxides such as $SiO_2$, silicon nitrides such as $SiN_x$ and bulk materials such as glasses. The electrically insulating layer 660, 780 and 790 may comprise a single layer or multiple layers.

Unless otherwise specified, any one of the layers of the various embodiments may be deposited by any suitable method. Methods include vacuum thermal evaporation, sputtering, electron beam physical vapour deposition, organic vapor phase deposition and organic vapour jet printing. Other suitable methods include spincoating and other solution-based processes. Substantially similar processes can be used to deposit materials used in OLED, QLED and PeLED devices, which facilitates the combination of these materials in a single device, such as a stacked light emitting device.

Devices fabricated in accordance with embodiments of the invention may be incorporated into a wide range of consumer products. Optionally, devices may be used in displays for televisions, computer monitors, tablets, laptop computers, smart phones, cell phones, digital cameras, video recorders, smartwatches, fitness trackers, personal digital assistants, vehicle displays and other electronic devices. Optionally, devices may be used for micro-displays or heads-up displays. Optionally, devices may be used in light panels for interior or exterior illumination and/or signaling, in smart packaging or in billboards.

Optionally, various control mechanisms may be used to control light emitting devices fabricated in accordance with the present invention, including passive matrix and active matrix address schemes.

The materials and structures described herein may have applications in devices other than light emitting devices. For example, other optoelectronic devices such as solar cells, photodetectors, transistors or lasers may employ the materials and structures.

The present invention relates to novel light emitting device architectures for application in devices, such as displays, light panels and other optoelectronic devices, and in particular to stacked light emitting devices that comprise two or more independently addressable emissive units that emit light having the same hue but substantially different chromaticity.

A device is provided. The device may be understood with reference to arrangements 600 and 605 in FIG. 6*a*. In one embodiment, the device comprises a first stacked light emitting device 600 comprising: a first electrode 610; a second electrode 650; a first emissive unit 620 comprising a first emissive layer (not shown); a second emissive unit 640 comprising a second emissive layer (not shown); and a first charge generation layer 630; wherein the first emissive unit 620, the second emissive unit 640 and the first charge generation layer 630 are all disposed between the first electrode 610 and the second electrode 650; the first emissive unit 620 is disposed over the first electrode 610; the first charge generation layer 630 is disposed over the first emissive unit 620; the second emissive unit 640 is disposed over the first charge generation layer 630; the second electrode 650 is disposed over the second emissive unit 640; the first emissive unit 620 and the second emissive unit 640 are independently addressable and may emit light independently of each other; the first emissive unit 620 emits light having a first hue classified as red, green or blue and a first chromaticity having first CIE 1931 (x, y) colour space chromaticity coordinates of (x1, y1); the second emissive unit 640 emits light having a second hue classified as red, green or blue and a second chromaticity having second CIE 1931 (x, y) colour space chromaticity coordinates of (x2, y2); the second hue is the same as the first hue; the second chromaticity is substantially different to the first chromaticity; and the first emissive layer and the second emissive layer comprise organic light emitting material, quantum dot light emitting material and/or perovskite light emitting material.

As used herein, "hue" refers to the degree to which light emitted by a light emitting material, emissive layer, emissive unit, region or device can be described as similar to or different from the hues of red, green and blue. Materials, layers, regions, units and devices may be described herein in reference to the hue of light they emit. As used herein, a "red" material, layer, region, unit or device, refers to one that emits light with a red hue that has an emission spectrum with a peak wavelength in the visible spectrum in the range of 580 nm to 780 nm; a "green" material, layer, region, unit or device, refers to one that emits light with a green hue that has an emission spectrum with a peak wavelength in the visible spectrum in the range of 500 nm to 580 nm; and a "blue" material, layer, region, unit or device, refers to one that emits light with a blue hue that has an emission spectrum with a peak wavelength in the visible spectrum in the range of 380 nm to 500 nm.

This nomenclature may differ slightly from that used by other sources. In particular, some other sources may refer to "yellow" materials, layers, units, regions or devices that emit light that may be described as similar to the hue of yellow. Such materials, layers, units, regions or devices that may be referred to as yellow by other sources, are herein considered to be either green or red, depending on the peak wavelength of the emission spectrum. For example, a material, layer, region, unit or device that emits light that has an emission spectrum with a peak wavelength in the visible spectrum in the range of 560 nm to 580 nm is herein considered to be green, whereas other sources may consider this to be yellow. For example, a material, layer, region, unit or device that emits light that has an emission spectrum with a peak wavelength in the visible spectrum in the range of 580 nm to 600 nm is herein considered to be red, whereas other sources may consider this to be yellow. The reason for this simplification is that standard displays comprise only red, green and blue sub-pixels. The nomenclature used herein is therefore consistent with standard displays.

As used herein, two or more materials, layers, units, regions or devices may be considered to have the same hue if the light they emit may be classified using the same hue or either red, green or blue. For example, if a first emissive unit emits red light and a second emissive unit emits red light then the first emissive unit and the second emissive unit may be considered to have the same hue. Likewise, if a first emissive unit emits green light and a second emissive unit emits green light then the first emissive unit and the second emissive unit may be considered to have the same hue. Likewise, if a first emissive unit emits blue light and a second emissive unit emits blue light then the first emissive unit and the second emissive unit may be considered to have the same hue.

As used herein, red, green and blue light emitted from materials, layers, units, regions or devices may be referred to herein as "deep" or "deeper" or "light" or "lighter", which refers to the relative saturation of the light. In one embodiment, as used herein, "deep-red" light may refer to red light with a peak wavelength in the visible spectrum in the range of 610 nm to 780 nm, and "light-red" light may refer to red light with a peak wavelength in the visible spectrum in the range of 580 nm to 610 nm. In one embodiment, as used herein, "deep-green" light may refer to green light with a peak wavelength in the visible spectrum in the range of 500 nm to 535 nm, and "light-green" light may refer to green light with a peak wavelength in the visible spectrum in the range of 535 nm to 580 nm. In one embodiment, as used herein, "deep-blue" light may refer to blue light with a peak wavelength in the visible spectrum in the range of 380 nm to 465 nm, and "light-blue" light may refer to blue light with a peak wavelength in the visible spectrum in the range of 465 nm to 500 nm. In one embodiment, as used herein, "deeper" red light refers to red light with relatively longer peak wavelength, and "lighter" red light refers to red light with relatively shorter peak wavelength. In one embodiment, as used herein, "deeper" green light refers to green light with relatively shorter peak wavelength, and "lighter" green light refers to green light with relatively longer peak wavelength (within the range of 500 nm to 580 nm). In one embodiment, as used herein, "deeper" blue light refers to blue light with relatively shorter peak wavelength, and "lighter" blue light refers to blue light with relatively longer peak wavelength.

Chromaticity refers to an objective specification of the quality of colour regardless of its luminance. As used herein, the "chromaticity" of light and may be visualized and quantified using the CIE 1931 (x, y) chromaticity diagram which depicts the CIE 1931 XYZ colour space. The chromaticity of light emitted from a material, layer, unit, region or device may be quantified by its CIE 1931 (x, y) coordinates on the CIE 1931 (x, y) chromaticity diagram.

As used herein, light emitted from materials, layers, units, regions or devices may be considered to have "substantially different" chromaticity if the light emitted is noticeably different to the average human eye. As used herein, light emitted from materials, layers, units, regions or devices may be considered to have "substantially the same" chromaticity if the light emitted is indistinguishable to the average human eye.

One suitable technique to quantify the chromaticity and difference of chromaticity of light is to use MacAdam ellipses. This may be visualized with reference to FIG. 13, which depicts MacAdam ellipses superimposed on the CIE 1931 (x, y) colour space chromaticity diagram. Within the CIE 1931 (x, y) colour space chromaticity diagram, a one-step MacAdam ellipse contains all chromaticity coordinates which are indistinguishable to the average human eye from the chromaticity coordinates at the center of the ellipse. That is to say to the average human eye any light with chromaticity coordinates outside of a 1-step ellipse is noticeably different in chromaticity from the chromaticity at the centre of the ellipse. Tolerance may be introduced by extending the ellipses. For example, a two-step MacAdam ellipse has axes that are two times as large as for a one-step ellipse, and a ten-step MacAdam ellipse has axes that are ten times as large as for a one-step ellipse. All the MacAdam ellipses depicted in FIG. 13 are ten-step MacAdam ellipses.

In one embodiment, the second chromaticity coordinates (x2, y2) measured for light emitted from the second emissive unit 640 are not contained within a one-step MacAdam ellipse that is centralized on the first chromaticity coordinates (x1, y1) measured for light emitted from the first emissive unit 620. In one embodiment, the second chromaticity coordinates (x2, y2) measured for light emitted from the second emissive unit 640 are not contained within a three-step MacAdam ellipse that is centralized on the first chromaticity coordinates (x1, y1) measured for light emitted from the first emissive unit 620.

One further suitable technique to characterize the difference in chromaticity of light emitted from materials, layers, units, regions or devices is to quantify the absolute difference in CIE 1976 (u', v') chromaticity coordinates. The CIE 1976 (u', v') color space is used in preference over the CIE 1931 (x, y) colour space because unlike the CIE 1931 (x, y) colour space, in the CIE 1976 (u', v') colour space, distance is approximately proportional to perceived difference in colour. The conversion between the colour spaces is simple: $u'=4x/(-2x+12y+3)$ and $v'=9y/(-2x+12y+3)$. Difference in chromaticity can be quantified as: $\Delta uv=v'(\Delta u'^2+\Delta v'^2)=v'((u1-u2)^2+(v1-v2)^2)$, which is the distance in the CIE 1976 (u', v') colour space of first chromaticity coordinates (u1, v1) from second chromaticity coordinates (u2, v2). As used herein, light emitted from a first material, region, unit or device with first chromaticity coordinates (u1, v1) may be considered to have a substantially different chromaticity to light emitted from a second material, region, unit or device with second chromaticity coordinates (u2, v2) if the difference in chromaticity as defined by $\Delta uv$ is 0.010 or more.

In one embodiment, the first CIE 1931 (x, y) colour space chromaticity coordinates (x1, y1) may be converted to first CIE 1976 (u', v') colour space chromaticity coordinates (u1, v1); and the second CIE 1931 (x, y) colour space chromaticity coordinates (x2, y2) may be converted to second CIE 1976 (u', v') colour space chromaticity coordinates (u2, v2); wherein the first chromaticity coordinates (u1, v1) of light emitted from the first emissive unit 620 and the second chromaticity coordinates (u2, v2) of light emitted from the second emissive unit 640 are sufficiently different such that the difference in chromaticity as defined by $\Delta uv$ is 0.010 or more.

One further suitable technique to characterize the difference in chromaticity of light emitted from materials, layers, units, regions or devices is to measure the emission spectrum and compare peak emission wavelength. In one embodiment, the first emissive unit 620 emits light having a peak wavelength in the visible spectrum that is defined as the first peak wavelength; the second emissive unit 640 emits light having a peak wavelength in the visible spectrum that is defined as the second peak wavelength; wherein the second peak wavelength is at least 4 nm greater than or at least 4 nm less than the first peak wavelength.

The proposed novel device architecture is ideally suited to OLED, QLED and PeLED displays. One or more advantages of including organic light emitting material, quantum dot light emitting material and/or perovskite light emitting material in the first emissive layer of the first emissive unit and in the second emissive layer of the second emissive unit of a stacked light emitting device may be demonstrated using the data shown in Table 1 and FIG. 12. The data in Table 1 and FIG. 12 may also be used to demonstrate one or more advantages of combining emissive layers comprising different types of light emitting material in a stacked light emitting device.

TABLE 1

| | | Red | | Green | | Blue | |
|---|---|---|---|---|---|---|---|
| CIE 1931 (x, y) colour coordinates for exemplary single emissive unit OLEDs, QLEDs and PeLEDs and for a Commercial OLED display. Also included are colour coordinates for DCI-P3 and Rec. 2020 colour gamut standards. | | | | | | | |
| | | CIE x | CIE y | CIE x | CIE y | CIE x | CIE y |
| DCI-P3 | | 0.680 | 0.320 | 0.265 | 0.690 | 0.150 | 0.060 |
| Rec. 2020 | | 0.708 | 0.292 | 0.170 | 0.797 | 0.131 | 0.046 |
| Commercial OLED | | 0.680 | 0.320 | 0.265 | 0.690 | 0.150 | 0.060 |
| Light | OLED | 0.620 | 0.370 | 0.392 | 0.587 | 0.140 | 0.290 |
| Deep | OLED | 0.709 | 0.290 | 0.180 | 0.740 | 0.146 | 0.045 |
| | QLED | 0.712 | 0.288 | 0.210 | 0.700 | 0.147 | 0.068 |
| | PeLED | 0.720 | 0.280 | 0.100 | 0.810 | 0.166 | 0.079 |

Table 1 shows CIE 1931 (x, y) colour coordinates for single emissive unit red, green and blue OLED, QLED and PeLED devices. Also included in Table 1 are CIE 1931 (x, y) colour coordinates for DCI-P3 and Rec. 2020 colour gamut standards and for a commercial OLED display. Generally, for red light a higher CIE x value corresponds to deeper emission, for green light a higher CIE y value corresponds to deeper emission, and for blue light a lower CIE y value corresponds to deeper emission. This can be understood with reference FIG. 12, which depicts data from Table 1 for light OLEDs (squares), deep OLEDs (pentagons), deep QLEDs (triangles) and deep PeLEDs (circles) as well as data for a commercial OLED display (stars) and the primary colours of the DCI-P3 colour gamut in FIG. 12a and for the Rec. 2020 colour gamut in FIG. 12b.

The CIE 1931 (x, y) colour coordinate data reported for single emissive unit OLED, QLED and PeLED devices in Table 1 are exemplary. Commercial OLED data are taken from the Apple iPhone X, which fully supports the DCI-P3 colour gamut. This data set is available from Raymond Soneira at DisplayMate Technologies Corporation (Soneira et al.). The other data are taken from a selection of peer-reviewed scientific journals: Light-red OLED data are taken from Jang et al. Light-green OLED data are taken from Tong et al. Light-blue OLED data are taken from Zanoni et al. Deep-red OLED data are taken from Hosoumi et al. Deep-green OLED data are taken from Fukagawa et al. Deep-blue OLED data are taken from Takita et al. Deep-red QLED data are taken from Kathirgamanathan et al. (2). Deep-green QLED data are taken from Steckel et al. Deep-blue QLED data are taken from Wang et al. (2) Deep-red PeLED data are taken from Wang et al. Deep-green PeLED data are taken from Hirose et al. Deep-blue PeLED data are taken from Kumar et al. Data from these sources are used by way of example, and should be considered non-limiting. Data from other peer-reviewed scientific journals, simulated data and/or experimental data collected from laboratory devices may also be used to demonstrate the aforementioned advantages of the claimed device architecture.

The presented chromaticity data can be further understood with reference to emission spectra. FIG. 14 depicts exemplary normalized electroluminescence emission spectra for the single emissive unit red, green and blue OLEDs summarized in Table 1. The spectra depicted using dashed lines correspond to spectra for OLEDs that emit light-red, light-green and light-blue light with respective emission peaks at 606 nm, 537 nm and 470 nm. The spectra depicted using solid lines correspond to spectra for OLEDs that emit deep-red, deep-green and deep-blue light with respective emission peaks at 642 nm, 521 nm and 451 nm. Note that the shapes of the emission spectra have been simplified to bell curves for ease of understanding. OLEDs are used by way of example in FIG. 14, but the same principles may also be applied to QLEDs and PeLEDs.

Emission spectra with peaks located closer to the peak of the photopic luminous efficiency function at 555 nm generally have greater overlap with the photopic luminous efficiency function. FIG. 14 shows that the light-red, light-green and light-blue emission spectra have greater overlap with the photopic luminous efficiency function than the respective deep-red, deep-green and deep-blue emission spectra. This means that fewer photos are required for the same perceived brightness for light-red, light-green and light-blue light than for deep-red, deep-green and deep-blue light. Emissive units that emit light-red, light-green and light-blue light may therefore have greater luminous efficiency than emissive units that emit deep-red, deep-green and deep-blue light. The stacked light emitting device of the present invention comprising lighter and deeper emissive units of the same hue but substantially different chromaticity may therefore enable devices such as displays to operate with improved efficiency. This is because the more efficient lighter red, green and blue emissive units may be used to render the majority of images, with the less efficient deeper red, green and blue emissive units used only to render a minority of images where extended colour gamut is required. The energy savings are substantial because the majority of images rendered by a display in day-to-day use do not require extended colour gamut.

To demonstrate such a stacked light emitting device, the two or more emissive units are required to be independently addressable so they may emit light independently of each other. In one embodiment, the first emissive unit and the second emissive are independently addressable and may emit light independently of each other. As depicted in FIG. 6 and FIG. 7, this may be achieved if one or more charge generation layers are directly connected to one or more external electrical sources.

In one embodiment, as depicted in arrangement 600 in FIG. 6*a*, the first electrode 610 is directly connected to an external electrical source E1, the second electrode 650 is directly connected to an external electrical source E2, and the first charge generation layer 630 is directly connected to an external electrical source E3. The first emissive unit may be independently addressed putting E1 on a positive potential with respect to E3 for a standard device architecture, or by putting E1 on a negative potential with respect to E3 for an inverted device architecture. The second emissive unit may be independently addressed putting E3 on a positive potential with respect to E2 for a standard device architecture, or by putting E3 on a negative potential with respect to E2 for an inverted device architecture.

In one embodiment, as depicted in arrangement 605 in FIG. 6*b*, the first electrode 610 is directly connected to an external electrical source E1, the second electrode 650 is directly connected to an external electrical source E2, and the first charge generation layer 630, which is separated into upper and lower regions by an electrically insulating layer 660, is directly connected to two external electrical source E3 and E4. The first emissive unit may be independently addressed putting E1 on a positive potential with respect to E3 for a standard device architecture, or by putting E1 on a negative potential with respect to E3 for an inverted device architecture. The second emissive unit may be independently addressed putting E4 on a positive potential with respect to E2 for a standard device architecture, or by putting E4 on a negative potential with respect to E2 for an inverted device architecture.

In one embodiment, as depicted in arrangement 700 in FIG. 7*a*, the first electrode 710 is directly connected to an external electrical source E1, the second electrode 770 is directly connected to an external electrical source E2, the first charge generation layer 730 is directly connected to an external electrical source E3, and the second charge generation layer 750 is directly connected to an external electrical source E4. The first emissive unit may be independently addressed by putting E1 on a positive potential with respect to E3 for a standard device architecture, or by putting E1 on a negative potential with respect to E3 for an inverted device architecture. The second emissive unit may be independently addressed putting E3 on a positive potential with respect to E4 for a standard device architecture, or by putting E3 on a negative potential with respect to E4 for an inverted device architecture. The third emissive unit may be independently addressed putting E4 on a positive potential with respect to E2 for a standard device architecture, or by putting E4 on a negative potential with respect to E2 for an inverted device architecture.

In one embodiment, as depicted in arrangement 705 in FIG. 7*b*, the first electrode 710 is directly connected to an external electrical source E1, the second electrode 770 is directly connected to an external electrical source E2, the first charge generation layer 730, which is separated into upper and lower regions by an electrically insulating layer 780, is directly connected to two external electrical sources E3 and E4, and the second charge generation layer 750, which is separated into upper and lower regions by an electrically insulating layer 790, is directly connected to two external electrical sources E5 and E6. The first emissive unit may be independently addressed by putting E1 on a positive potential with respect to E3 for a standard device architecture, or by putting E1 on a negative potential with respect to E3 for an inverted device architecture. The second emissive unit may be independently addressed putting E4 on a positive potential with respect to E5 for a standard device architecture, or by putting E4 on a negative potential with respect to E5 for an inverted device architecture. The third emissive unit may be independently addressed putting E6 on a positive potential with respect to E2 for a standard device architecture, or by putting E6 on a negative potential with respect to E2 for an inverted device architecture.

In one embodiment, the device comprises a stacked light emitting device comprising at least two emissive units. FIG. 15 depicts various configurations of emissive units for a stacked light emitting device having two emissive units. In each configuration, the stacked light emitting device comprises a first electrode 610, a first emissive unit 620 comprising a first emissive layer (not shown), a first charge generation layer 630, a second emissive unit 640 comprising a second emissive layer (not shown) and a second electrode 650. The first emissive unit 620, the first charge generation layer 630 and the second emissive unit 640 are all disposed between the first electrode 610 and the second electrode 650. The first emissive unit 620 is disposed over the first electrode 610. The first charge generation layer 630 is disposed over the first emissive unit 620. The second emissive unit 640 is disposed over the first charge generation layer 630. The second electrode 650 is disposed over the second emissive unit 640. In each configuration, the first emissive layer and the second emissive layer each comprise organic light emitting material, quantum dot light emitting material and/or perovskite light emitting material.

For simplicity, in FIG. 15 an emissive unit comprising an emissive layer comprising light emitting material that emits red light is labelled "RED", an emissive unit comprising an emissive layer comprising light emitting material that emits green light is labelled "GREEN" and an emissive unit comprising an emissive layer comprising light emitting material that emits blue light is labelled "BLUE". The red, green and blue emissive units may be further classified as "deeper" or "lighter" as defined herein.

In one embodiment, the first emissive unit 620 may emit red light and the second emissive unit 640 may emit red light. In one embodiment, the first emissive unit 620 and the second emissive unit 640 may both emit red light with peak wavelength in the visible spectrum in the range of 580 nm to 780 nm. In one embodiment, as depicted by device 1510 in FIG. 15*a*, the first emissive unit 620 may emit lighter red light and the second emissive unit 640 may emit deeper red light. In one embodiment, as depicted by device 1520 in FIG. 15*b*, the first emissive unit 620 may emit deeper red light and the second emissive unit 640 may emit lighter red light.

In one embodiment, the first emissive unit 620 emits red light with a peak wavelength in the visible spectrum in the range of 610 nm to 780 nm; and the second emissive unit 640 emits red light with a peak wavelength in the visible spectrum in the range of 580 nm to 610 nm. In one embodiment, the first emissive unit 620 emits red light with a CIE 1931 x coordinate of 0.660 or more; and the second emissive unit 640 emits red light with a CIE 1931 x coordinate of less than 0.660. In one embodiment, the second emissive unit 640 emits red light with a peak wavelength in the visible spectrum in the range of 610 nm to 780 nm; and the first emissive unit 620 emits red light with a peak wavelength in the visible spectrum in the range of 580 nm to 610 nm. In one embodiment, the second emissive unit 640 emits red light with a CIE 1931 x coordinate of 0.660 or more; and the first emissive unit 620 emits red light with a CIE 1931 x coordinate of less than 0.660. Such exemplary embodiments may be realized using any suitable combination of light emitting materials from the light-red OLED, deep-red OLED, deep-red QLED and/or deep-red PeLED devices described in Table 1.

In one embodiment, the first emissive unit 620 may emit green light and the second emissive unit 640 may emit green light. In one embodiment, the first emissive unit 620 and the second emissive unit 640 may both emit green light with peak wavelength in the visible spectrum in the range of 500 nm to 580 nm. In one embodiment, as depicted by device 1530 in FIG. 15*c*, the first emissive unit 620 may emit lighter green light and the second emissive unit 640 may emit deeper green light. In one embodiment, as depicted by device 1540 in FIG. 15*d*, the first emissive unit 620 may emit deeper green light and the second emissive unit 640 may emit lighter green light.

In one embodiment, the first emissive unit 620 emits green light with a peak wavelength in the visible spectrum in the range of 500 nm to 535 nm; and the second emissive unit 640 emits green light with a peak wavelength in the visible spectrum in the range of 535 nm to 580 nm. In one embodiment, the first emissive unit 620 emits green light with a CIE 1931 y coordinate of 0.670 or more; and the second emissive unit 640 emits green light with a CIE 1931 y coordinate of less than 0.670. In one embodiment, the second emissive unit 640 emits green light with a peak wavelength in the visible spectrum in the range of 500 nm to 535 nm; and the first emissive unit 620 emits green light with a peak wavelength in the visible spectrum in the range of 535 nm to 580 nm. In one embodiment, the second emissive unit 640 emits green light with a CIE 1931 y coordinate of 0.670 or more; and the first emissive unit 620 emits green light with a CIE 1931 y coordinate of less than 0.670. Such exemplary embodiments may be realized using any suitable combination of light emitting materials from the light-green OLED, deep-green OLED, deep-green QLED and/or deep-green PeLED devices described in Table 1.

In one embodiment, the first emissive unit 620 may emit blue light and the second emissive unit 640 may emit blue light. In one embodiment, the first emissive unit 620 and the second emissive unit 640 may both emit blue light with peak wavelength in the visible spectrum in the range of 380 nm to 500 nm. In one embodiment, as depicted by device 1550 in FIG. 15*e*, the first emissive unit 620 may emit lighter blue light and the second emissive unit 640 may emit deeper blue light. In one embodiment, as depicted by device 1560 in FIG. 15*f*, the first emissive unit 620 may emit deeper blue light and the second emissive unit 640 may emit lighter blue light.

In one embodiment, the first emissive unit 620 emits blue light with a peak wavelength in the visible spectrum in the range of 380 nm to 465 nm; and the second emissive unit 640 emits blue light with a peak wavelength in the visible spectrum in the range of 465 nm to 500 nm. In one embodiment, the first emissive unit 620 emits blue light with a CIE 1931 y coordinate of 0.080 or less; and the second emissive unit 640 emits blue light with a CIE 1931 y coordinate of more than 0.080. In one embodiment, the second emissive unit 640 emits blue light with a peak wavelength in the visible spectrum in the range of 380 nm to 465 nm; and the first emissive unit 620 emits blue light with a peak wavelength in the visible spectrum in the range of 465 nm to 500 nm. In one embodiment, the second emissive unit 640 emits blue light with a CIE 1931 y coordinate of 0.080 or less; and the first emissive unit 620 emits blue light with a CIE 1931 y coordinate of more than 0.080. Such exemplary embodiments may be realized using the light-blue OLED and deep-blue OLED devices described in Table 1. Such exemplary embodiments may be realized using any suitable combination of light emitting materials from the light-blue OLED, deep-blue OLED, deep-blue QLED and/or deep-blue PeLED devices described in Table 1.

In one embodiment, the first emissive unit 620 and the second emissive unit 640 are independently addressable and may emit light independently of each other.

In one embodiment, the first emissive unit 620 emits light having a first hue classified as red, green or blue, and a first chromaticity having first CIE 1931 (x, y) colour space chromaticity coordinates of (x1, y1); and the second emissive unit 640 emits light having a second hue classified as red, green or blue, and a second chromaticity having second CIE 1931 (x, y) colour space chromaticity coordinates of (x2, y2). In one embodiment, the second hue of the second emissive unit 640 is the same as the first hue of the first emissive unit 620 and the second chromaticity of the second emissive unit 640 is substantially different to the first chromaticity of the first emissive unit 620. In one embodiment, the second chromaticity coordinates (x2, y2) are not contained within a one-step MacAdam ellipse that is centralized on the first chromaticity coordinates (x1, y1). In one embodiment, the second chromaticity coordinates (x2, y2) are not contained within a three-step MacAdam ellipse that is centralized on the first chromaticity coordinates (x1, y1).

In one embodiment, the first emissive unit 620 emits light having a peak wavelength in the visible spectrum that is defined as the first peak wavelength, and the second emissive unit 640 emits light having a peak wavelength in the visible spectrum that is defined as the second peak wavelength, wherein the second peak wavelength is at least 4 nm greater than or at least 4 nm less than the first peak wavelength.

In one embodiment, the first CIE 1931 (x, y) colour space chromaticity coordinates (x1, y1) may be converted to first CIE 1976 (u', v') colour space chromaticity coordinates (u1, v1); and the second CIE 1931 (x, y) colour space chromaticity coordinates (x2, y2) may be converted to second CIE 1976 (u', v') colour space chromaticity coordinates (u2, v2); wherein the first chromaticity coordinates (u1, v1) of light emitted from the first emissive unit 620 and the second chromaticity coordinates (u2, v2) of light emitted from the second emissive unit 640 are sufficiently different such that the difference in chromaticity as defined by Δuv is 0.010 or more.

Inherent properties of organic light emitting materials, quantum dot light emitting materials and perovskite light emitting materials render them well-suited to the herein disclosed stacked light emitting device architecture. These properties include optical band gaps that are readily tunable across the visible, ultra-violet and infra-red spectra, high colour saturation that enables displays with wide colour gamut, excellent charge transport properties and low non-radiative rates.

In one preferred embodiment, the first emissive layer and the second emissive layer comprise organic light emitting material. In one embodiment, the first emissive layer and the second emissive layer comprise quantum dot light emitting material. In one embodiment, the first emissive layer and the second emissive layer comprise perovskite light emitting material.

In one embodiment, the first emissive layer comprises a first class of light emitting material that is either organic light emitting material, quantum dot light emitting material or perovskite light emitting material; and the second emissive layer comprises a second class of light emitting material that is either organic light emitting material, quantum dot light emitting material or perovskite light emitting material; wherein the second class of light emitting material is not the same as the first class of light emitting material. In one preferred embodiment, the first emissive layer comprises organic light emitting material and the second emissive layer comprises quantum dot light emitting material or perovskite light emitting material.

In one embodiment, by combining a first emissive unit 620 comprising organic light emitting material with a second emissive unit 640 comprising organic light emitting material, a stacked light emitting device that may render a primary colour of the DCI-P3 or Rec. 2020 colour gamut may be demonstrated. In one embodiment, by combining a first emissive unit 620 comprising organic light emitting material with a second emissive unit 640 comprising quantum dot light emitting materials or perovskite light emitting material, a stacked light emitting device that may render a primary colour of the DCI-P3 or Rec. 2020 colour gamut may be demonstrated. Such devices may be of advantage in that when implemented in one or more sub-pixels of a display, the display may render a broader range of colours experienced in everyday life, thereby improving functionality and user experience. Such a device may be of further advantage in that it may provide the display with further advantages such as improved efficiency, higher brightness, improved operational lifetime, lower voltage and/or reduced cost.

In one embodiment, the first emissive unit 620 comprises one and not more than one emissive layer, and the second emissive unit 640 comprises one and not more than one emissive layer. In one embodiment, the first emissive layer comprises one and not more than one light emitting material, and the second emissive layer comprises one and not more than one light emitting material. In one embodiment, the device comprises two and not more than two emissive units. Such light emitting devices may be advantageous in that they may enable emission of highly saturated light. Such light emitting devices may also be of advantage in that they may simplify the production process.

In one embodiment, the device further comprises a third emissive unit comprising a third emissive layer and a second charge generation layer. In one embodiment, the device comprises a stacked light emitting device comprising three or more emissive units. FIG. 7 depicts an exemplary stacked light emitting device having three emissive units. The stacked light emitting device comprises a first electrode 710, a first emissive unit 720 comprising a first emissive layer (not shown), a first charge generation layer 730, a second emissive unit 740 comprising a second emissive layer (not shown), a second charge generation layer 750, a third emissive unit 760 comprising a third emissive layer (not shown), and a second electrode 770. The first emissive unit 720, the first charge generation layer 730, the second emissive unit 740, the second charge generation layer 750 and the third emissive unit 760 are all disposed between the first electrode 710 and the second electrode 770. The first emissive unit 720 is disposed over the first electrode 710. The first charge generation layer 730 is disposed over the first emissive unit 720. The second emissive unit 740 is disposed over the first charge generation layer 730. The second charge generation layer 750 is disposed over the second emissive unit 740. The third emissive unit 760 is disposed over the second charge generation layer 750. The second electrode 770 is disposed over the third emissive unit 760. The first emissive unit 720 emits light having a first hue classified as red, green or blue and a first chromaticity having first CIE 1931 (x, y) colour space chromaticity coordinates of (x1, y1). The second emissive unit 740 emits light having a second hue classified as red, green or blue and a second chromaticity having second CIE 1931 (x, y) colour space chromaticity coordinates of (x2, y2). The third emissive unit 760 emits light having a third hue classified as red, green or blue and a third chromaticity having third CIE 1931 (x, y) colour space chromaticity coordinates of (x3, y3). The first emissive unit 720, the second emissive unit 740 and the third emissive unit 760 all emit light having the same hue. The first emissive layer, the second emissive layer and the third emissive layer each comprise organic light emitting material, quantum dot light emitting material and/or perovskite light emitting material.

FIG. 16 depicts various configurations of emissive units for a stacked light emitting device having three emissive units. For simplicity, in FIG. 16 an emissive unit comprising an emissive layer comprising light emitting material that emits red light is labelled "RED", an emissive unit comprising an emissive layer comprising light emitting material that emits green light is labelled "GREEN" and an emissive unit comprising an emissive layer comprising light emitting material that emits blue light is labelled "BLUE". The red, green and blue emissive units may be further classified as "deeper" or "lighter" as defined herein.

In one embodiment, the first emissive unit 720 may emit red light, the second emissive unit 740 may emit red light and the third emissive unit 760 may emit red light. In one embodiment, the first emissive unit 720, the second emissive unit 740 and the third emissive unit 760 may all emit red light with peak wavelength in the visible spectrum in the range of 580 nm to 780 nm. In one embodiment, as depicted by device 1610 in FIG. 16a, the first emissive unit 720 may emit lighter red light, the second emissive unit 740 may emit deeper red light and the third emissive unit 760 may emit deeper red light. In one embodiment, as depicted by device 1620 in FIG. 16b, the first emissive unit 720 may emit deeper red light, the second emissive unit 740 may emit deeper red light and the third emissive unit 760 may emit lighter red light. Other combinations of lighter red and deeper red emissive units are also envisaged.

In one embodiment, the first emissive unit 720 emits red light with a peak wavelength in the visible spectrum in the range of 580 nm to 610 nm, the second emissive unit 740 emits red light with a peak wavelength in the visible spectrum in the range of 610 nm to 780 nm, and the third emissive unit 760 emits red light with a peak wavelength in the visible spectrum in the range of 610 nm to 780 nm. In one embodiment, the first emissive unit 720 emits red light with a CIE 1931 x coordinate of less than 0.660, the second emissive unit 740 emits red light with a CIE 1931 x coordinate of 0.660 or more, and the third emissive unit 760 emits red light with a CIE 1931 x coordinate of 0.660 or more. In one embodiment, the first emissive unit 720 emits red light with a peak wavelength in the visible spectrum in the range of 610 nm to 780 nm, the second emissive unit 740 emits red light with a peak wavelength in the visible spectrum in the range of 610 nm to 780 nm, and the third emissive unit 760 emits red light with a peak wavelength in the visible spectrum in the range of 580 nm to 610 nm. In one embodiment, the first emissive unit 720 emits red light with a CIE 1931 x coordinate of 0.660 or more, the second emissive unit 740 emits red light with a CIE 1931 x coordinate of 0.660 or more, and the third emissive unit 760 emits red light with a CIE 1931 x coordinate of less than 0.660.

Such exemplary embodiments may be realized using any suitable combination of light emitting materials from the light-red OLED, deep-red OLED, deep-red QLED and/or deep-red PeLED devices described in Table 1.

In one embodiment, the first emissive unit 720 may emit green light, the second emissive unit 740 may emit green light and the third emissive unit 760 may emit green light. In one embodiment, the first emissive unit 720, the second emissive unit 740 and the third emissive unit 760 may all emit green light with peak wavelength in the visible spectrum in the range of 500 nm to 580 nm. In one embodiment, as depicted by device 1630 in FIG. 16c, the first emissive unit 720 may emit lighter green light, the second emissive unit 740 may emit deeper green light and the third emissive unit 760 may emit deeper green light. In one embodiment, as depicted by device 1640 in FIG. 16d, the first emissive unit 720 may emit deeper green light, the second emissive unit 740 may emit deeper green light and the third emissive unit 760 may emit lighter green light. Other combinations of lighter green and deeper green emissive units are also envisaged.

In one embodiment, the first emissive unit 720 emits green light with a peak wavelength in the visible spectrum in the range of 535 nm to 580 nm, the second emissive unit 740 emits green light with a peak wavelength in the visible spectrum in the range of 500 nm to 535 nm, and the third emissive unit 760 emits green light with a peak wavelength in the visible spectrum in the range of 500 nm to 535 nm. In one embodiment, the first emissive unit 720 emits green light with a CIE 1931 y coordinate of less than 0.670, the second emissive unit 740 emits green light with a CIE 1931 y coordinate of 0.670 or more, and the third emissive unit 760 emits green light with a CIE 1931 y coordinate of 0.670 or more. In one embodiment, the first emissive unit 720 emits green light with a peak wavelength in the visible spectrum in the range of 500 nm to 535 nm, the second emissive unit 740 emits green light with a peak wavelength in the visible spectrum in the range of 500 nm to 535 nm, and the third emissive unit 760 emits green light with a peak wavelength in the visible spectrum in the range of 535 nm to 580 nm. In one embodiment, the first emissive unit 720 emits green light with a CIE 1931 y coordinate of 0.670 or more, the second emissive unit 740 emits green light with a CIE 1931 y coordinate of 0.670 or more, and the third emissive unit 760 emits green light with a CIE 1931 y coordinate of less than 0.670.

Such exemplary embodiments may be realized using any suitable combination of light emitting materials from the light-green OLED, deep-green OLED, deep-green QLED and/or deep-green PeLED devices described in Table 1.

In one embodiment, the first emissive unit 720 may emit blue light, the second emissive unit 740 may emit blue light and the third emissive unit 760 may emit blue light. In one embodiment, the first emissive unit 720, the second emissive unit 740 and the third emissive unit 760 may all emit blue light with peak wavelength in the visible spectrum in the range of 380 nm to 500 nm. In one embodiment, as depicted by device 1650 in FIG. 16e, the first emissive unit 720 may emit lighter blue light, the second emissive unit 740 may emit deeper blue light and the third emissive unit 760 may emit deeper blue light. In one embodiment, as depicted by device 1660 in FIG. 16f, the first emissive unit 720 may emit deeper blue light, the second emissive unit 740 may emit deeper blue light and the third emissive unit 760 may emit lighter blue light. Other combinations of lighter blue and deeper blue emissive units are also envisaged.

In one embodiment, the first emissive unit 720 emits blue light with a peak wavelength in the visible spectrum in the range of 465 nm to 500 nm, the second emissive unit 740 emits blue light with a peak wavelength in the visible spectrum in the range of 380 nm to 465 nm, and the third emissive unit 760 emits blue light with a peak wavelength in the visible spectrum in the range of 380 nm to 465 nm. In one embodiment, the first emissive unit 720 emits blue light with a CIE 1931 y coordinate of more than 0.080, the second emissive unit 740 emits blue light with a CIE 1931 y coordinate of 0.080 or less, and the third emissive unit 760 emits blue light with a CIE 1931 y coordinate of 0.080 or less. In one embodiment, the first emissive unit 720 emits blue light with a peak wavelength in the visible spectrum in the range of 380 nm to 465 nm, the second emissive unit 740 emits blue light with a peak wavelength in the visible spectrum in the range of 380 nm to 465 nm, and the third emissive unit 760 emits blue light with a peak wavelength in the visible spectrum in the range of 465 nm to 500 nm. In one embodiment, the first emissive unit 720 emits blue light with a CIE 1931 y coordinate of 0.080 or less, the second emissive unit 740 emits blue light with a CIE 1931 y coordinate of 0.080 or less, and the third emissive unit 760 emits blue light with a CIE 1931 y coordinate of more than 0.080.

Such exemplary embodiments may be realized using any suitable combination of light emitting materials from the light-blue OLED, deep-blue OLED, deep-blue QLED and/or deep-blue PeLED devices described in Table 1.

In one embodiment, the third chromaticity is substantially the same as one of the first chromaticity and the second chromaticity; and the third chromaticity is substantially different to one of the first chromaticity and the second chromaticity.

In one embodiment, the third emissive unit 760 is commonly addressed with one of the first emissive unit 720 and the second emissive unit 740 and may not emit light independently of one of the first emissive unit 720 and the second emissive unit 740; and the third emissive unit 760 is addressed independently of one of the first emissive unit 720 and the second emissive unit 740 and may emit light independently of one of the first emissive unit 720 and the second emissive unit 740. In one embodiment, the third emissive unit 760 is commonly addressed with one of the first emissive unit 720 and the second emissive unit 740 and may not emit light independently of one of the first emissive unit 720 and the second emissive unit 740; the third emissive unit 760 is addressed independently of one of the first emissive unit 720 and the second emissive unit 740 and may emit light independently of one of the first emissive unit 720 and the second emissive unit 740; wherein the emissive unit which is commonly addressed with the third emissive unit 760 has substantially the same chromaticity as the third emissive unit 760; and the emissive unit which is addressed independently of the third emissive unit 760 has substantially different chromaticity to the third emissive unit 760.

In one embodiment, at least one emissive unit may be independently addressable and may emit light independently of the other emissive units. In one embodiment, lighter red, lighter green and lighter blue emissive units may emit light independently of deeper red, deeper green and deeper blue emissive units. For example, in device 1610 in FIG. 16a, the lighter red first emissive unit 720 may emit light independently of the deeper red second emissive unit 740 and the deeper red third emissive unit 760. For example, in device 1640 in FIG. 16d, the lighter green third emissive unit 760 may emit light independently of the deeper green first emissive unit 720 and the deeper green second emissive unit 740. For example, in device 1650 in FIG. 16e, the deeper blue second emissive unit 740 and the deeper blue third emissive unit 760 may emit light independently of the lighter blue first emissive unit 720.

Such a device comprising three or more emissive units within a stacked light emitting device architecture may be of advantage in that light from more emissive units may be combined within the same surface area of the device thereby increasing the brightness of the device; and multiple emissive units may be connected electrically in series with substantially the same current passing through each emissive unit thereby allowing the device to operate at increased brightness without substantial increase in current density thereby extending the operation lifetime of the device.

In one embodiment, the stacked light emitting device may include a microcavity structure. Optionally, as described herein, a microcavity structure may be created where a transparent and partially reflective electrode is used in combination with an opposing reflective electrode. Optionally, in a standard device architecture, a bottom-emission microcavity structure may be created using a transparent and partially reflective multilayer anode such as ITO/Ag/ITO, where the Ag thickness is less than approximately 25 nm, in combination with a reflective multilayer cathode such as LiF/Al. In this architecture, light emission is through the anode. Optionally, in a standard device architecture, a top-emission microcavity structure may be created using a transparent and partially reflective compound cathode such as Mg:Ag in combination with a reflective multilayer anode such as ITO/Ag/ITO, where the Ag thickness is greater than approximately 80 nm. In this architecture, light emission is through the cathode.

Such a device may be of advantage in that such a microcavity structure may increase the total amount of light emitted from the device, thereby increasing the efficiency and brightness of the device. Such a device may further be of advantage in that such a microcavity structure may increase the proportion of light emitted in the forward direction from the device, thereby increasing the apparent brightness of the device to a user positioned at normal incidence. Such a device may further be of advantage in that such a microcavity structure may narrow the spectrum of emitted light from the device, thereby increasing the colour saturation of the emitted light. Application of such a microcavity structure to the device may thereby enable the device to render a primary colour of the DCI-P3 colour gamut. Application of such a microcavity structure to the device may thereby enable the device to render a primary colour of the Rec. 2020 colour gamut.

In one embodiment, the device is part of a display. In one embodiment, the device may be included in a sub-pixel of a display. Optionally, the display may be incorporated into a wide range of consumer products. Optionally, the display may be used in televisions, computer monitors, tablets, laptop computers, smart phones, cell phones, digital cameras, video recorders, smartwatches, fitness trackers, personal digital assistants, vehicle displays and other electronic devices. Optionally, the display may be used for microdisplays or heads-up displays. Optionally, the display may be used in light sources for interior or exterior illumination and/or signaling, in smart packaging or in billboards.

FIG. 17 depicts exemplary designs of sub-pixels. Included in FIG. 17 is an arrangement 1700 of three adjacent sub-pixels, each of length L and width W. The first sub-pixel 1710 may comprise a red sub-pixel, wherein such a red sub-pixel may comprise a stacked light emitting device such as depicted in FIG. 6 or FIG. 7 that emits red light. Such a stacked light emitting device may comprise a lighter red emissive unit and a deeper red emissive unit. The second sub-pixel 1720 may comprise a green sub-pixel, wherein such a green sub-pixel may comprise a stacked light emitting device such as depicted in FIG. 6 or FIG. 7 that emits green light. Such a stacked light emitting device may comprise a lighter green emissive unit and a deeper green emissive unit. The third sub-pixel 1730 may comprise a blue sub-pixel, wherein such a blue sub-pixel may comprise a stacked light emitting device such as depicted in FIG. 6 or FIG. 7 that emits blue light. Such a stacked light emitting device may comprise a lighter blue emissive unit and a deeper blue emissive unit. A typical pixel arrangement of a commercial display may comprise a sub-pixel arrangement such as 1700.

A display is provided. In one embodiment, the display comprises sub-pixels that may be arranged as depicted in arrangement 1700 in FIG. 17. The display may be further understood with reference to arrangements 600 and 605 in FIG. 6 and arrangement 1800 depicted in FIG. 18.

In one embodiment the display comprises: a first sub-pixel 1710 configured to emit red light having a peak wavelength in the visible spectrum in the range of 580 nm to 780 nm; a second sub-pixel 1720 configured to emit green light having a peak wavelength in the visible spectrum in the range of 500 nm to 580 nm; and a third sub-pixel 1730 configured to emit blue light having a peak wavelength in the visible spectrum in the range of 380 nm to 500 nm.

In one embodiment, at least one of the first sub-pixel 1710, the second sub-pixel 1720 and the third sub-pixel 1730 comprises a stacked light emitting device as described in the present invention. In one embodiment, at least one of the first sub-pixel 1710, the second sub-pixel 1720 and the third sub-pixel 1730 comprises a stacked light emitting device as depicted by arrangements 600 and 605 in FIG. 6. That is to say at least one of the first sub-pixel 1710, the second sub-pixel 1720 and the third sub-pixel 1730 comprises a stacked light emitting device comprising a first electrode 610; a second electrode 650; a first emissive unit 620 comprising a first emissive layer (not shown); a second emissive unit 640 comprising a second emissive layer (not shown); and a first charge generation layer 630; wherein the first emissive unit 620, the second emissive unit 640 and the first charge generation layer 630 are all disposed between the first electrode 610 and the second electrode 650; the first emissive unit 620 is disposed over the first electrode 610; the first charge generation layer 630 is disposed over the first emissive unit 620; the second emissive unit 640 is disposed over the first charge generation layer 630; the second electrode 650 is disposed over the second emissive unit 640; the first emissive unit 620 and the second emissive unit 640 are independently addressable and may emit light independently of each other; the first emissive unit 620 emits light having a first hue classified as red, green or blue and a first chromaticity having first CIE 1931 (x, y) colour space chromaticity coordinates of (x1, y1); the second emissive unit 640 emits light having a second hue classified as red, green or blue and a second chromaticity having second CIE 1931 (x, y) colour space chromaticity coordinates of (x2, y2); the second hue is the same as the first hue; the second chromaticity is substantially different to the first chromaticity; and the first emissive layer and the second emissive layer comprise organic light emitting material, quantum dot light emitting material and/or perovskite light emitting material.

In one embodiment, for the at least one of the first sub-pixel 1710, the second sub-pixel 1720 and the third sub-pixel 1730 (that comprises a stacked light emitting device as described in the present invention), the second chromaticity coordinates (x2, y2) are not contained within a one-step MacAdam ellipse that is centralized on the first chromaticity coordinates (x1, y1). In one embodiment, for the at least one of the first sub-pixel 1710, the second sub-pixel 1720 and the third sub-pixel 1730 (that comprises a stacked light emitting device as described in the present invention), the second chromaticity coordinates (x2, y2) are not contained within a three-step MacAdam ellipse that is centralized on the first chromaticity coordinates (x1, y1).

In one embodiment, for the at least one of the first sub-pixel 1710, the second sub-pixel 1720 and the third sub-pixel 1730 (that comprises a stacked light emitting device as described in the present invention), the first emissive unit 620 emits light having a peak wavelength in the visible spectrum that is defined as the first peak wavelength; the second emissive unit 640 emits light having a peak wavelength in the visible spectrum that is defined as the second peak wavelength; wherein the second peak wavelength is at least 4 nm greater than or at least 4 nm less than the first peak wavelength.

In one embodiment, for the at least one of the first sub-pixel 1710, the second sub-pixel 1720 and the third sub-pixel 1730 (that comprises a stacked light emitting device as described in the present invention), the first CIE 1931 (x, y) colour space chromaticity coordinates (x1, y1) may be converted to first CIE 1976 (u', v') colour space chromaticity coordinates (u1, v1); and the second CIE 1931

(x, y) colour space chromaticity coordinates (x2, y2) may be converted to second CIE 1976 (u', v') colour space chromaticity coordinates (u2, v2); wherein the first chromaticity coordinates (u1, v1) of light emitted from the first emissive layer and the second chromaticity coordinates (u2, v2) of light emitted from the second emissive layer are sufficiently different such that the difference in chromaticity as defined by Δuv is 0.010 or more.

In one embodiment, all of the first sub-pixel 1710, the second sub-pixel 1720 and the third sub-pixel 1730 comprise a stacked light emitting device as described in the present invention. In one embodiment, all of the first sub-pixel 1710, the second sub-pixel 1720 and the third sub-pixel 1730 comprise a stacked light emitting device as depicted by arrangements 600 and 605 in FIG. 6. That is to say all of the first sub-pixel 1710, the second sub-pixel 1720 and the third sub-pixel 1730 comprises a stacked light emitting device comprising a first electrode 610; a second electrode 650; a first emissive unit 620 comprising a first emissive layer (not shown); a second emissive unit 640 comprising a second emissive layer (not shown); and a first charge generation layer 630; wherein the first emissive unit 620, the second emissive unit 640 and the first charge generation layer 630 are all disposed between the first electrode 610 and the second electrode 650; the first emissive unit 620 is disposed over the first electrode 610; the first charge generation layer 630 is disposed over the first emissive unit 620; the second emissive unit 640 is disposed over the first charge generation layer 630; the second electrode 650 is disposed over the second emissive unit 640; the first emissive unit 620 and the second emissive unit 640 are independently addressable and may emit light independently of each other; the first emissive unit 620 emits light having a first hue classified as red, green or blue and a first chromaticity having first CIE 1931 (x, y) colour space chromaticity coordinates of (x1, y1); the second emissive unit 640 emits light having a second hue classified as red, green or blue and a second chromaticity having second CIE 1931 (x, y) colour space chromaticity coordinates of (x2, y2); the second hue is the same as the first hue; the second chromaticity is substantially different to the first chromaticity; and the first emissive layer and the second emissive layer comprise organic light emitting material, quantum dot light emitting material and/or perovskite light emitting material.

In one embodiment, for all of the first sub-pixel 1710, the second sub-pixel 1720 and the third sub-pixel 1730, the second chromaticity coordinates (x2, y2) are not contained within a one-step MacAdam ellipse that is centralized on the first chromaticity coordinates (x1, y1). In one embodiment, for all of the first sub-pixel 1710, the second sub-pixel 1720 and the third sub-pixel 1730, the second chromaticity coordinates (x2, y2) are not contained within a three-step MacAdam ellipse that is centralized on the first chromaticity coordinates (x1, y1).

In one embodiment, for all of the first sub-pixel 1710, the second sub-pixel 1720 and the third sub-pixel 1730, the first emissive unit 620 emits light having a peak wavelength in the visible spectrum that is defined as the first peak wavelength; the second emissive unit 640 emits light having a peak wavelength in the visible spectrum that is defined as the second peak wavelength; wherein the second peak wavelength is at least 4 nm greater than or at least 4 nm less than the first peak wavelength.

In one embodiment, for all of the first sub-pixel 1710, the second sub-pixel 1720 and the third sub-pixel 1730, the first CIE 1931 (x, y) colour space chromaticity coordinates (x1, y1) may be converted to first CIE 1976 (u', v') colour space chromaticity coordinates (u1, v1); and the second CIE 1931 (x, y) colour space chromaticity coordinates (x2, y2) may be converted to second CIE 1976 (u', v') colour space chromaticity coordinates (u2, v2); wherein the first chromaticity coordinates (u1, v1) of light emitted from the first emissive layer and the second chromaticity coordinates (u2, v2) of light emitted from the second emissive layer are sufficiently different such that the difference in chromaticity as defined by Δuv is 0.010 or more.

The display may be further understood with reference to arrangement 1700 in FIG. 17 and arrangement 1800 in FIG. 18. In one embodiment, the first sub-pixel 1710 comprises a first stacked light emitting device 1870 comprising a first electrode 610, a second electrode 650, a first red emissive unit 1810, a second red emissive unit 1820 and a first charge generation layer 630 all disposed as depicted by arrangement 1800 in FIG. 18 on a substrate 110; the second sub-pixel 1720 comprises a second stacked light emitting device 1880 comprising a first electrode 610, a second electrode 650, a first green emissive unit 1830, a second green emissive unit 1840 and a first charge generation layer 630 all disposed as depicted by arrangement 1800 in FIG. 18 on a substrate 110; and the third sub-pixel 1730 comprises a third stacked light emitting device 1890 comprising a first electrode 610, a second electrode 650, a first blue emissive unit 1850, a second blue emissive unit 1860 and a first charge generation layer 630 all disposed as depicted by arrangement 1800 in FIG. 18 on a substrate 110. In one embodiment, the first red emissive unit 1810 emits red light having first CIE 1931 (x, y) chromaticity coordinates (x1r, y1r) and the second red emissive unit 1820 emits red light having second CIE 1931 (x, y) chromaticity coordinates (x2r, x2r), wherein the second chromaticity coordinates (x2r, y2r) are not contained within a one-step MacAdam ellipse that is centralized on the first chromaticity coordinates (x1r, y1r). In one embodiment, the first green emissive unit 1830 emits green light having first CIE 1931 (x, y) chromaticity coordinates (x1g, y1g) and the second green emissive unit 1840 emits green light having second CIE 1931 (x, y) chromaticity coordinates (x2g, x2g), wherein the second chromaticity coordinates (x2g, y2g) are not contained within a one-step MacAdam ellipse that is centralized on the first chromaticity coordinates (x1g, y1g). In one embodiment, the first blue emissive unit 1850 emits blue light having first CIE 1931 (x, y) chromaticity coordinates (x1b, y1b) and the second blue emissive unit 1860 emits blue light having second CIE 1931 (x, y) chromaticity coordinates (x2b, x2b), wherein the second chromaticity coordinates (x2b, y2b) are not contained within a one-step MacAdam ellipse that is centralized on the first chromaticity coordinates (x1b, y1b).

In one embodiment, the first red emissive unit 1810 emits red light having first CIE 1931 (x, y) chromaticity coordinates (x1r, y1r) and the second red emissive unit 1820 emits red light having second CIE 1931 (x, y) chromaticity coordinates (x2r, x2r), wherein the second chromaticity coordinates (x2r, y2r) are not contained within a three-step MacAdam ellipse that is centralized on the first chromaticity coordinates (x1r, y1r). In one embodiment, the first green emissive unit 1830 emits green light having first CIE 1931 (x, y) chromaticity coordinates (x1g, y1g) and the second green emissive unit 1840 emits green light having second CIE 1931 (x, y) chromaticity coordinates (x2g, x2g), wherein the second chromaticity coordinates (x2g, y2g) are not contained within a three-step MacAdam ellipse that is centralized on the first chromaticity coordinates (x1g, y1g). In one embodiment, the first blue emissive unit 1850 emits blue light having first CIE 1931 (x, y) chromaticity coordinates (x1b, y1b) and the second blue emissive unit 1860 emits blue light having second CIE 1931 (x, y) chromaticity coordinates (x2b, x2b), wherein the second chromaticity coordinates (x2b, y2b) are not contained within a three-step MacAdam ellipse that is centralized on the first chromaticity coordinates (x1b, y1b).

In one embodiment, the first red emissive unit 1810 emits red light having a peak wavelength in the visible spectrum that is defined as the first peak wavelength and the second red emissive unit 1820 emits red light having a peak wavelength in the visible spectrum that is defined as the second peak wavelength, wherein the second peak wavelength is at least 4 nm greater than or at least 4 nm less than the first peak wavelength. In one embodiment, the first green emissive unit 1830 emits green light having a peak wavelength in the visible spectrum that is defined as the first peak wavelength and the second green emissive unit 1840 emits green light having a peak wavelength in the visible spectrum that is defined as the second peak wavelength, wherein the second peak wavelength is at least 4 nm greater than or at least 4 nm less than the first peak wavelength. In one embodiment, the first blue emissive unit 1850 emits blue light having a peak wavelength in the visible spectrum that is defined as the first peak wavelength and the second blue emissive unit 1860 emits blue light having a peak wavelength in the visible spectrum that is defined as the second peak wavelength, wherein the second peak wavelength is at least 4 nm greater than or at least 4 nm less than the first peak wavelength.

In one embodiment, the first red emissive unit 1810 emits red light having first CIE 1976 (u', v') chromaticity coordinates (u1r, v1r) and the second red emissive unit 1820 emits red light having second CIE 1976 (u', v') chromaticity coordinates (u2r, v2r), wherein the first chromaticity coordinates and the second chromaticity coordinates are sufficiently different such that the difference in chromaticity between (u1r, v1r) and (u2r, v2r) as defined by Δuv is 0.010 or more. In one embodiment, the first green emissive unit 1830 emits green light having first CIE 1976 (u', v') chromaticity coordinates (u1g, v1g) and the second green emissive unit 1840 emits green light having second CIE 1976 (u', v') chromaticity coordinates (u2g, v2g), wherein the first chromaticity coordinates and the second chromaticity coordinates are sufficiently different such that the difference in chromaticity between (u1g, v1g) and (u2g, v2g) as defined by Δuv is 0.010 or more. In one embodiment, the first blue emissive unit 1850 emits blue light having first CIE 1976 (u', v') chromaticity coordinates (u1b, v1b) and the second blue emissive unit 1860 emits blue light having second CIE 1976 (u', v') chromaticity coordinates (u2b, v2b), wherein the first chromaticity coordinates and the second chromaticity coordinates are sufficiently different such that the difference in chromaticity between (u1b, v1b) and (u2b, v2b) as defined by Δuv is 0.010 or more.

In one embodiment, the first red emissive unit 1810 emits red light with a peak wavelength in the visible spectrum in the range of 580 nm to 780 nm and the second red emissive unit 1820 emits red light with a peak wavelength in the visible spectrum in the range of 580 nm to 780 nm; the first green emissive unit 1830 emits green light with a peak wavelength in the visible spectrum in the range of 500 nm to 580 nm and the second green emissive unit 1840 emits green light with a peak wavelength in the visible spectrum in the range of 500 nm to 580 nm; and the blue first emissive unit 1850 emits blue light with a peak wavelength in the visible spectrum in the range of 380 nm to 500 nm and the second blue emissive unit 1860 emits blue light with a peak wavelength in the visible spectrum in the range of 380 nm to 500 nm.

In one embodiment, the first red emissive unit 1810 emits red light with a peak wavelength in the visible spectrum in the range of 610 nm to 780 nm and the second red emissive unit 1820 emits red light with a peak wavelength in the visible spectrum in the range of 580 nm to 610 nm or vice versa; the first green emissive unit 1830 emits green light with a peak wavelength in the visible spectrum in the range of 500 nm to 535 nm and the second green emissive unit 1840 emits green light with a peak wavelength in the visible spectrum in the range of 535 nm to 580 nm or vice-versa; and the first blue emissive unit 1850 emits blue light with a peak wavelength in the visible spectrum in the range of 380 nm to 465 nm and the second blue emissive unit 1860 emits blue light with a peak wavelength in the visible spectrum in the range of 465 nm to 500 nm or vice-versa.

In one embodiment, the first red emissive unit 1810 emits red light with a CIE 1931 x coordinate of 0.660 or more and the second red emissive unit 1820 emits red light with a CIE 1931 x coordinate of less than 0.660 or vice-versa; the first green emissive unit 1830 emits green light with a CIE 1931 y coordinate of 0.670 or more and the second emissive unit 1840 emits green light with a CIE 1931 y coordinate of less than 0.670 or vice-versa; and the first blue emissive unit 1850 emits blue light with a CIE 1931 y coordinate of 0.080 or less and the second blue emissive unit 1860 emits blue light with a CIE 1931 y coordinate of more than 0.080 or vice-versa.

In one embodiment, the first sub-pixel 1710 comprises a first stacked light emitting device 1870 comprising a first emissive unit 1810 and a second emissive unit 1820, wherein the first emissive unit 1810 emits deeper red light, and the second emissive unit 1820 emits lighter red light, or vice-versa; the second sub-pixel 1720 comprises a second stacked light emitting device 1880 comprising a first emissive unit 1830 and a second emissive unit 1840, wherein the first emissive unit 1830 emits deeper green light, and the second emissive unit 1840 emits lighter green light, or vice-versa; and the third sub-pixel 1730 comprises a third stacked light emitting device 1890 comprising a first emissive unit 1850 and a second emissive unit 1860, wherein the first emissive unit 1850 emits deeper blue light, and the second emissive unit 1860 emits lighter blue light, or vice-versa.

In one embodiment, the emissive units that emit deeper red, green and blue light may together render the DCI-P3 colour gamut; and the emissive units that emit lighter red, green and blue light may together only render a colour gamut that is substantially narrower than the DCI-P3 colour gamut. In such a display architecture, as demonstrated by power consumption computation disclosed herein, substantial reduction in power consumption can be achieved relative to standard display architectures that render DCI-P3.

In one embodiment, the emissive units that emit deeper red, green and blue light may together render the Rec. 2020 colour gamut; and the emissive units than emit lighter red, green and blue light may together only render a colour gamut that is substantially narrower than the Rec. 2020 colour gamut. In such a display architecture, substantial reduction in power consumption can be achieved relative to standard display architectures that render Rec. 2020. This enables the colour gamut of a display to be expanded without substantial increase in the power consumption of the display.

In one embodiment, the charge generation layer 630 is independently addressable. This enables the first emissive units 1810, 1830 and 1850 and the second emissive units 1820, 1840 and 1860 to be independently selected and addressed depending on the image content to reduce power consumption.

In one embodiment, the charge generation layer 630 is addressed by one electrical contact that enables the first emissive units 1810, 1830 and 1850 and the second emissive units 1820, 1840 and 1860 to be independently addressed. This is depicted for exemplary device 600 in FIG. 6*a*, where the charge generation layer 630 is addressed by electrical contact E3. The electrical contact E3 may be used to address the first emissive unit 620 and the second emissive unit 640. This architecture is simple and minimizes the number of layers in the device, which is beneficial for manufacturing.

In one embodiment, the charge generation layer 630 is addressed by two electrical contacts that enables the first emissive units 1810, 1830 and 1850 and the second emissive units 1820, 1840 and 1860 to be independently addressed. This is depicted for exemplary device 605 in FIG. 6*b*, where the charge generation layer 630 is addressed by electrical contacts E3 and E4. The charge generation layer 630 comprises an electrically insulating layer 660, which separates it into upper and lower regions. The electrical contact E3 may be used to address the first emissive unit 620. The electrical contact E4 may be used to address the second emissive unit 640. This architecture may be beneficial because it may enable the first emissive unit 620 and the second emissive unit 640 to be more easily selected and independently addressed.

When implemented in a display, stacked light emitting devices comprising two or more independently addressable emissive units of the same hue but substantially different chromaticity as disclosed herein are expected to enable the display to operate with improved efficiency and extended lifetime compared to a display comprising single emissive unit devices that render the same colour gamut. This can be demonstrated by modelling the power consumption of a display when rendering a set of typical display images.

An example of such modelling is described in U.S. Pat. No. 9,559,151 B2, which discloses a device that may be used as a multi-colour pixel, wherein the device comprises a first OLED, a second OLED, a third OLED and a fourth OLED. The device may be a pixel of a display having four sub-pixels, wherein the first sub-pixel comprises an OLED that may emit red light, the second sub-pixel comprises an OLED that may emit green light, the third sub-pixel comprises an OLED then may emit light-blue light, and the fourth sub-pixel comprises an OLED that may emit deep-blue light. Note that the present invention is a significant improvement over U.S. Pat. No. 9,559,151 B2 because energy savings and lifetime enhancement can be achieved without the need for an additional fourth sub-pixel in the display that reduces aperture ratio, efficiency and lifetime, and adds complexity and cost. Furthermore, the present invention is compatible with the use of different types of light emitting materials, including organic light emitting material, quantum dot light emitting materials and perovskite light emitting materials.

Power consumption of a display comprising the disclosed device architecture can further be computed using linear additive display models and typical image colour distributions. For a display comprising a first sub-pixel comprising deeper red and lighter red emissive units that are independently addressable, a second sub-pixel comprising deeper green and lighter green emissive units that are independently addressable, and a third sub-pixel comprising deeper blue and lighter blue emissive units that are independently addressable, the use of the lighter red, green and blue emissive units with greater overlap with the photopic curve and therefore higher efficiency may be used to render the majority of display images that require relatively less saturated pixel colours. The deeper red, green and blue emissive units with less overlap with the photopic curve and therefore lower efficiency are used as needed to render images that require relatively more saturated colours.

TABLE 2

Efficacy (cd/A) and CIE 1931 (x, y) colour coordinates for exemplary deeper and lighter red, green and blue emissive units.

| Sub-Pixel | Lighter Emissive Units | | Deeper Emissive Units | |
|---|---|---|---|---|
| | Efficacy (cd/A) | CIE 1931 (x, y) | Efficacy (cd/A) | CIE 1931 (x, y) |
| Red | 90 | (0.640, 0.330) | 60 | (0.680, 0.320) |
| Green | 200 | (0.300, 0.600) | 160 | (0.265, 0.690) |
| Blue | 40 | (0.150, 0.150) | 12 | (0.150, 0.060) |

For such a display, power consumption and power savings are dependent on the displayed imaged content, and on the chromaticities of the deeper and lighter red, green and blue emissive units. Table 2 lists the luminous efficacy (cd/A) and CIE 1931 (x, y) chromaticity coordinates for deeper and lighter red, green and blue emissive units. The chromaticities of the deeper red, green and blue emissive units are the same as the DCI-P3 primaries, and the efficacies of the deeper red, green and blue emissive units are taken from commercial OLED devices. The chromaticities and efficacies of the lighter red, green and blue emissive units are computed assuming the same external quantum efficiency as for the respective deeper red, green and blue emissive units but transitioning the respective emission spectra to less saturated wavelengths.

The efficacies and chromaticities in Table 2 were used to compute display power consumption for (a) a Uniform Colour Distribution (meaning every colour in the DCI-P3 colour gamut is equally likely on the display) and (b) an Average Colour Distribution (meaning that the likelihood of any particular colour is taken from average observed image statistics for a display, which more heavily weights less saturated colours). Power consumption was computed for the herein disclosed display architecture with independently addressable deeper and lighter red, green and blue emissive units, as well as for a reference display comprising only equivalent deeper red, green and blue emissive units. The results are disclosed in Table 3.

TABLE 3

Relative power consumption (arbitrary units) for different image distributions for different display architectures.

| Display Architecture | Power Consumption | |
|---|---|---|
| | Uniform Colour Distribution | Average Colour Distribution |
| Deeper Emissive Units | 7.18 | 7.23 |
| Deeper and Lighter Emissive Units | 5.76 | 5.47 |
| Power Reduction | 19.8% | 24.3% |

An additive colour model was assumed, which is typical for contemporary OLED displays. It was assumed that the chromaticity of each emissive unit is independent of luminance and that the light emission from each emissive unit is independent of the light emission from the other emissive units in the display.

For a uniform colour distribution, the herein disclosed display architecture is computed to save 19.8% of the display power compared to a reference OLED display comprising only deeper red, green and blue emissive units, having the same colour gamut. For an average colour distribution, the herein disclosed display architecture is computed to save 24.3% of the display power. For other distributions of colour, the results are expected to vary slightly, but are expected to remain in this range. The computed power savings are substantial. The herein disclosed display architecture, which may be referred to as the TurboLED™ display architecture, therefore has the potential to substantially reduce the power consumption of displays to the benefit of the environment, without compromising colour gamut. For mobile devices such as smartphones, tablet, laptops and smartwatches, the herein disclosed architecture also has the potential to extend the battery life of the device because of the lower power consumption of the display.

In one embodiment, the herein disclosed display architecture may also be used to extend the colour gamut of a display without increasing power consumption beyond that of the reference OLED display. In one embodiment, the deeper red, green and blue emissive units may emit light that is deeper in colour than the DCI-P3 colour gamut. In one embodiment, the deeper red, green and blue emissive units may emit light that enables the display to render the Rec. 2020 colour gamut. Although these deeper red, green and blue emissive units may be less efficient and consume more power than the emissive units of the reference OLED display, the power savings from the use of the more efficient lighter red, green and blue emissive units may offset this and enable the display a broader colour gamut, such as the Rec. 2020 colour gamut, without increasing the power consumption of the display beyond that of the reference OLED display. Alternatively, the brightness of the display may be increased without increasing the power consumption of the display beyond that of the reference OLED display. In one embodiment, any or all of these benefits may be achieved in the same device, and the power consumption of the display may be reduced, the brightness increases and the colour gamut of the display extended.

In one embodiment, the display is part of a consumer product.

In one embodiment, the stacked light emitting device may be included in a light panel. Optionally, the light panel may be included in a wide range of consumer products. Optionally the light panel may be used for interior or exterior illumination and/or signaling, in smart packaging or in billboards.

A person skilled in the art will understand that only a few examples of use are described, but that they are in no way limiting.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Any numerals included within parentheses in the accompanying claims are intended to assist understanding of the claims and should not be construed in any way to limit subject matter claimed by these claims.

Certain embodiments of the invention are as follows:

1. A device comprising:
    a first stacked light emitting device comprising:
    a first electrode;
    a second electrode;
    a first emissive unit comprising a first emissive layer;
    a second emissive unit comprising a second emissive layer; and
    a first charge generation layer; wherein
    the first emissive unit, the second emissive unit and the first charge generation layer are all disposed between the first electrode and the second electrode;
    the first emissive unit is disposed over the first electrode;
    the first charge generation layer is disposed over the first emissive unit;
    the second emissive unit is disposed over the first charge generation layer;
    the second electrode is disposed over the second emissive unit;
    the first emissive unit and the second emissive unit are independently addressable and may emit light independently of each other;
    the first emissive unit emits light having a first hue classified as red, green or blue and a first chromaticity having first CIE 1931 $(x, y)$ colour space chromaticity coordinates of $(x1, y1)$;
    the second emissive unit emits light having a second hue classified as red, green or blue and a second chromaticity having second CIE 1931 $(x, y)$ colour space chromaticity coordinates of $(x2, y2)$;
    the second hue is the same as the first hue;
    the second chromaticity is substantially different to the first chromaticity; and
    the first emissive layer and the second emissive layer comprise organic light emitting material, quantum dot light emitting material and/or perovskite light emitting material.

2. The device of embodiment 1, wherein
    the second chromaticity coordinates $(x2, y2)$ are not contained within a one-step MacAdam ellipse that is centralized on the first chromaticity coordinates $(x1, y1)$.

3. The device of embodiment 1, wherein
    the second chromaticity coordinates $(x2, y2)$ are not contained within a three-step MacAdam ellipse that is centralized on the first chromaticity coordinates $(x1, y1)$.

4. The device of any one of embodiments 1 to 3, wherein
    the first emissive unit emits light having a peak wavelength in the visible spectrum that is defined as the first peak wavelength;
    the second emissive unit emits light having a peak wavelength in the visible spectrum that is defined as the second peak wavelength; wherein
    the second peak wavelength is at least 4 nm greater than or at least 4 nm less than the first peak wavelength.

5. The device of any one of embodiments 1 to 3, wherein
    the first CIE 1931 $(x, y)$ colour space chromaticity coordinates $(x1, y1)$ may be converted to first CIE 1976 $(u', v')$ colour space chromaticity coordinates $(u1, v1)$; and the second CIE 1931 $(x, y)$ colour space chromaticity coordinates $(x2, y2)$ may be converted to second CIE 1976 $(u', v')$ colour space chromaticity coordinates $(u2, v2)$; wherein
    the first chromaticity coordinates $(u1, v1)$ and the second chromaticity coordinates $(u2, v2)$ are sufficiently different such that the difference in chromaticity as defined by $\Delta uv$ is 0.010 or more.

6. The device of any one of embodiments 1 to 5, wherein the first emissive unit and the second emissive unit both emit red light with peak wavelength in the visible spectrum in the range of 580 nm to 780 nm.

7. The device of embodiment 6, wherein the first emissive unit emits red light with a peak wavelength in the visible spectrum in the range of 610 nm to 780 nm; and
    the second emissive unit emits red light with a peak wavelength in the visible spectrum in the range of 580 nm to 610 nm.

8. The device of embodiment 6, wherein the first emissive unit emits red light with a peak wavelength in the visible spectrum in the range of 580 nm to 610 nm; and
    the second emissive unit emits red light with a peak wavelength in the visible spectrum in the range of 610 nm to 780 nm.

9. The device of embodiment 6, wherein the first emissive unit emits red light with a CIE 1931 x coordinate of 0.660 or more; and the second emissive unit emits red light with a CIE 1931 x coordinate of less than 0.660.

10. The device of embodiment 6, wherein the first emissive unit emits red light with a CIE 1931 x coordinate of less than 0.660; and the second emissive unit emits red light with a CIE 1931 x coordinate of 0.660 or more.

11. The device of any one of embodiments 1 to 5, wherein the first emissive unit and the second emissive unit both emit green light with peak wavelength in the visible spectrum in the range of 500 nm to 580 nm.

12. The device of embodiment 11, wherein the first emissive unit emits green light with a peak wavelength in the visible spectrum in the range of 500 nm to 535 nm; and the second emissive unit emits green light with a peak wavelength in the visible spectrum in the range of 535 nm to 580 nm.

13. The device of embodiment 11, wherein the first emissive unit emits green light with a peak wavelength in the visible spectrum in the range of 535 nm to 580 nm; and the second emissive unit emits green light with a peak wavelength in the visible spectrum in the range of 500 nm to 535 nm.

14. The device of embodiment 11, wherein the first emissive unit emits green light with a CIE 1931 y coordinate of 0.670 or more; and the second emissive unit emits green light with a CIE 1931 y coordinate of less than 0.670.

15. The device of embodiment 11, wherein the first emissive unit emits green light with a CIE 1931 y coordinate of less than 0.670; and the second emissive unit emits green light with a CIE 1931 y coordinate of 0.670 or more.

16. The device of any one of embodiments 1 to 5, wherein the first emissive unit and the second emissive unit both emit blue light with peak wavelength in the visible spectrum in the range of 380 nm to 500 nm.

17. The device of embodiment 16, wherein the first emissive unit emits blue light with a peak wavelength in the visible spectrum in the range of 380 nm to 465 nm; and the second emissive unit emits blue light with a peak wavelength in the visible spectrum in the range of 465 nm to 500 nm.

18. The device of embodiment 16, wherein the first emissive unit emits blue light with a peak wavelength in the visible spectrum in the range of 465 nm to 500 nm; and the second emissive unit emits blue light with a peak wavelength in the visible spectrum in the range of 380 nm to 465 nm.

19. The device of embodiment 16, wherein the first emissive unit emits blue light with a CIE 1931 y coordinate of 0.080 or less; and the second emissive unit emits blue light with a CIE 1931 y coordinate of more than 0.080.

20. The device of embodiment 16, wherein the first emissive unit emits blue light with a CIE 1931 y coordinate of more than 0.080; and the second emissive unit emits blue light with a CIE 1931 y coordinate of 0.080 or less.

21. The device of any one of embodiments 1 to 20, wherein the first emissive layer and the second emissive layer comprise organic light emitting material.

22. The device of any one of embodiments 1 to 20, wherein the first emissive layer and the second emissive layer comprise quantum dot light emitting material.

23. The device of any one of embodiments 1 to 20, wherein the first emissive layer and the second emissive layer comprise perovskite light emitting material.

24. The device of any one of embodiments 1 to 20, wherein the first emissive layer comprises a first class of light emitting material that is either organic light emitting material, quantum dot light emitting material or perovskite light emitting material;

the second emissive layer comprises a second class of light emitting material that is either organic light emitting material, quantum dot light emitting material or perovskite light emitting material; and the second class of light emitting material is not the same as the first class of light emitting material.

25. The device of any one of embodiments 1 to 24, wherein the device is part of a light panel.

26. The device of any one of embodiments 1 to 24, wherein the device is part of a display.

27. A display is provided, wherein the display comprises:

a first sub-pixel configured to emit red light having a peak wavelength in the visible spectrum in the range of 580 nm to 780 nm;

a second sub-pixel configured to emit green light having a peak wavelength in the visible spectrum in the range of 500 nm to 580 nm; and a third sub-pixel configured to emit blue light having a peak wavelength in the visible spectrum in the range of 380 nm to 500 nm; wherein at least one of the first sub-pixel, the second sub-pixel and the third sub-pixel comprises the device of embodiment 1.

28. The display of embodiment 27, wherein for the at least one of the first sub-pixel, the second sub-pixel and the third sub-pixel, the second chromaticity coordinates (x2, y2) are not contained within a one-step MacAdam ellipse that is centralized on the first chromaticity coordinates (x1, y1).

29. The display of embodiment 27, wherein for the at least one of the first sub-pixel, the second sub-pixel and the third sub-pixel, the second chromaticity coordinates (x2, y2) are not contained within a three-step MacAdam ellipse that is centralized on the first chromaticity coordinates (x1, y1).

30. The display of any one of embodiments 27 to 29, wherein for the at least one of the first sub-pixel, the second sub-pixel and the third sub-pixel:

the first emissive unit emits light having a peak wavelength in the visible spectrum that is defined as the first peak wavelength;

the second emissive unit emits light having a peak wavelength in the visible spectrum that is defined as the second peak wavelength; wherein the second peak wavelength is at least 4 nm greater than or at least 4 nm less than the first peak wavelength.

31. The display of any one of embodiments 27 to 29, wherein for the at least one of the first sub-pixel, the second sub-pixel and the third sub-pixel:

the first CIE 1931 (x, y) colour space chromaticity coordinates (x1, y1) may be converted to first CIE 1976 (u', v') colour space chromaticity coordinates (u1, v1); and the second CIE 1931 (x, y) colour space chromaticity coordinates (x2, y2) may be converted to second CIE 1976 (u', v') colour space chromaticity coordinates (u2, v2); wherein the first chromaticity coordinates (u1, v1) and the second chromaticity coordinates (u2, v2) are sufficiently different such that the difference in chromaticity as defined by Δuv is 0.010 or more.

32. A display is provided, wherein the display comprises:

a first sub-pixel configured to emit red light having a peak wavelength in the visible spectrum in the range of 580 nm to 780 nm;

a second sub-pixel configured to emit green light having a peak wavelength in the visible spectrum in the range of 500 nm to 580 nm; and a third sub-pixel configured to emit blue light having a peak wavelength in the visible spectrum in the range of 380 nm to 500 nm; wherein all of the first sub-pixel, the second sub-pixel and the third sub-pixel comprise the device of embodiment 1.

33. The display of embodiment 32, wherein for all of the first sub-pixel, the second sub-pixel and the third sub-pixel, the second chromaticity coordinates (x2, y2) are not contained within a one-step MacAdam ellipse that is centralized on the first chromaticity coordinates (x1, y1).

34. The display of embodiment 32, wherein for all of the first sub-pixel, the second sub-pixel and the third sub-pixel, the second chromaticity coordinates (x2, y2) are not contained within a three-step MacAdam ellipse that is centralized on the first chromaticity coordinates (x1, y1).

35. The display of any one of embodiments 32 to 34, wherein for all of the first sub-pixel, the second sub-pixel and the third sub-pixel:

the first emissive unit emits light having a peak wavelength in the visible spectrum that is defined as the first peak wavelength;

the second emissive unit emits light having a peak wavelength in the visible spectrum that is defined as the second peak wavelength; wherein the second peak wavelength is at least 4 nm greater than or at least 4 nm less than the first peak wavelength.

36. The display of any one of embodiments 32 to 34, wherein for all of the first sub-pixel, the second sub-pixel and the third sub-pixel:

the first CIE 1931 (x, y) colour space chromaticity coordinates (x1, y1) may be converted to first CIE 1976 (u', v') colour space chromaticity coordinates (u1, v1); and the second CIE 1931 (x, y) colour space chromaticity coordinates (x2, y2) may be converted to second CIE 1976 (u', v') colour space chromaticity coordinates (u2, v2); wherein the first chromaticity coordinates (u1, v1) and the second chromaticity coordinates (u2, v2) are sufficiently different such that the difference in chromaticity as defined by $\Delta uv$ is 0.010 or more.

37. The display of any one of embodiments 32 to 36, wherein the first sub-pixel comprises the device of embodiment 7 or embodiment 8;

the second sub-pixel comprises the device of embodiment 12 or embodiment 13; and the third sub-pixel comprises the device of embodiment 17 or embodiment 18.

38. The display of any one of embodiments 32 to 36, wherein the first sub-pixel comprises the device of embodiment 9 or embodiment 10;

the second sub-pixel comprises the device of embodiment 14 or embodiment 15; and the third sub-pixel comprises the device of embodiment 19 or embodiment 20.

39. The display of any one of embodiments 27 to 38, wherein the display is part of a consumer product.

PATENT REFERENCES

EP 0423283 B1, Friend et al., Electroluminescent Devices

U.S. Pat. No. 5,707,745 B1, Forrest et al., Multicolor Organic Light Emitting Devices U.S. Pat. No. 6,303,238 B1, Thompson et al., OLEDs Doped with Phosphorescent Compounds U.S. Pat. No. 7,279,704 B2, Walters et al., Complexes with Tridentate Ligands U.S. Pat. No. 9,559,151 B2, Hack et al., OLED Display Architecture

WO 2019/224546 A1

US 2019/0043407 A1

WO 2020/030042 A1

US 2014/0084269 A1

US 2015/0155519 A1

EP 3188273 A1

EP 3188272 A1

OTHER REFERENCES

S. Adjokatse et al., Broadly tunable metal halide perovskites for solid-state light-emission applications, Materials Today, Vol. 20, Issue 8, Pages 413-424 (2017).

Forrest et al., The stacked OLED (SOLED): a new type of organic device for achieving high-resolution full-color displays, Synthetic Metals, Vol. 91, Issues 1-3, Pages 9-13 (1997).

Fröbel et al., Three-terminal RGB full-colour OLED pixels for ultrahigh density displays, Nature Scientific Reports, Vol. 8, Article 9684 (2018).

Fukagawa et al., High-efficiency ultrapure green organic light-emitting diodes, Materials Chemistry Frontiers, Vol. 2, Pages 704-709 (2018).

Hirose et al., High-efficiency Perovskite QLED Achieving BT.2020 Green Chromaticity, SID Symposium Digest of Technical Papers 2017, Vol. 48, Pages 284-287 (2017).

Hosoumi et al., Ultra-wide Color Gamut OLED Display using a Deep-Green Phosphorescent Device with High Efficiency, Long Life, Thermal Stability, and Absolute BT.2020 Green Chromaticity, SID Symposium Digest of Technical Papers 2017, Vol. 48, Pages 13-16 (2017).

Jang et al., High Efficiency Green Phosphorescent Organic Light Emitting Diodes with Emission Structure of $(TCTA/TCTA_{0.5}TPBi_{0.5}/TPBi):(pq)_2Ir(acac)$, Molecular Crystals and Liquid Crystals, Vol. 513, Pages 268-276 (2019).

Jung et al., 3 Stacked Top Emitting White OLED for High Resolution OLED TV, SID Symposium Digest of Technical Papers 2016, Vol. 47, Pages 707-710 (2016).

Kathirgamanathan et al. (1), Electroluminescent Organic and Quantum Dot LEDs: The State of the Art, Journal of Display Technology, Vol. 11, Number 5, Pages 480-493 (2015).

Kathirgamanathan et al. (2), Quantum Dot Electroluminescence: Towards Achieving the REC 2020 Colour Co-ordinates, SID Symposium Digest of Technical Papers 2015, Vol. 47, Pages 652-656 (2016).

Kumar et al., Efficient Blue Electroluminescence Using Quantum-Confined Two-Dimensional Perovskites, ACS Nano, Vol. 10, Pages 9720-9729 (2016).

Soneira et al., iPhone X OLED Display Technology Shoot-Out, DisplayMate Technologies Corporation Steckel et al., Color-Saturated Green-Emitting QD-LEDs, Angewandte Chemie, Vol. 45, Pages 5796-5799 (2006).

Takita et al., Highly efficient deep-blue fluorescent dopant for achieving low-power OLED display satisfying BT.2020 chromaticity, Journal of the SID 2018 (2018).

Tong et al., High efficiency green OLEDs based on homoleptic iridium complexes with steric phenylpyridazine ligands, Dalton Transactions, Vol. 47, Pages 12243-12252 (2018).

Uoyama et al., Highly efficient organic light-emitting diodes from delayed fluorescence, Nature, Vol. 492, Pages 234-238 (2012).

Wang et al., Perovskite light-emitting diodes based on solution-processed, self-organised multiple quantum wells, Nature Photonics, Vol. 10, Pages 699-704 (2016).

Wang et al. (2), Blue Quantum Dot Light-Emitting Diodes with High Electroluminescent Efficiency, ACS Applied Materials & Interfaces, Vol. 9, Pages 38755-38760 (2017).

Zanoni et al., Sky-blue OLED through $PVK:[Ir(Fppy)_2(Mepic)]$ active layer, Synthetic Metals, Vol. 222, Part B, Pages 393-396 (2016)

The invention claimed is:

1. A display comprising:

a first sub-pixel configured to emit red light having a peak wavelength in the visible spectrum in the range of 580 nm to 780 nm;

a second sub-pixel configured to emit green light having a peak wavelength in the visible spectrum in the range of 500 nm to 580 nm; and a third sub-pixel configured to emit blue light having a peak wavelength in the visible spectrum in the range of 380 nm to 500 nm; wherein all of the first sub-pixel, the second sub-pixel and the third sub-pixel comprise a stacked light emitting device comprising:

a first electrode;

a second electrode;

a first emissive unit comprising a first emissive layer;

a second emissive unit comprising a second emissive layer; and a first charge generation layer; wherein the first emissive unit, the second emissive unit and the first charge generation layer are all disposed between the first electrode and the second electrode;

the first emissive unit is disposed over the first electrode;

the first charge generation layer is disposed over the first emissive unit;

the second emissive unit is disposed over the first charge generation layer;

the second electrode is disposed over the second emissive unit;

the first emissive unit and the second emissive unit are independently addressed and may emit light independently of each other;

the first emissive unit emits light having a first hue classified as red, green or blue and a first chromaticity having first CIE 1931 (x, y) colour space chromaticity coordinates of (x1, y1);

the second emissive unit emits light having a second hue classified as red, green or blue and a second chromaticity having second CIE 1931 (x, y) colour space chromaticity coordinates of (x2, y2);

the second hue is the same as the first hue;

the second chromaticity is substantially different to the first chromaticity; and the first emissive layer and the second emissive layer comprise organic light emitting material, quantum dot light emitting material and/or perovskite light emitting material.

2. The display of claim 1, wherein for all of the first sub-pixel, the second sub-pixel and the third sub-pixel, the second chromaticity coordinates (x2, y2) are not contained within a one-step MacAdam ellipse that is centralized on the first chromaticity coordinates (x1, y1).

3. The display of claim 1, wherein for all of the first sub-pixel, the second sub-pixel and the third sub-pixel, the second chromaticity coordinates (x2, y2) are not contained within a three-step MacAdam ellipse that is centralized on the first chromaticity coordinates (x1, y1).

4. The display of claim 1, wherein for all of the first sub-pixel, the second sub-pixel and the third sub-pixel:

the first emissive unit emits light having a peak wavelength in the visible spectrum that is defined as the first peak wavelength;

the second emissive unit emits light having a peak wavelength in the visible spectrum that is defined as the second peak wavelength; wherein the second peak wavelength is at least 4 nm greater than or at least 4 nm less than the first peak wavelength.

5. The display of claim 1, wherein for all of the first sub-pixel, the second sub-pixel and the third sub-pixel:

the first CIE 1931 (x, y) colour space chromaticity coordinates (x1, y1) may be converted to first CIE 1976 (u', v') colour space chromaticity coordinates (u1, v1); and the second CIE 1931 (x, y) colour space chromaticity coordinates (x2, y2) may be converted to second CIE 1976 (u', v') colour space chromaticity coordinates (u2, v2); wherein the first chromaticity coordinates (u1, v1) and the second chromaticity coordinates (u2, v2) are sufficiently different such that the difference in chromaticity as defined by $\Delta$uv is 0.010 or more.

6. The display of claim 1, wherein the first emissive unit and the second emissive unit of the first sub-pixel both emit red light with peak wavelength in the visible spectrum in the range of 580 nm to 780 nm;

the first emissive unit and the second emissive unit of the second sub-pixel both emit green light with peak wavelength in the visible spectrum in the range of 500 nm to 580 nm; and the first emissive unit and the second emissive unit of the third sub-pixel both emit blue light with peak wavelength in the visible spectrum in the range of 380 nm to 500 nm.

7. The display of claim 1, wherein the first sub-pixel comprises a first stacked light emitting device comprising a first emissive unit and a second emissive unit, wherein the first emissive unit emits red light with a peak wavelength in the visible spectrum in the range of 610 nm to 780 nm; and the second emissive unit emits red light with a peak wavelength in the visible spectrum in the range of 580 nm to 610 nm, or vice-versa;

the second sub-pixel comprises a second stacked light emitting device comprising a first emissive unit and a second emissive unit, wherein the first emissive unit emits green light with a peak wavelength in the visible spectrum in the range of 500 nm to 535 nm; and the second emissive unit emits green light with a peak wavelength in the visible spectrum in the range of 535 nm to 580 nm, or vice-versa; and the third sub-pixel comprises a third stacked light emitting device comprising a first emissive unit and a second emissive unit, wherein the first emissive unit emits blue light with a peak wavelength in the visible spectrum in the range of 380 nm to 465 nm; and the second emissive unit emits blue light with a peak wavelength in the visible spectrum in the range of 465 nm to 500 nm, or vice-versa.

8. The display of claim 1, wherein the first sub-pixel comprises a first stacked light emitting device comprising a first emissive unit and a second emissive unit, wherein the first emissive unit emits red light with a CIE 1931 x coordinate of 0.660 or more; and the second emissive unit emits red light with a CIE 1931 x coordinate of less than 0.660, or vice-versa;

the second sub-pixel comprises a second stacked light emitting device comprising a first emissive unit and a second emissive unit, wherein the first emissive unit emissive unit emits green light with a CIE 1931 y coordinate of 0.670 or more; and the second emissive unit emits green light with a CIE 1931 y coordinate of less than 0.670, or vice-versa; and the third sub-pixel comprises a third stacked light emitting device comprising a first emissive unit and a second emissive unit, wherein the first emissive unit emits blue light with a CIE 1931 y coordinate of 0.080 or less; and the second emissive unit emits blue light with a CIE 1931 y coordinate of more than 0.080, or vice-versa.

9. The display of claim 1, wherein the first sub-pixel comprises a first stacked light emitting device comprising a first emissive unit and a second emissive unit, wherein the first emissive unit emits deeper red light, and the second emissive unit emits lighter red light, or vice-versa;

the second sub-pixel comprises a second stacked light emitting device comprising a first emissive unit and a second emissive unit, wherein the first emissive unit emits deeper green light, and the second emissive unit emits lighter green light, or vice-versa; and the third sub-pixel comprises a third stacked light emitting device comprising a first emissive unit and a second emissive unit, wherein the first emissive unit emits deeper blue light, and the second emissive unit emits lighter blue light, or vice-versa.

10. The display of claim 9, wherein the emissive units that emit deeper red, green and blue light may together render the DCI-P3 colour gamut; and the emissive units that emit lighter red, green and blue light may together only render a colour gamut that is substantially narrower than the DCI-P3 colour gamut.

11. The display of claim 9, wherein the emissive units that emit deeper red, green and blue light may together render the Rec. 2020 colour gamut; and the emissive units that emit lighter red, green and blue light may together only render a colour gamut that is substantially narrower than the Rec. 2020 colour gamut.

12. The display of claim 1, wherein for all of the first sub-pixel, the second sub-pixel and the third sub-pixel, the charge generation layer is addressed by one electrical contact, enabling the first emissive unit and the second emissive unit to be independently addressed.

13. The display of claim 1, wherein for all of the first sub-pixel, the second sub-pixel and the third sub-pixel, the charge generation layer is addressed by two electrical contacts, enabling the first emissive unit and the second emissive unit to be independently addressed.

14. The display of claim 1, wherein the display is part of a consumer product.

\* \* \* \* \*